(12) United States Patent
Tabatabaei

(10) Patent No.: US 8,032,805 B1
(45) Date of Patent: Oct. 4, 2011

(54) INPUT-OUTPUT DEVICE TESTING INCLUDING VOLTAGE TESTS

(75) Inventor: Sassan Tabatabaei, Sunnyvale, CA (US)

(73) Assignee: Synopsys, Inc., Mountain View, CA (US)

(*) Notice: Subject to any disclaimer, the term of this patent is extended or adjusted under 35 U.S.C. 154(b) by 840 days.

(21) Appl. No.: 11/520,276

(22) Filed: Sep. 12, 2006

Related U.S. Application Data

(60) Provisional application No. 60/716,386, filed on Sep. 12, 2005.

(51) Int. Cl.
*G01R 31/28* (2006.01)
(52) U.S. Cl. .................................. 714/724; 714/727
(58) Field of Classification Search .................. 714/726, 714/724, 727
See application file for complete search history.

(56) References Cited

U.S. PATENT DOCUMENTS

| | | | |
|---|---|---|---|
| 4,701,778 A | 10/1987 | Aneha et al. |
| 4,745,084 A | 5/1988 | Rowson et al. |
| 4,851,892 A | 7/1989 | Anderson et al. |
| 5,038,192 A | 8/1991 | Bonneau et al. |
| 5,062,122 A | 10/1991 | Pham et al. |
| 5,079,614 A | 1/1992 | Khatakhotan |
| 5,101,153 A | 3/1992 | Morong, III |
| 5,452,245 A | 9/1995 | Hickman et al. |
| 5,631,478 A | 5/1997 | Okumura |
| 5,635,737 A | 6/1997 | Yin |
| 5,670,890 A | 9/1997 | Colwell et al. |
| 5,723,883 A | 3/1998 | Gheewala |
| 5,727,180 A | 3/1998 | Davis et al. |
| 5,742,099 A | 4/1998 | Debnath et al. |
| 5,861,641 A | 1/1999 | Yoeli et al. |
| 5,915,105 A | 6/1999 | Farmwald et al. |
| 5,917,224 A | 6/1999 | Zangara |
| 5,923,060 A | 7/1999 | Gheewala |
| 5,923,676 A | 7/1999 | Sunter et al. |
| 5,954,804 A | 9/1999 | Farmwald et al. |
| 5,981,987 A | 11/1999 | Brunolli et al. |
| 5,995,443 A | 11/1999 | Farmwald et al. |
| 6,011,732 A | 1/2000 | Harrison et al. |
| 6,026,216 A | 2/2000 | Ohtsuka et al. |
| 6,032,214 A | 2/2000 | Farmwald et al. |
| 6,035,365 A | 3/2000 | Farmwald et al. |
| 6,044,426 A | 3/2000 | Farmwald et al. |
| 6,049,846 A | 4/2000 | Farmwald et al. |
| 6,058,496 A | 5/2000 | Gillis et al. |

(Continued)

OTHER PUBLICATIONS

Non-Final Office Action for U.S. Appl. No. 11/340,147 mailed Sep. 26, 2007, 7 pages.
Adham, Saman, et al., "Preliminary Outline of the IEEE P1500 Scaleable Architecture for Testing Embedded Cores," IEEE P1500 Architecture Task Force, 1999, 6 pages.

(Continued)

*Primary Examiner* — James C Kerveros
(74) *Attorney, Agent, or Firm* — Fenwick & West LLP

(57) ABSTRACT

Integrated circuits may include at least an instruction processor and input-output subsystems. Each input-output subsystem includes a wrapper circuit a wrapper circuit controlled by the instruction processor. The wrapper circuit includes two or more scan registers, where a data value stored in each scan register can be shifted out for analysis. The wrapper circuit also includes two or more update registers to transfer stored data values between itself and an associated scan register. The wrapper circuit also includes a set of combinatorial logic coupled to the scan registers, the update registers and the instruction test processor, wherein at least two I/Os of the plurality of I/Os but less than all of the plurality of I/Os couple to an external tester.

20 Claims, 33 Drawing Sheets

U.S. PATENT DOCUMENTS

| | | | |
|---|---|---|---|
| 6,075,614 | A | 6/2000 | Ohtsuka et al. |
| 6,085,284 | A | 7/2000 | Farmwald et al. |
| 6,091,090 | A | 7/2000 | Gheewala |
| 6,100,735 | A | 8/2000 | Lu |
| 6,101,152 | A | 8/2000 | Farmwald et al. |
| 6,107,826 | A | 8/2000 | Young et al. |
| 6,166,563 | A | 12/2000 | Volk et al. |
| 6,173,432 | B1 | 1/2001 | Harrison |
| 6,177,691 | B1 | 1/2001 | Iranmanesh et al. |
| 6,242,767 | B1 | 6/2001 | How et al. |
| 6,260,163 | B1 | 7/2001 | LaCroix et al. |
| 6,260,263 | B1 | 7/2001 | Haase |
| 6,262,585 | B1 | 7/2001 | Frodsham et al. |
| 6,307,222 | B1 | 10/2001 | Brunolli et al. |
| 6,327,685 | B1 | 12/2001 | Koprowski |
| 6,331,733 | B1 | 12/2001 | Or-Bach et al. |
| 6,348,811 | B1 | 2/2002 | Haycock et al. |
| 6,348,826 | B1 | 2/2002 | Mooney et al. |
| 6,384,781 | B1 | 5/2002 | Kautz et al. |
| 6,397,361 | B1 | 5/2002 | Saitoh |
| 6,405,335 | B1 | 6/2002 | Whetsel |
| 6,421,801 | B1 | 7/2002 | Maddux et al. |
| 6,425,097 | B1 | 7/2002 | Elachkar et al. |
| 6,429,715 | B1 | 8/2002 | Bapat et al. |
| 6,445,049 | B1 | 9/2002 | Iranmanesh |
| 6,445,065 | B1 | 9/2002 | Gheewala et al. |
| 6,445,231 | B1 | 9/2002 | Baker et al. |
| 6,449,738 | B1 | 9/2002 | Hinedi et al. |
| 6,452,432 | B2 | 9/2002 | Kim |
| 6,455,332 | B1 | 9/2002 | Singh et al. |
| 6,476,652 | B1 | 11/2002 | Lee et al. |
| 6,477,674 | B1 | 11/2002 | Bates et al. |
| 6,483,360 | B2 | 11/2002 | Nakamura |
| 6,486,919 | B1 | 11/2002 | Kim |
| 6,492,798 | B2 | 12/2002 | Sunter |
| 6,492,851 | B2 | 12/2002 | Watarai |
| 6,502,050 | B1 | 12/2002 | Chan |
| 6,556,934 | B2 | 4/2003 | Higashide |
| 6,580,304 | B1 | 6/2003 | Rieven |
| 6,586,921 | B1 | 7/2003 | Sunter |
| 6,618,133 | B2 | 9/2003 | Hedges et al. |
| 6,629,274 | B1 | 9/2003 | Tripp et al. |
| 6,639,426 | B2 | 10/2003 | Haycock et al. |
| 6,657,936 | B2 | 12/2003 | Harvey et al. |
| 6,658,613 | B2 * | 12/2003 | Rearick et al. ............. 714/724 |
| 6,671,847 | B1 | 12/2003 | Chao et al. |
| 6,675,364 | B1 | 1/2004 | Basto et al. |
| 6,691,269 | B2 | 2/2004 | Sunter |
| 6,694,441 | B1 | 2/2004 | Sethia |
| 6,694,464 | B1 | 2/2004 | Quayle et al. |
| 6,700,670 | B1 | 3/2004 | Poris |
| 6,711,718 | B2 | 3/2004 | Pfeil et al. |
| 6,721,920 | B2 | 4/2004 | Rearick et al. |
| 6,731,128 | B2 | 5/2004 | Das et al. |
| 6,748,549 | B1 | 6/2004 | Chao et al. |
| 6,750,688 | B2 | 6/2004 | Takai |
| 6,754,613 | B2 | 6/2004 | Tabatabaei et al. |
| 6,760,873 | B1 | 7/2004 | Hao et al. |
| 6,760,899 | B1 | 7/2004 | Young et al. |
| 6,772,620 | B1 | 8/2004 | Poris |
| 6,774,694 | B1 | 8/2004 | Stern et al. |
| 6,777,995 | B1 | 8/2004 | Harrison |
| 6,795,046 | B2 | 9/2004 | Janssen et al. |
| 6,823,500 | B1 | 11/2004 | Ganesh et al. |
| 6,823,502 | B2 | 11/2004 | Wingren et al. |
| 6,832,361 | B2 | 12/2004 | Cohn et al. |
| 6,839,860 | B2 | 1/2005 | Lin |
| 6,850,871 | B1 | 2/2005 | Barford et al. |
| 6,857,080 | B1 | 2/2005 | Liang |
| 6,862,705 | B1 * | 3/2005 | Nesbitt et al. ............. 714/729 |
| 6,865,135 | B2 | 3/2005 | Choi |
| 6,900,679 | B2 | 5/2005 | Watarai |
| 6,914,852 | B2 | 7/2005 | Choi |
| 6,934,215 | B2 | 8/2005 | Chung et al. |
| 6,985,648 | B2 | 1/2006 | Kish, Jr. et al. |
| 6,986,085 | B2 | 1/2006 | Rearick et al. |
| 6,993,318 | B2 | 1/2006 | McNew et al. |
| 6,996,032 | B2 | 2/2006 | Ganry |
| 7,010,074 | B2 | 3/2006 | Nakamura |
| 7,032,145 | B1 | 4/2006 | Burlison |
| 7,043,109 | B2 | 5/2006 | Kish, Jr. et al. |
| 7,053,992 | B2 | 5/2006 | LaBelle et al. |
| 7,062,114 | B2 | 6/2006 | Webjorn et al. |
| 7,129,476 | B2 | 10/2006 | Ishitsu et al. |
| 7,133,793 | B2 | 11/2006 | Ely et al. |
| 7,142,873 | B2 | 11/2006 | McNew et al. |
| 7,148,763 | B2 | 12/2006 | Sutardja |
| 7,159,159 | B2 * | 1/2007 | Sunter ............. 714/724 |
| 7,161,397 | B2 | 1/2007 | Lee et al. |
| 7,162,404 | B2 | 1/2007 | Hunt et al. |
| 7,181,704 | B1 | 2/2007 | Downs et al. |
| 7,199,625 | B1 | 4/2007 | Chung |
| 7,202,719 | B2 | 4/2007 | Gabato et al. |
| 7,206,710 | B2 | 4/2007 | Zhou et al. |
| 7,219,269 | B2 | 5/2007 | Frisch |
| 7,219,282 | B2 * | 5/2007 | Sunter et al. ............. 714/727 |
| 7,254,729 | B2 | 8/2007 | Matsushima et al. |
| 7,256,600 | B2 | 8/2007 | Walker et al. |
| 7,262,623 | B1 | 8/2007 | Mark et al. |
| 7,272,764 | B2 * | 9/2007 | Rich et al. ............. 714/733 |
| 7,283,694 | B2 | 10/2007 | Welch et al. |
| 7,286,644 | B2 | 10/2007 | Andrews |
| 7,312,438 | B2 | 12/2007 | Ishitsu et al. |
| 7,340,122 | B2 | 3/2008 | Welch et al. |
| 7,401,493 | B2 | 7/2008 | Forrest |
| 7,414,707 | B2 | 8/2008 | LaBelle et al. |
| 7,460,742 | B2 | 12/2008 | Joyner |
| 7,640,468 | B2 * | 12/2009 | Linam et al. ............. 714/724 |
| 2001/0024135 | A1 | 9/2001 | Harrison |
| 2001/0026183 | A1 | 10/2001 | Kim |
| 2001/0030553 | A1 | 10/2001 | Aihara |
| 2001/0035784 | A1 | 11/2001 | Watarai |
| 2002/0015460 | A1 | 2/2002 | Bhullar et al. |
| 2002/0027461 | A1 | 3/2002 | Kusunoki |
| 2002/0036526 | A1 | 3/2002 | Nakamura |
| 2002/0041196 | A1 | 4/2002 | Demone et al. |
| 2002/0057624 | A1 | 5/2002 | Manning |
| 2002/0153914 | A1 | 10/2002 | Arabi et al. |
| 2002/0154723 | A1 | 10/2002 | Nakamura |
| 2002/0157031 | A1 | 10/2002 | Lin |
| 2003/0001638 | A1 | 1/2003 | Watarai |
| 2003/0005374 | A1 | 1/2003 | Fought et al. |
| 2003/0030461 | A1 | 2/2003 | Oberle et al. |
| 2003/0067333 | A1 | 4/2003 | Nakamura |
| 2003/0071606 | A1 | 4/2003 | Sunter |
| 2003/0099321 | A1 | 5/2003 | Juan et al. |
| 2003/0151433 | A1 | 8/2003 | Takai |
| 2003/0196153 | A1 | 10/2003 | Evans |
| 2003/0199262 | A1 | 10/2003 | Chung |
| 2003/0208708 | A1 | 11/2003 | Sunter |
| 2004/0027993 | A1 | 2/2004 | Ghiasi et al. |
| 2004/0051551 | A1 | 3/2004 | Sunter |
| 2004/0062121 | A1 | 4/2004 | Chung et al. |
| 2004/0098648 | A1 | 5/2004 | Sunter |
| 2004/0109464 | A1 | 6/2004 | Seo et al. |
| 2004/0119455 | A1 | 6/2004 | Sunter |
| 2004/0123197 | A1 | 6/2004 | Sunter |
| 2004/0153931 | A1 | 8/2004 | Cao et al. |
| 2004/0179640 | A1 | 9/2004 | Jacob et al. |
| 2004/0186675 | A1 | 9/2004 | Larson et al. |
| 2004/0196064 | A1 | 10/2004 | Garlepp et al. |
| 2004/0221197 | A1 | 11/2004 | Goyal et al. |
| 2004/0223571 | A1 | 11/2004 | Donnelly et al. |
| 2004/0246017 | A1 | 12/2004 | Arabi et al. |
| 2005/0007157 | A1 | 1/2005 | Harrison |
| 2005/0025190 | A1 | 2/2005 | Frisch |
| 2006/0132164 | A1 | 6/2006 | Walker et al. |
| 2006/0132165 | A1 | 6/2006 | Walker et al. |
| 2006/0279310 | A1 | 12/2006 | Walker et al. |

OTHER PUBLICATIONS

Arkin, Brian, "Realizing a Production ATE Custom Processor and Timing IC Containing 400 Independent Low-Power and High-Linearity Timing Verniers," IEEE International Solid-State Circuits Conference, Feb. 2004.

Bonnett, David, "IEEE 1149.1 yields new standards," Test & Measurement World, http://www.reed-electronics.com/tmworld/article/CA202501.html, Apr. 2002.

Christiansen, Jorgen, "An Integrated High Resolution CMOS Timing Generator Based on an Array of Delay Locked Loops," IEEE Journal of Solid State Circuits, Jul. 1996, pp. 952-957, 31:7.

Gillis, Pamela, et al, "Delay Test of Chip I/Os Using LSSD Boundary Scan," IEEE International Test Conference, Aug. 1998, pp. 83-90, Paper 4.1.

Hwang, Chorng-Sii, et al, "A High-Precision Time-to-Digital Converter Using a Two-Level Conversion Scheme," IEEE Transactions on Nuclear Science, Aug. 2004, pp. 1349-1352, 51:4.

Kuo, Andy, et al, "Jitter Models and Measurement Methods for High-Speed Serial Interconnects," ITC International Test Conference, Feb. 2004, pp. 1295-1302, Paper 46.1.

Kuo, Andy, et al, "Crosstalk Bounded Uncorrelated Jitter (BUJ) for High-Speed Interconnects," IEEE Transactions on Instrumentation and Measurement, Oct. 2005, pp. 1800-1810, 54:5.

Mantyniemi, Antti, et al, "A High Resolution Digital CMOS Time-to-Digital Converter Based on Nested Delay Locked Loops," IEEE, 1999, pp. 537-540.

Nelson, Rick, "PCB test: nails or TAP?" http://www.reed-electronics.com/tmworld/article/CA239852.html, Sep. 2002.

Ou, Nelson, et al, "Jitter Models for Design and Test of Gbps-Speed Serial Interconnects," IEEE Design & Test of Computers, IEEE Design & Test of Computers, Jul.-Aug. 2004, pp. 302-313.

Santos, Dinis M, et al, "A CMOS Delay Locked Loop and Sub-Nanosecond Time-to-Digital Converter Chip," 1996, pp. 289-291.

Sunter, Stephen K, et al, "Complete, Contactless I/O Testing—Reaching the Boundary in Minimizing Digital IC Testing Cost," ITC International Test Conference, Apr. 2002, pp. 446-455, Paper 16.2.

Tabatabaei, Sassan, et al, "Embedded Timing Analysis: A SoC Infrastructure," IEEE Design & Test of Computers, May-Jun. 2002, pp. 24-36.

Tabatabaei, Sassan, et al, "An Embedded Core for Sub-Picosecond Timing Measurements," ITC International Test Conference, Apr. 2002, pp. 129-137, Paper 5.3.

Tabatabaei, Sassan, et al, "Jitter Generation and Measurement for Test of Multi-Gbps Serial IO," ITC International Test Conference, Feb. 2004, pp. 1313-1321, Paper 46.3.

"Boundary-Scan Tutorial," Corelis, http://www.corelis.com/products/Boundary-Scan_Tutorial.htm.

"IEEE Standard Test Access Port and Boundary-Scan Architecture," The Institute of Electrical and Electronics Engineering, Inc., 2001, pp. i-iv and 1-200.

"IEEE Standard for a Mixed-Signal Test Bus," Test Technology Technical Committee of IEEE Computer Society, IEEE std 1149.4, pp. i-vi and 1-78, Approved Jun. 26, 1999.

"Standard Testability Method for Embedded Core-Based Integrated Circuits," (Draft), Test Technology Technical Committee of IEEE Computer Society, Standard IEEE 1500/D11, pp. i-vii and 1-131, Jan. 2005.

Wikipedia, the free encyclopedia, "Electronic design automation", Internet article, http://en.wikipedia.org/wiki/Electronic_design_automation, May 21, 2009, 11 pages.

"PDS/PIO: Lightweight Libraries for Collective Parallel I/O" by Sturtevant et al. This paper appears in: Supercomputing, 1998. SC98. IEEE/ACM Conference on Publication Date: Nov. 7-13, 1998 on pp. 3-3 ISBN: 0-8186-8707-X.

"Test planning for modular testing of hierarchical SOCs" by Chakrabarty et al. This paper appears in: Computer-Aided Design of Integrated Circuits and Systems, IEEE Transactions on Publication Date: Mar. 2005 Vol. 24, Issue: On pp. 435-448 ISSN: 0278-0070 INSPEC Accession No. 8325271.

Peng, Tina, "Fed Circ. Sets Product-By-Process Patent Restrictions", www.Law360.com, published by Portfolio Media Inc. May 19, 2009, 3 pages.

Non-Final Office Action for U.S. Appl. No. 11/340,147 mailed Apr. 30, 2008, 4 pages.

Final Office Action for U.S. Appl. No. 11/340,147 mailed Jan. 23, 2009, 6 pages.

Non-Final Office Action for U.S. Appl. No. 11/520,200 mailed Apr. 2, 2009, 7 pages.

Non-Final Office Action for U.S. Appl. No. 11/520,344 mailed Nov. 20, 2008, 9 pages.

Non-Final Office Action for U.S. Appl. No. 11/520,344 mailed May 15, 2009, 11 pages.

Non-Final Office Action for U.S. Appl. No. 11/520,344 mailed Dec. 17, 2009, 7 pages.

Non-Final Office Action for U.S. Appl. No. 11/520,480 mailed Oct. 31, 2008, 8 pages.

Non-Final Office Action for U.S. Appl. No. 11/520,480 mailed Jun. 1, 2009, 11 pages.).

Non-Final Office Action for U.S. Appl. No. 11/520,480 mailed Nov. 2, 2009, 6 pages.

Non-Final Office Action for U.S. Appl. No. 11/520,282 mailed Oct. 30, 2008, 8 pages.

Final Office Action for U.S. Appl. No. 11/520,282 mailed Apr. 16, 2009, 9 pages.

Non-Final Office Action for U.S. Appl. No. 11/520,530 mailed Nov. 24, 2008, 10 pages.

Non-Final Office Action for U.S. Appl. No. 11/520,530 mailed Apr. 30, 2009, 9 pages.

Non-Final Office Action for U.S. Appl. No. 11/520,530 mailed Oct. 30, 2009, 7 pages.

Non-Final Office Action for U.S. Appl. No. 11/520,423 mailed May 1, 2008, 10 pages.

Non-Final Office Action for U.S. Appl. No. 11/510,035 mailed Nov. 14, 2007, 22 pages.

Non-Final Office Action for U.S. Appl. No. 11/510,035 mailed Jul. 2, 2008, 26 pages.

Non-Final Office Action for U.S. Appl. No. 11/510,035 mailed Oct. 24, 2008, 17 pages.

Bilodeau, T.M., "Theoretical and Empirical Error Analysis for the Direct Calibration of Resonant Partial Discharge Detection Circuitry," Electrical Insulation and Dielectric Phenomena, 1990. Annual Report, Conference on Oct. 28-31, 1990 pp. 361-366 Digital Object Identifier 10.1109/CEIDP.1990.201368.

De Vito, L. et al., "Bayesian Calibration of a Lookup Table for ADC Error Correction," Instrumentation and Measurement, IEEE Transactions on vol. 56, Issue 3, Jun. 2007 pp. 873-878 Digital Object Identifier 10.1109/TIM.2007.894171.

El Gamal, A. et al., "BINMOS: A Basic Cell for BiCMOS Sea-of-Gates," IEEE 1989 Custom Integrated Circuits Conference, 1989, pp. 8.3.1-8.3.4.

Gage, R. et al., "The CAT-exact Data Transfer to DDS-Generated Clock Domains in a Single-Chip Modulator Solution," Test Conference, 1998. Proceedings, International Oct. 18-23, 1998 pp. 507-513 Digital Object Identifier 10.1109/Test.1998.743193.

Haiying, J. et al., "Calibration Algorithm of Granularity Distribution Measurement," Electronic Measurement and Instruments, 2007. ICEMI '07. 8th International Conference on Aug. 16-Jul. 18, 2007 pp. 3-853-3-857 Digital Object Identifier 10.1109/ICEMI.2007.4351051.

"IEEE Standard for a Mixed Signal Bus," IEEE-SA Standards Board, 2000, The Institute of Electrical and Electronics Engineers, Inc., 84 pages.

Kouider, M. et al., "Hardware and Software Implementation for an Auto-Calibrated Measurement System," Sensors, 2003. Proceedings of IEEE vol. 1, Oct. 22-24, 2003 pp. 611-616 vol. 1 Digital Object Identifier 10.1009/ICSENS.2003.1279010.

Malinoski, M., "A Test Site Thermal Control System for At-Speed Manufacturing Testing," Test Conference, 1998. Proceedings, International Oct. 18-23, 1998 pp. 119-128 Digital Object Identifier 10.1109/Test.1998.743145.

Mulligan, J., "Fast Calibrated Stereo Vision for Manipulation," Robotics and Automation, 1996. Proceedings, 1996 IEEE International Conference on vol. 3, Apr. 22-28, 1996 pp. 2326-2331 vol. 3 Digital Object Identifier 10.1109/ROBOT.1996.506511.

Non-Final Office Action for U.S. Appl. No. 11/520,282 mailed Jan. 8, 2010, 8 pages.

Non-Final Office Action for U.S. Appl. No. 11/520,282 mailed Apr. 8, 2010, 7 pages.

Final Office Action for U.S. Appl. No. 11/520,530 mailed Mar. 10, 2010, 8 pages.

Non-Final Office Action for U.S. Appl. No. 09/351,767, Feb. 17, 2004, 5 pages.

Non-Final Office Action for U.S. Appl. No. 11/520,344, Sep. 8, 2010, 7 pages.

Final Office Action for U.S. Appl. No. 11/520,344, May 4, 2010, 8 pages.

Okuno, Y. et al., "0.8um 1.4MTr. CMOS SOG Based on Column Macro-Cell," IEEE 1989 Custom Integrated Circuits Conference, 1989, pp. 8.2.1-8.2.4.

Yao, C. et al., "An Efficient Power Routing Technique to Resolve the Current Crowding Effect in the Power Grid Structure of Gate Arrays," Seventh Annual IEEE International ASIC Conference and Exhibit, 1994, pp. 134-137.

Zhang, F. et al., "Improved Resolution for 3D Position Sensitive CdZnTe Spectrometers," Nuclear Science Symposium Conference Record, 2003 IEEE vol. 5, Oct. 19-25, 2003 pp. 3356-3360 vol. 5.

* cited by examiner

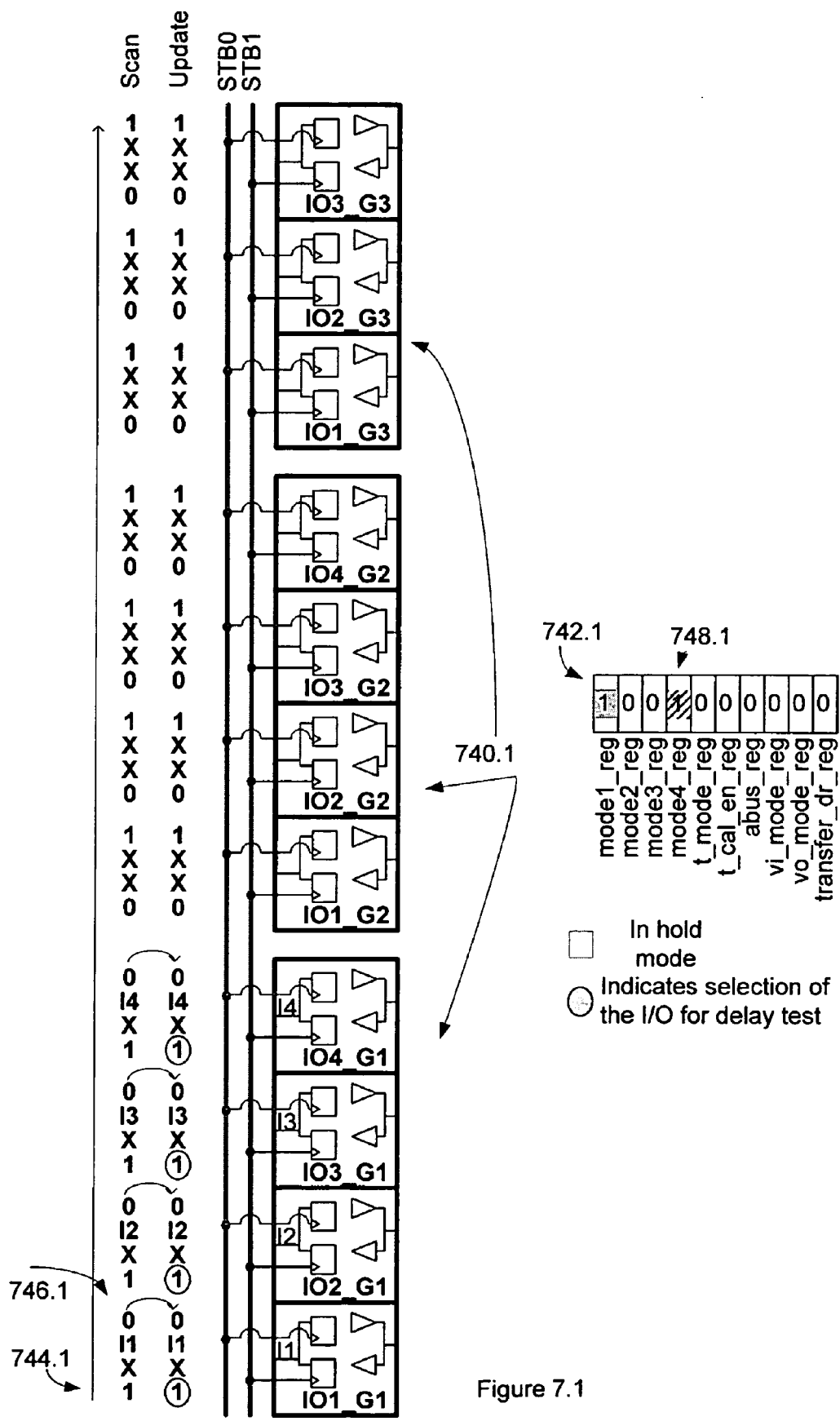
Figure 7.1

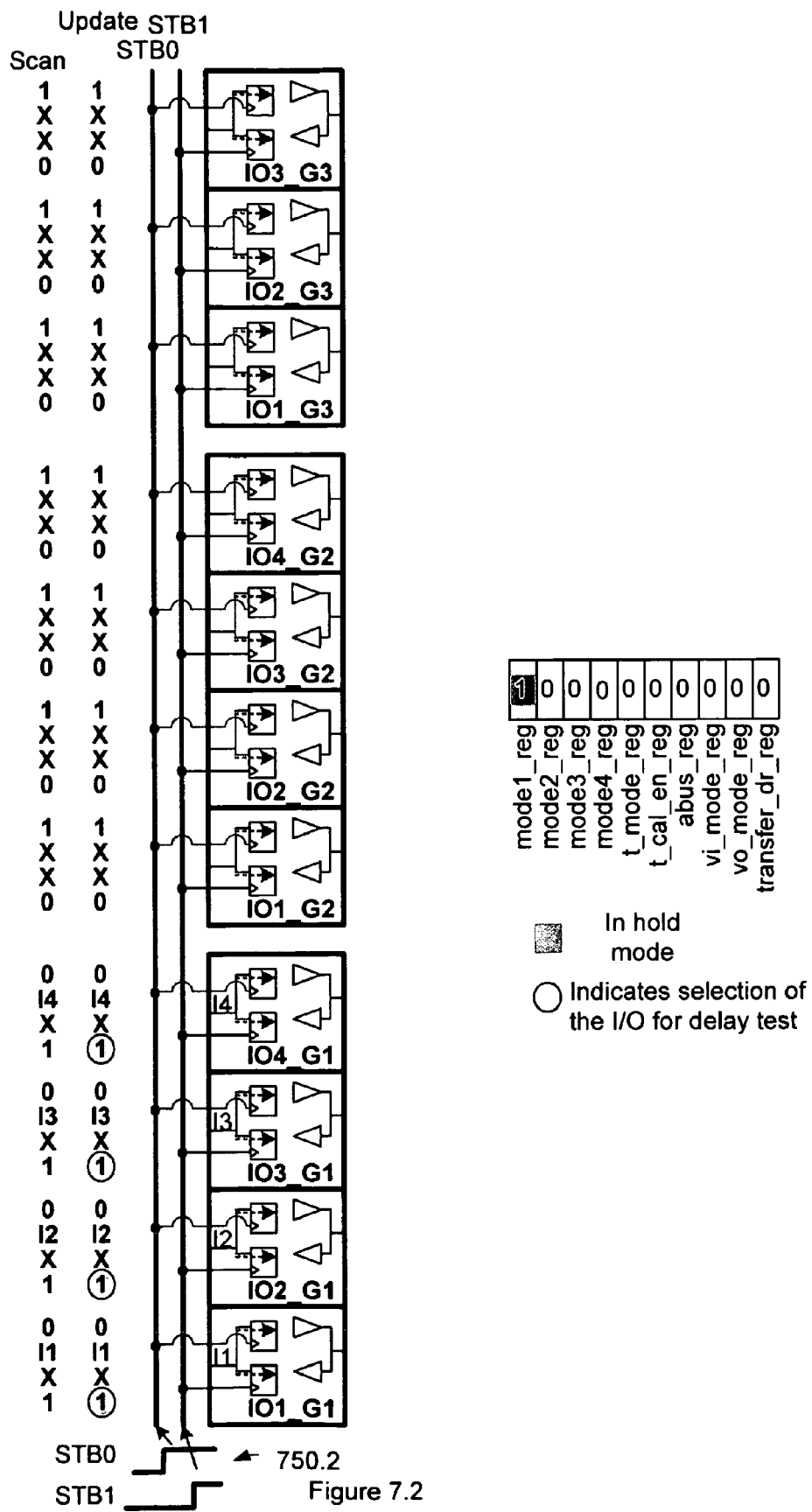
Figure 7.2

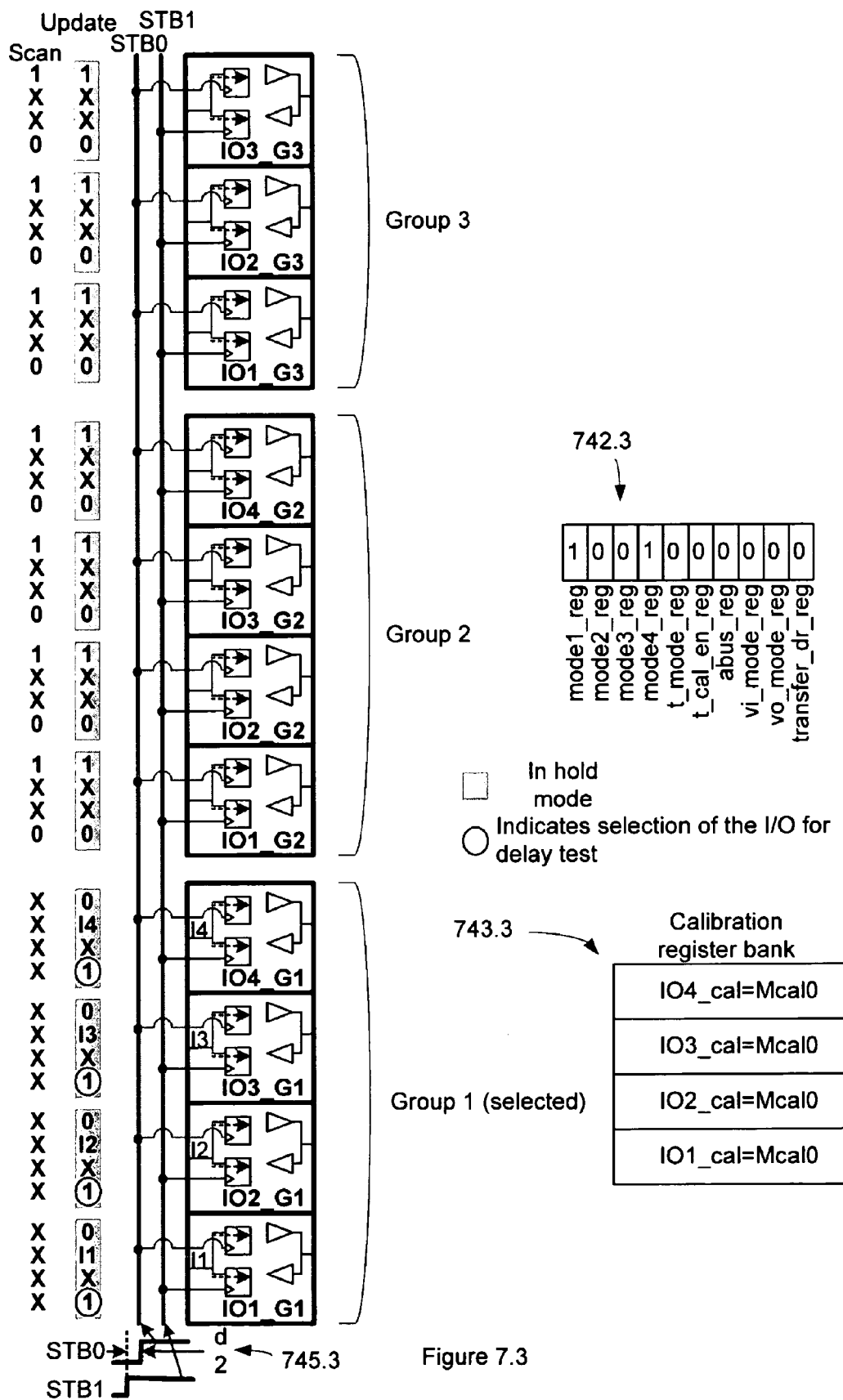
Figure 7.3

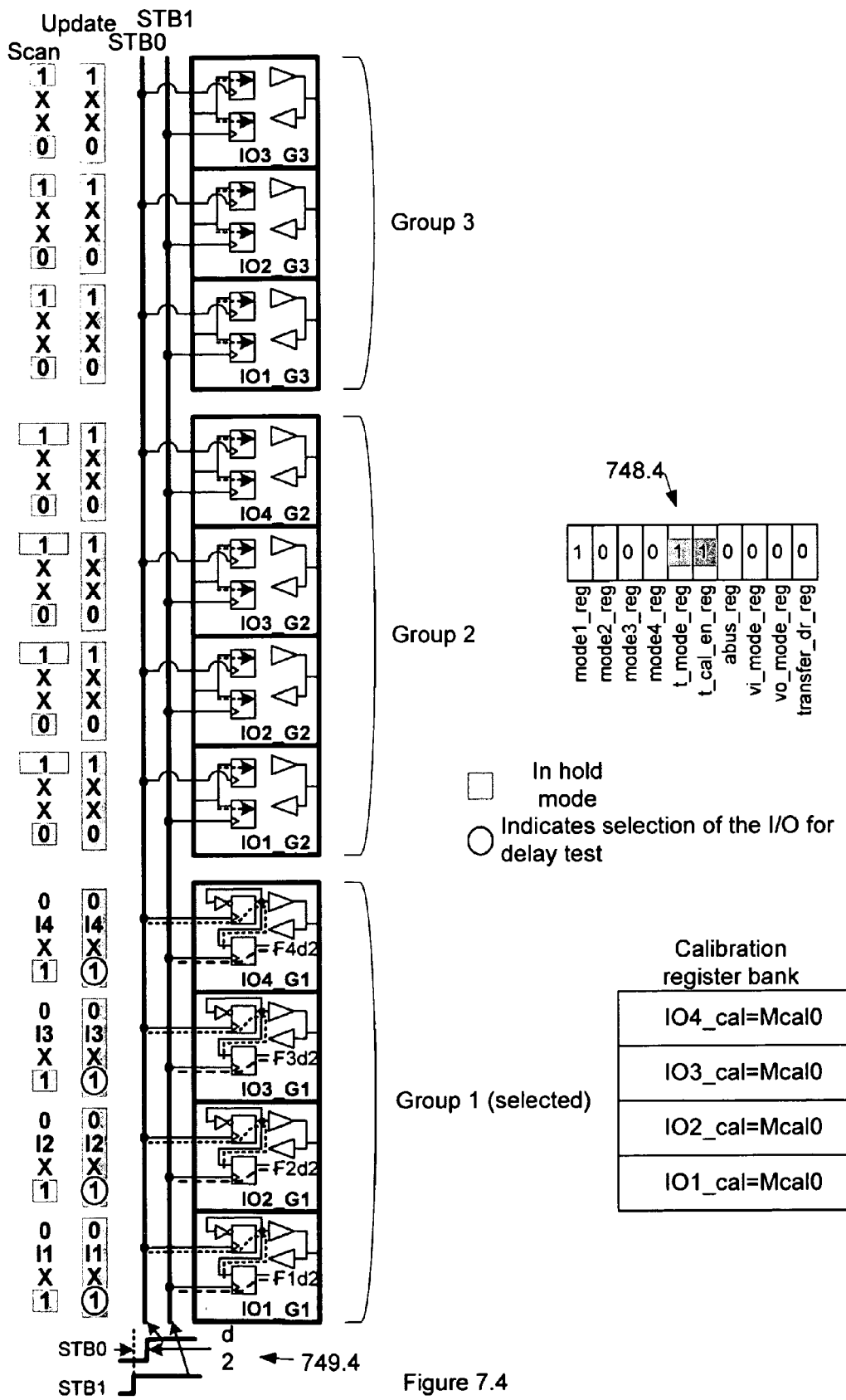
Figure 7.4

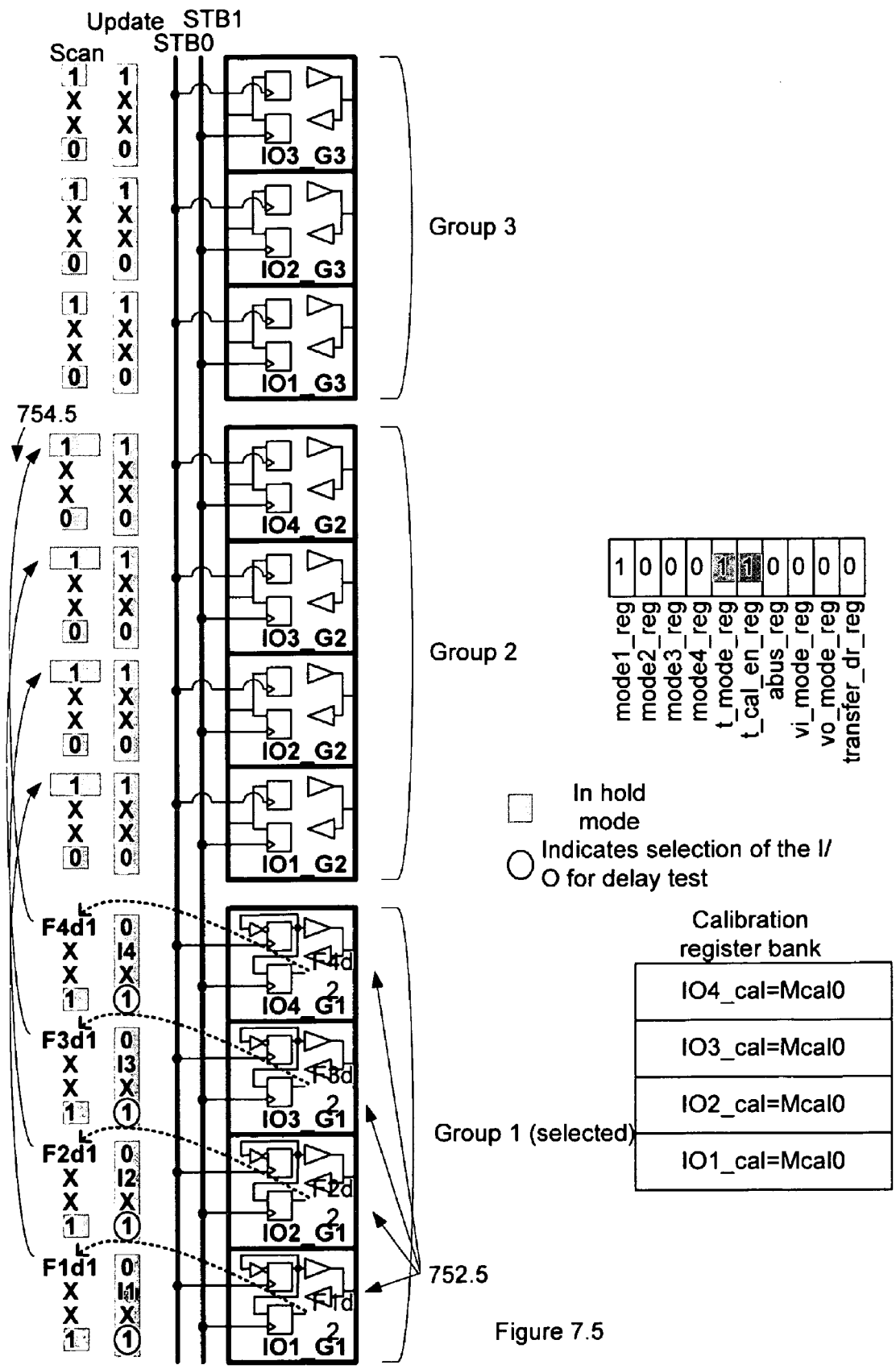
Figure 7.5

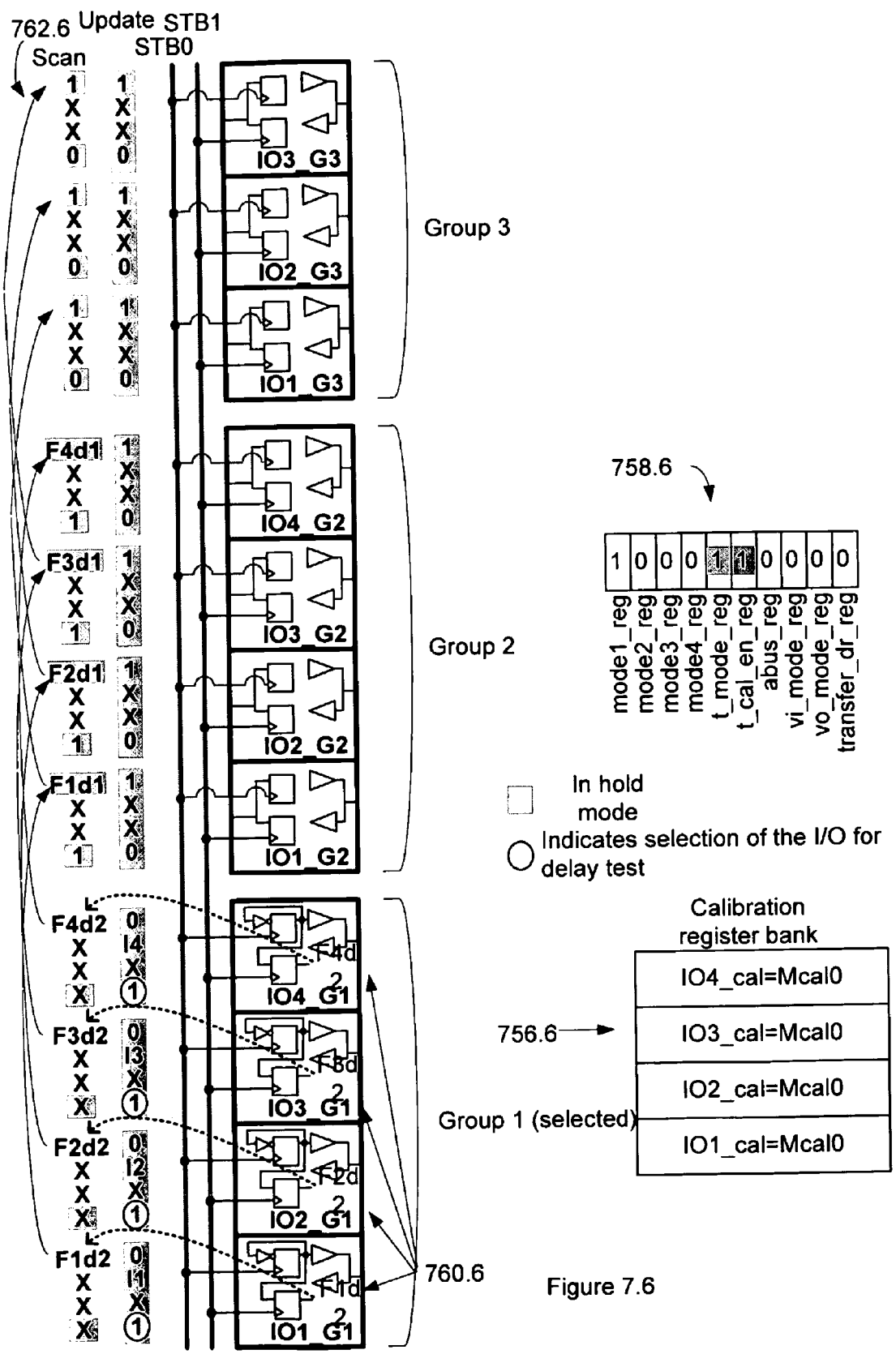
Figure 7.6

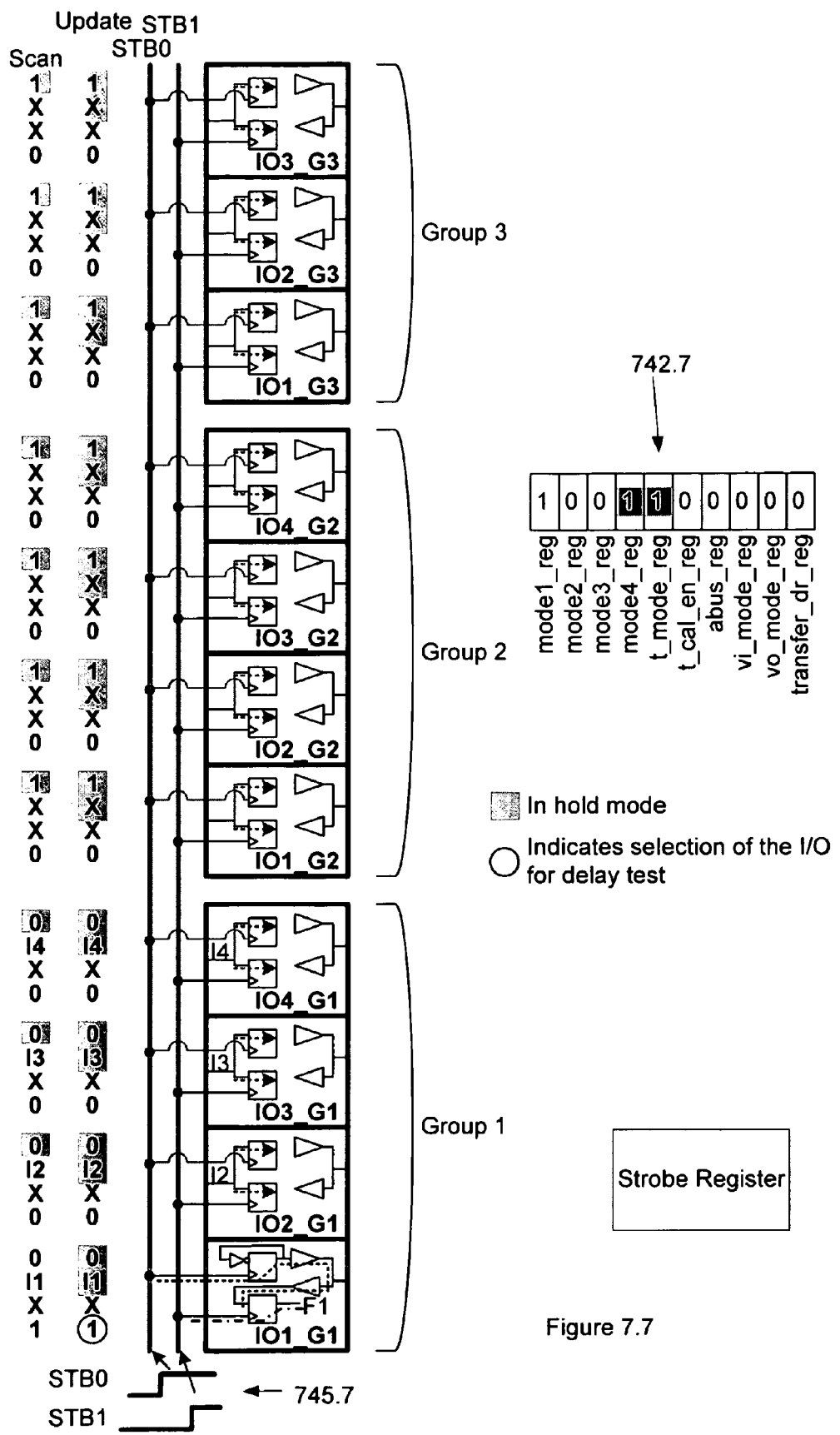
Figure 7.7

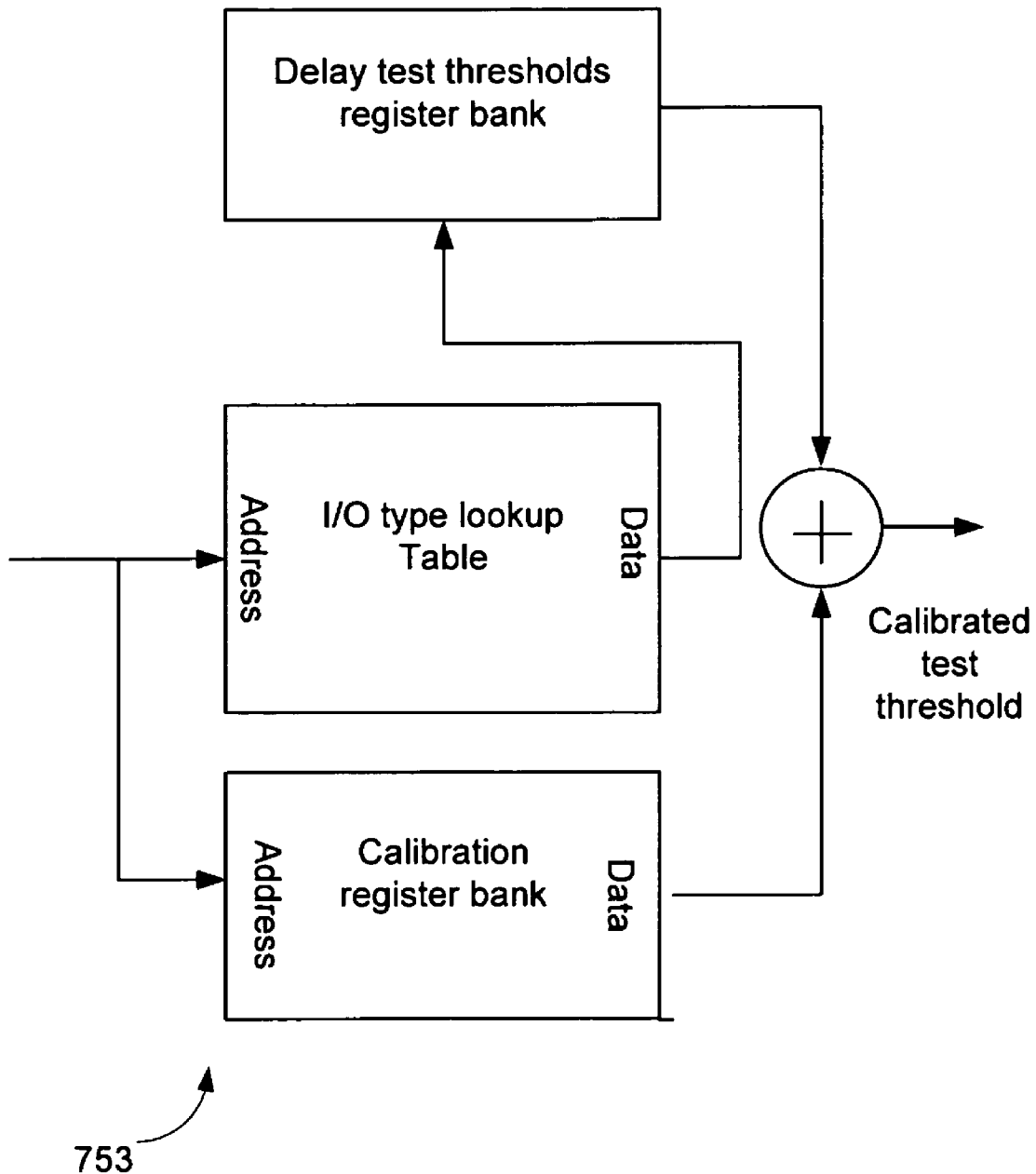
Figure 7.8

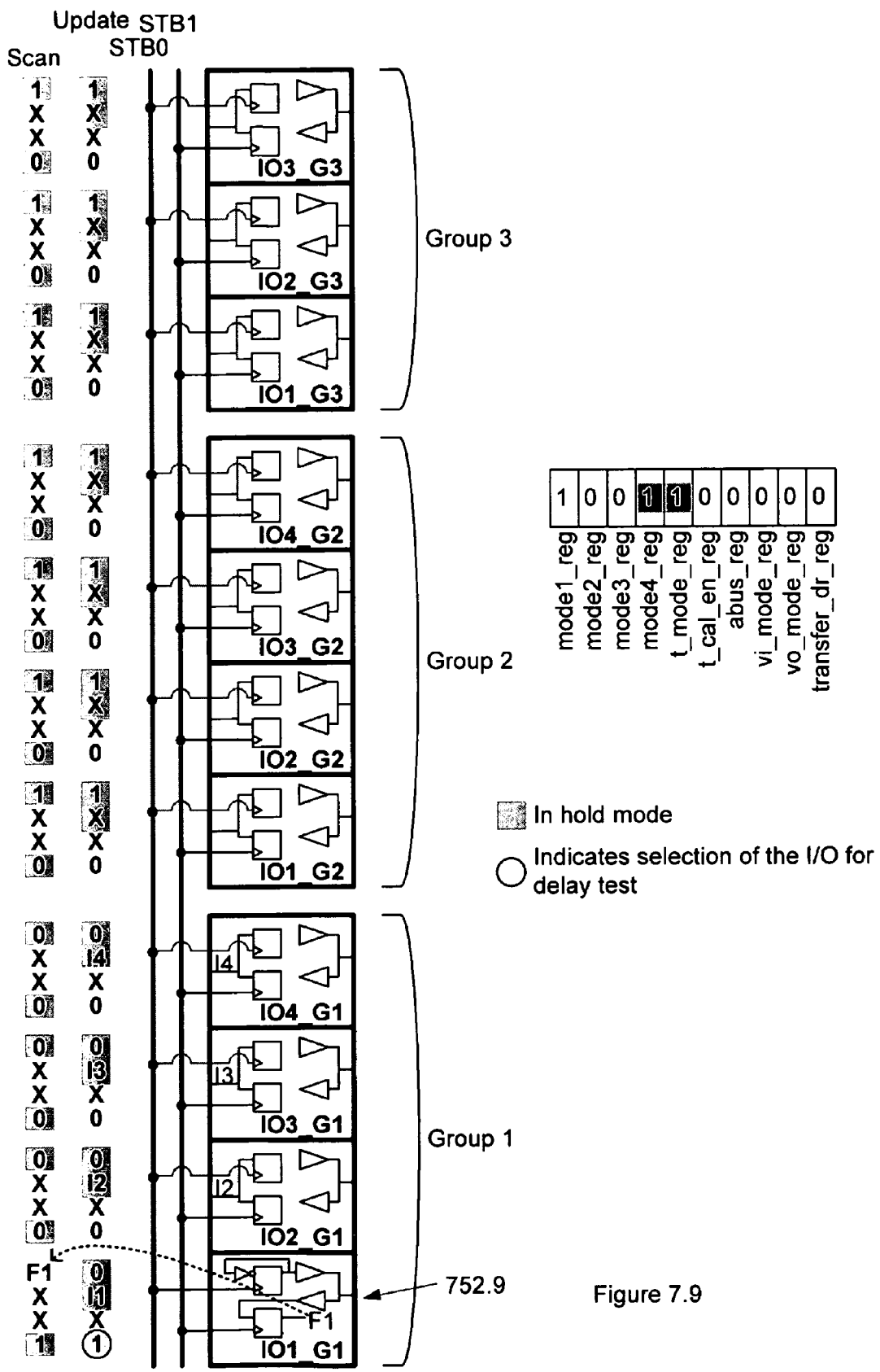
Figure 7.9

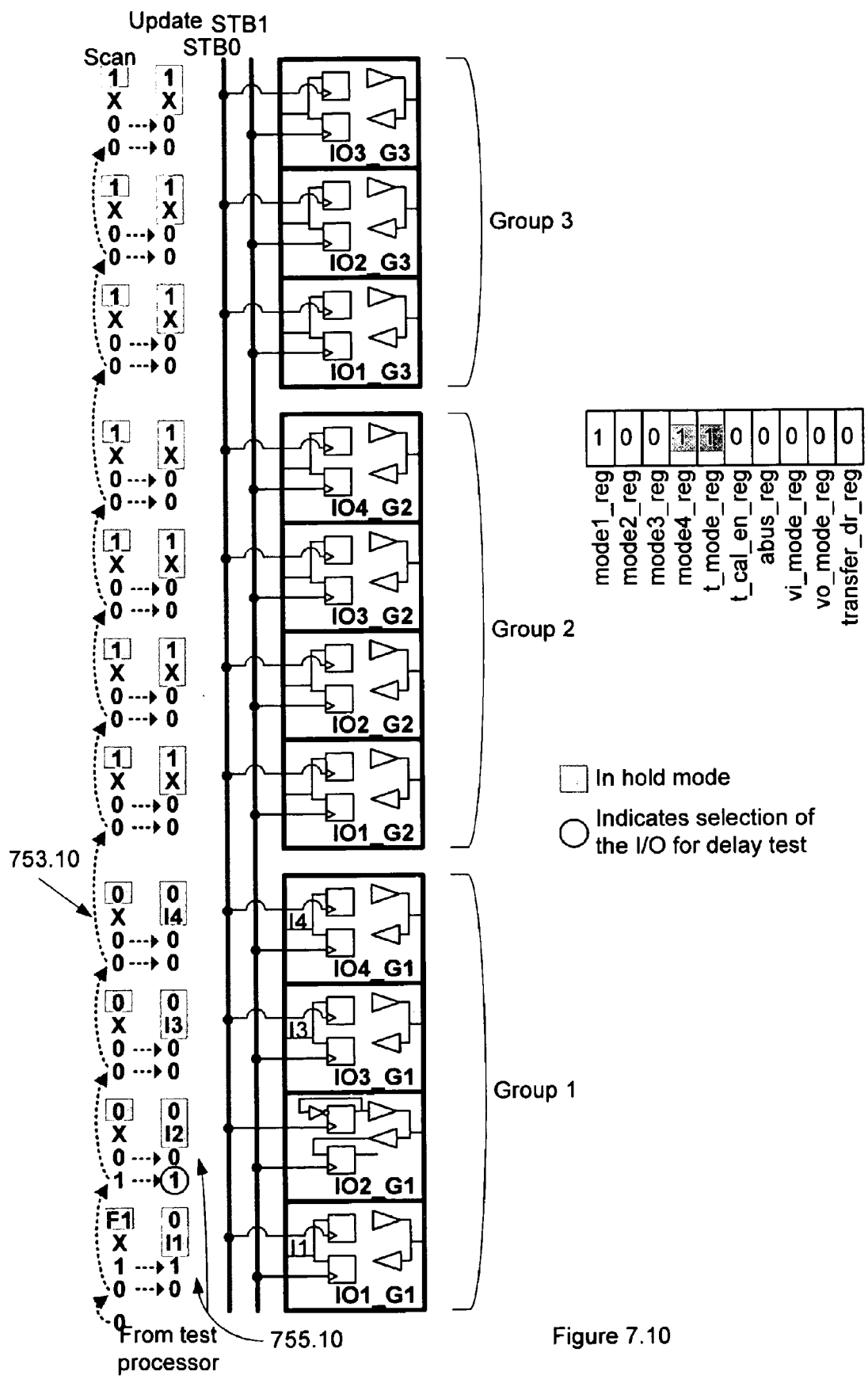
Figure 7.10

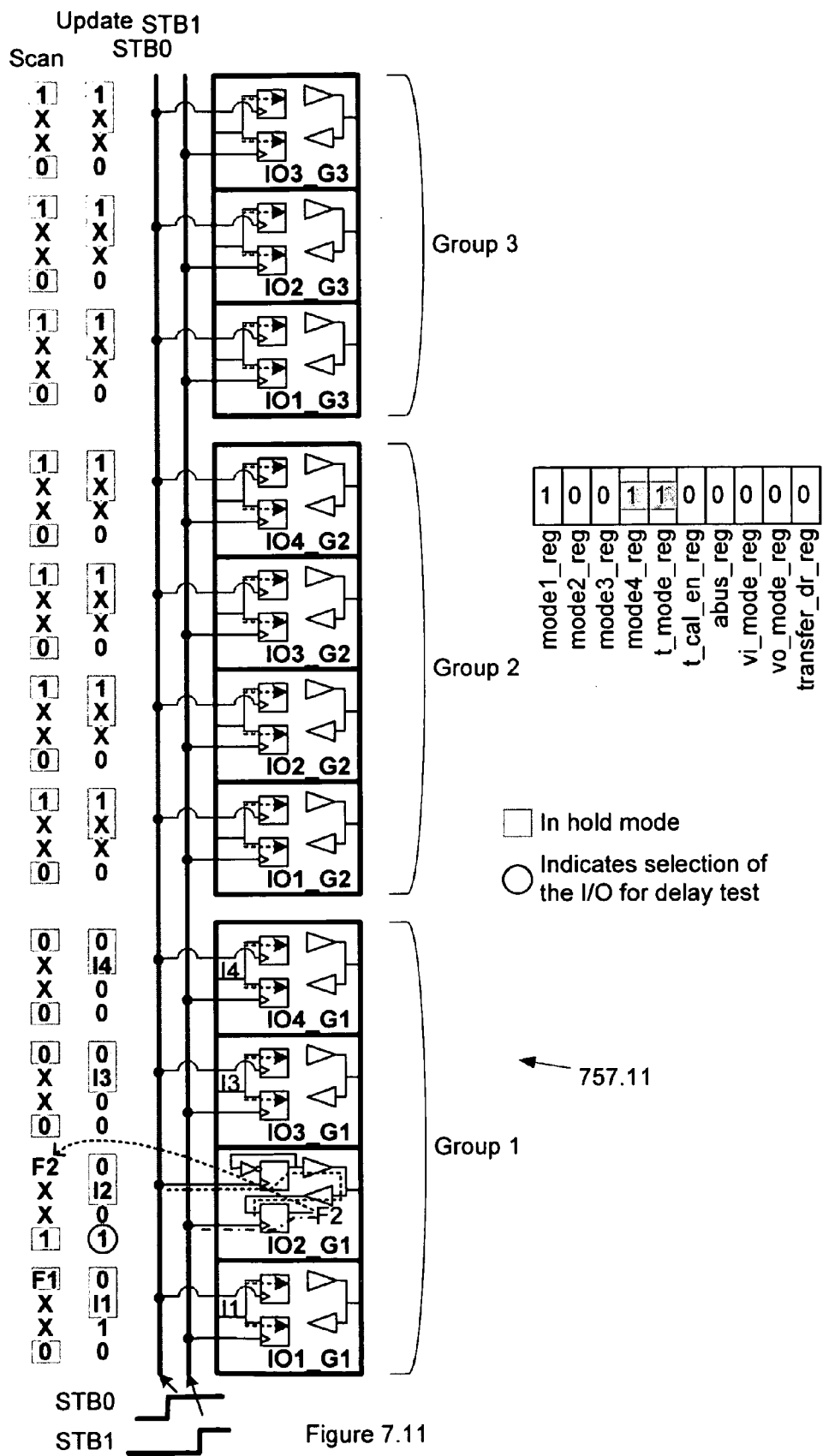
Figure 7.11

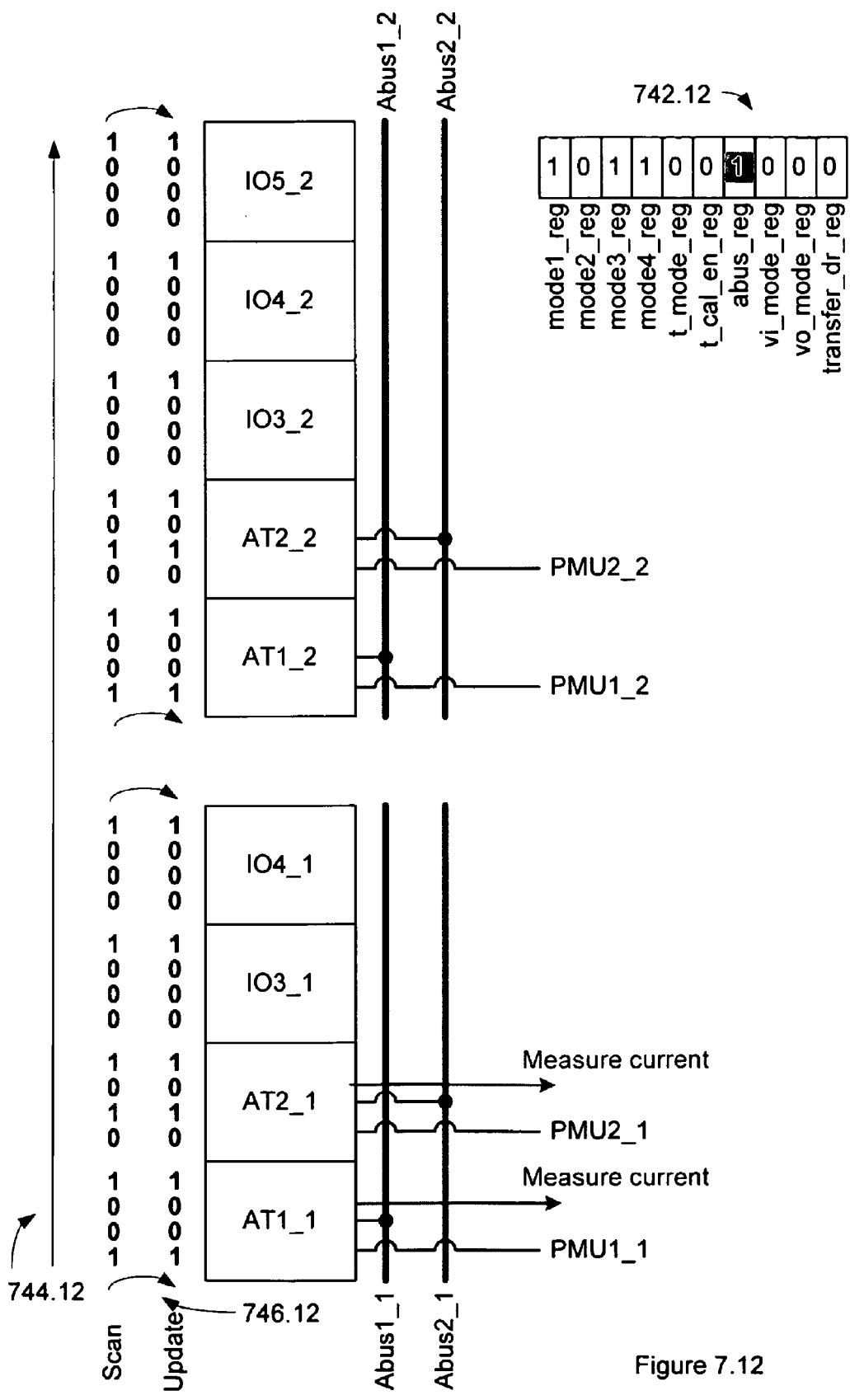
Figure 7.12

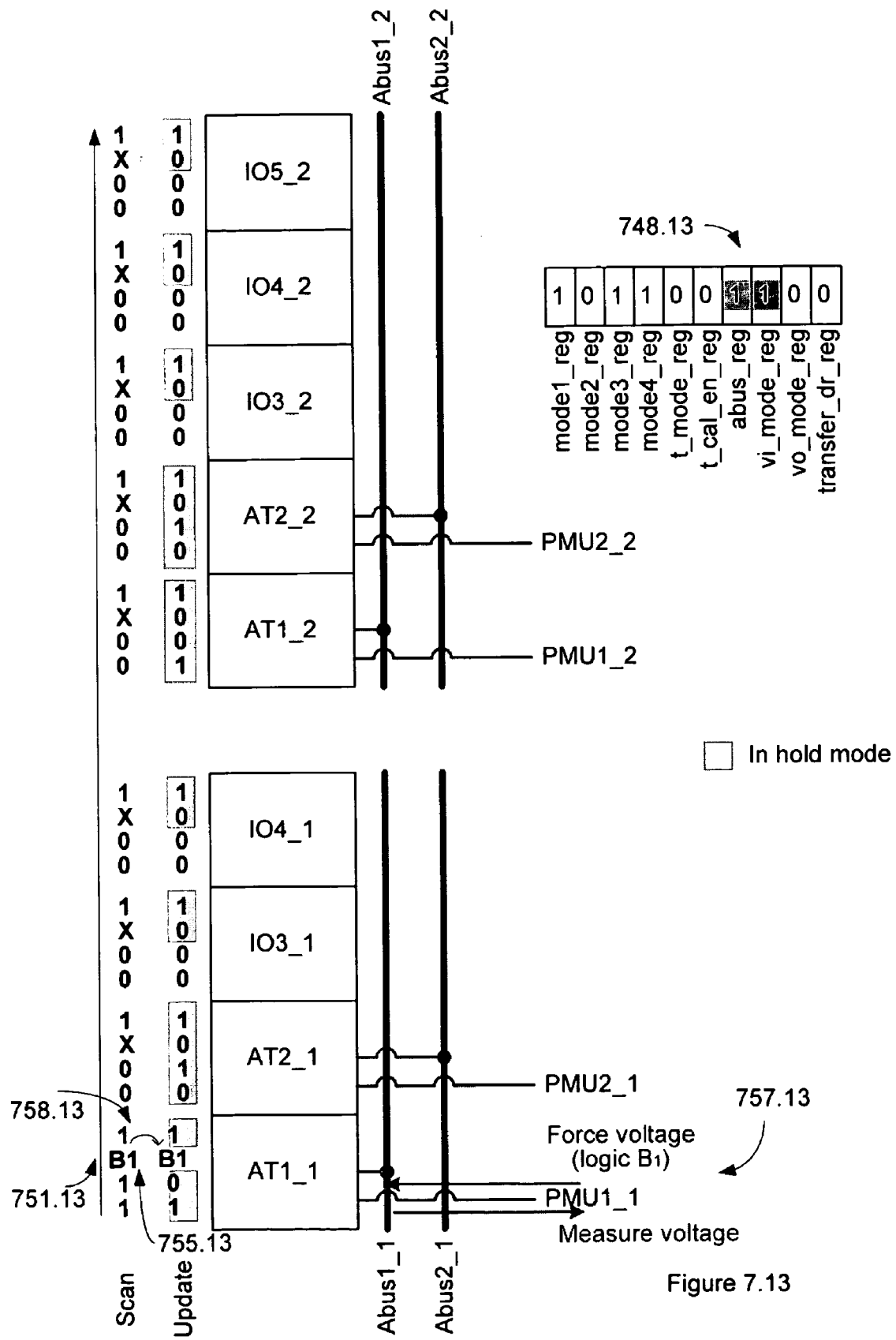
Figure 7.13

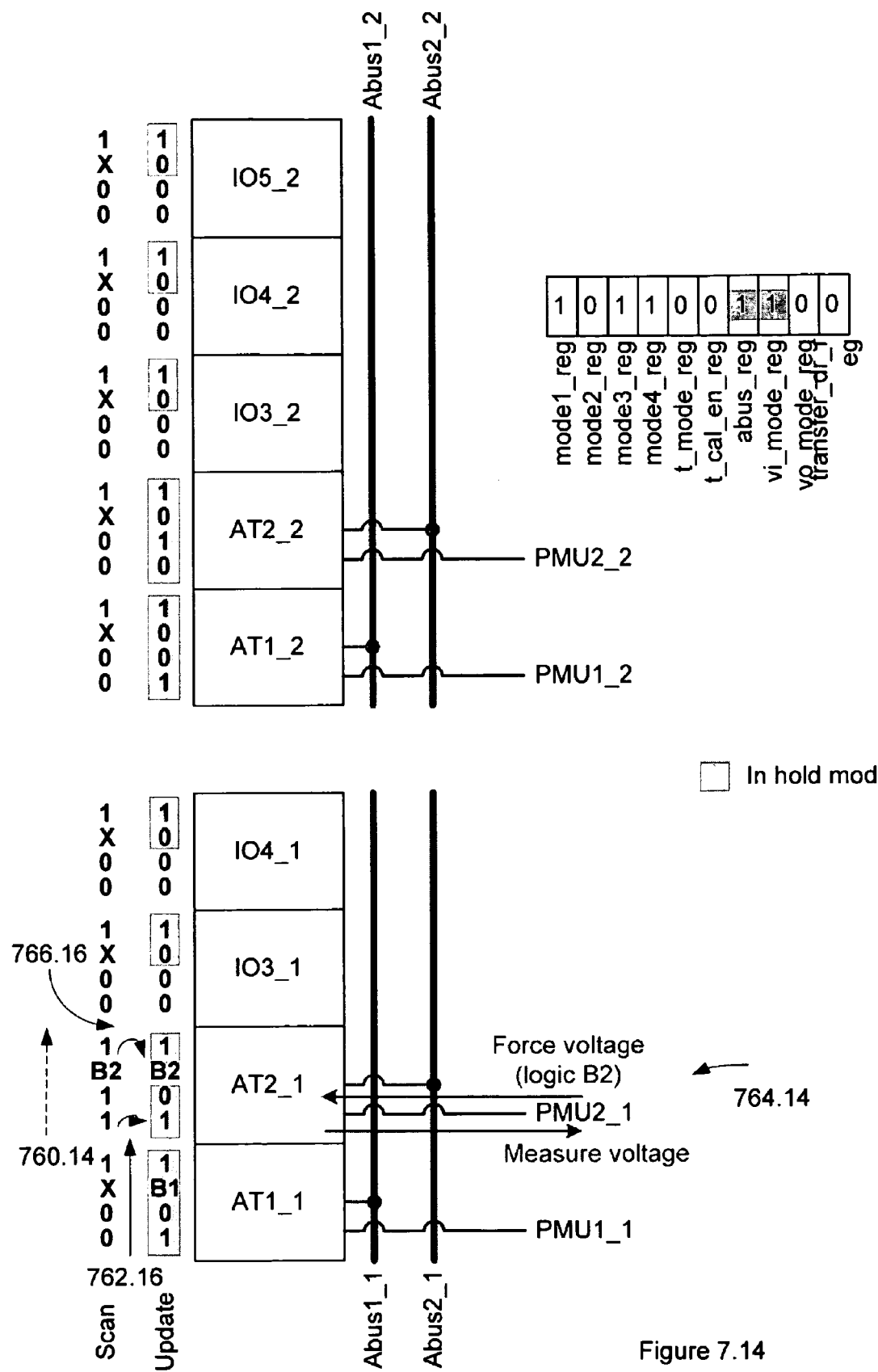
Figure 7.14

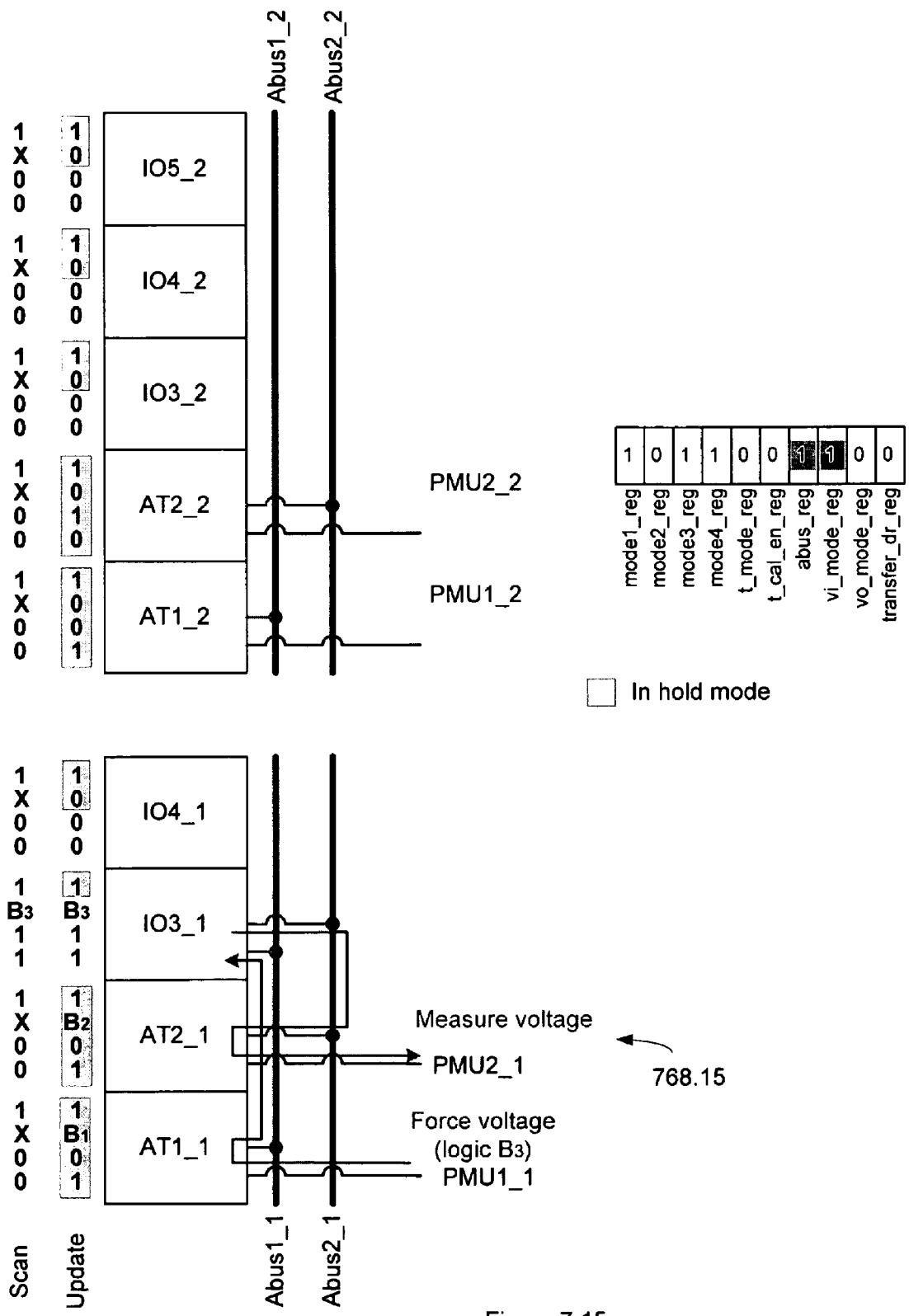
Figure 7.15

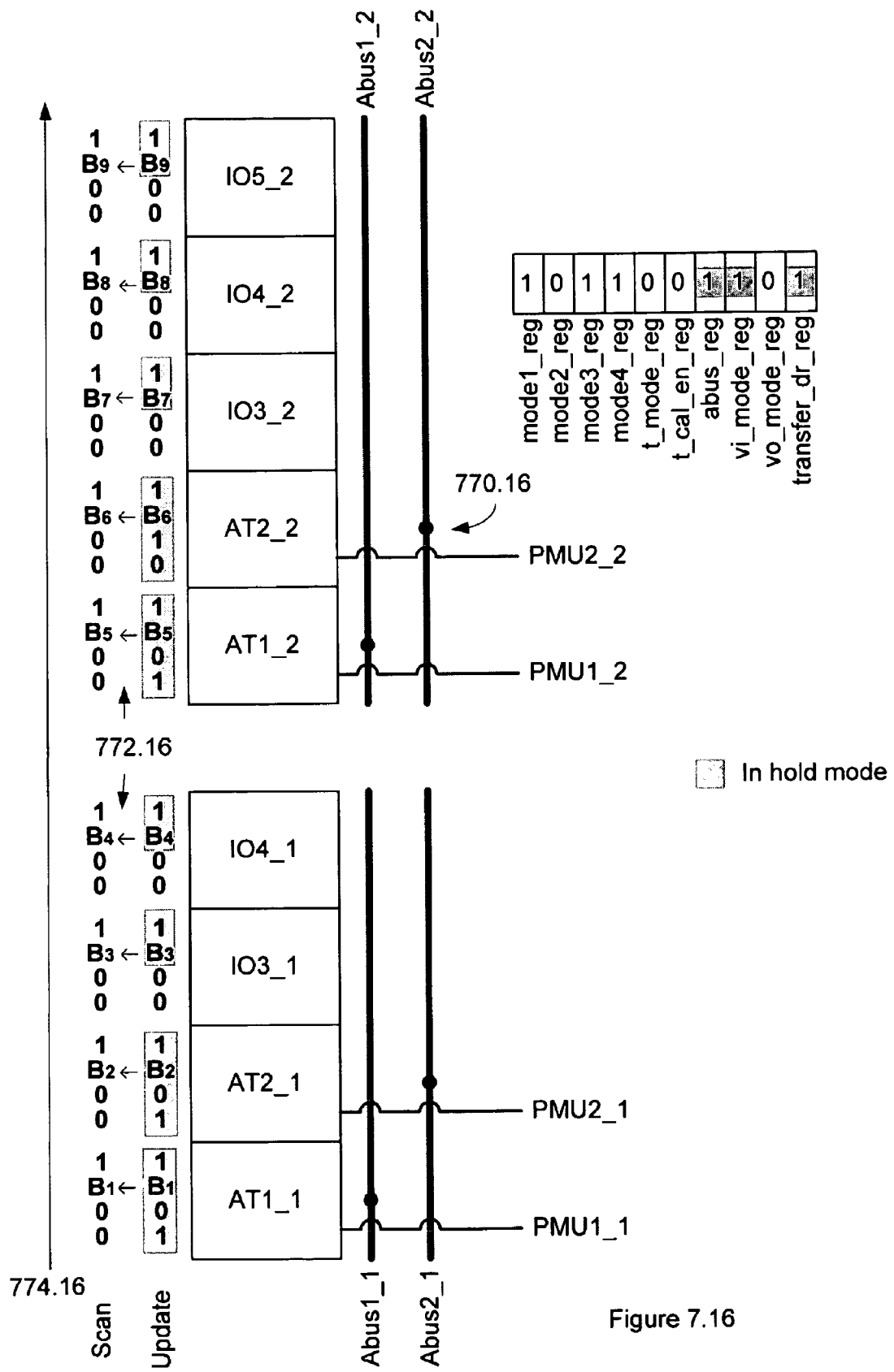
Figure 7.16

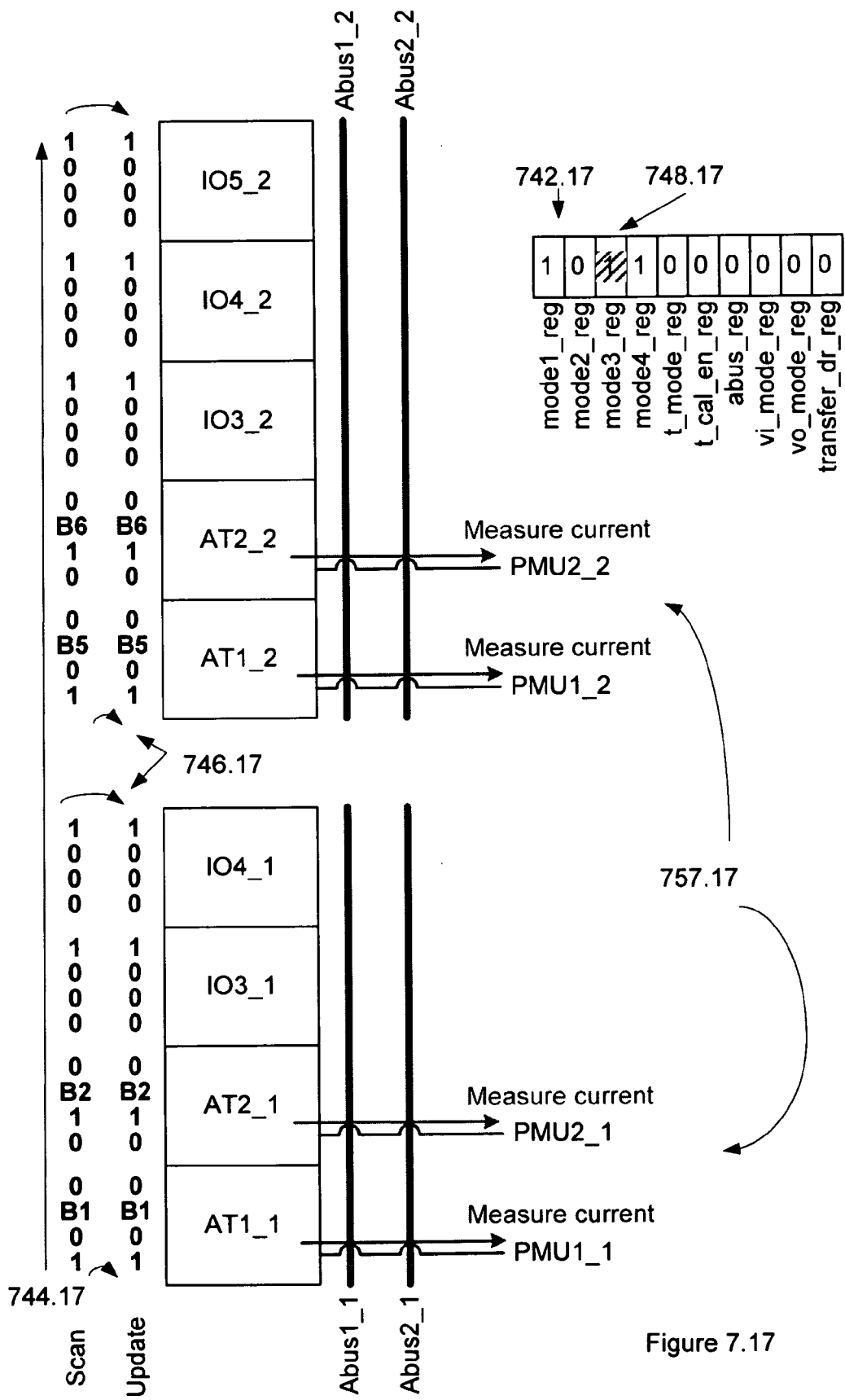
Figure 7.17

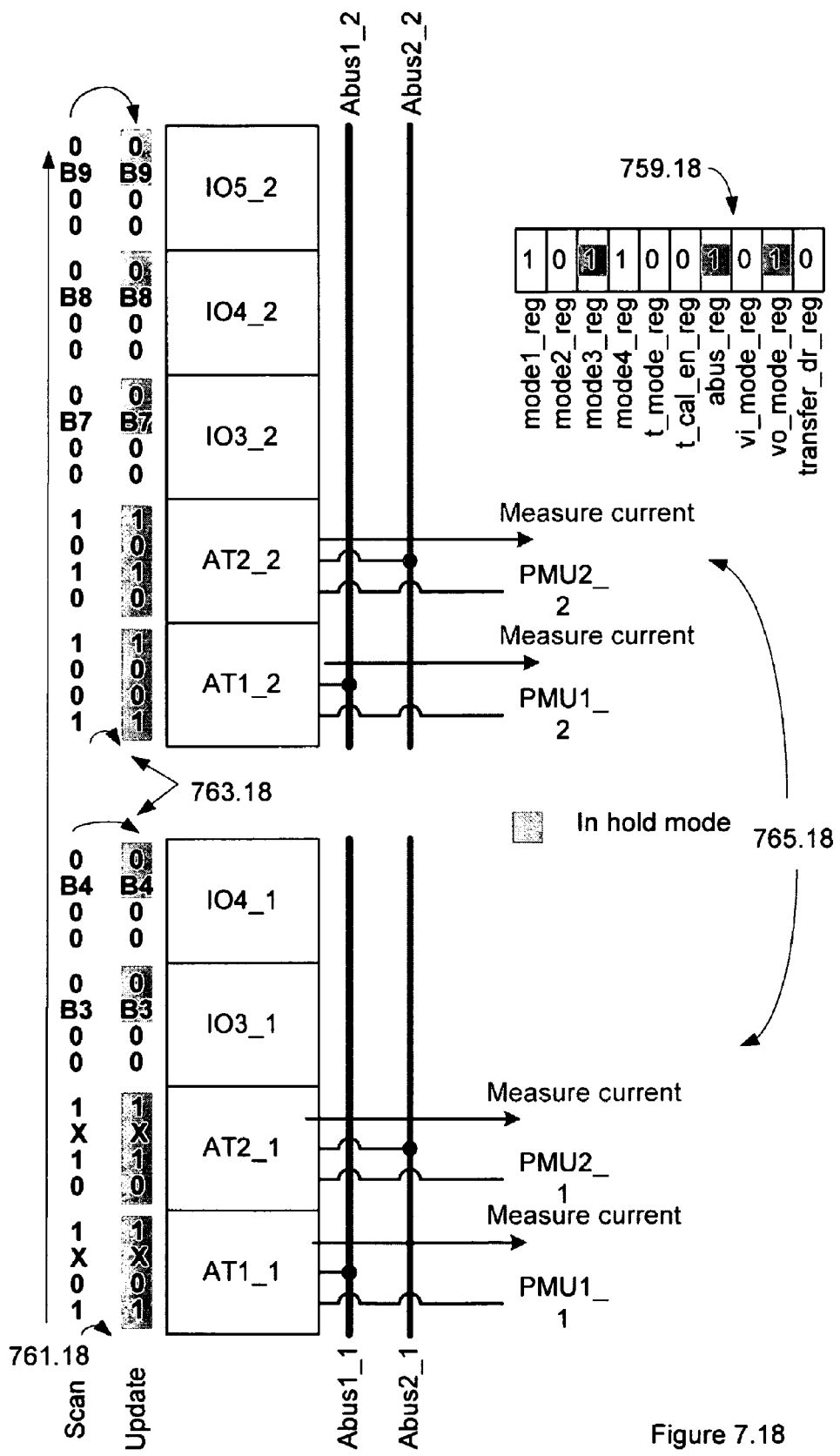
Figure 7.18

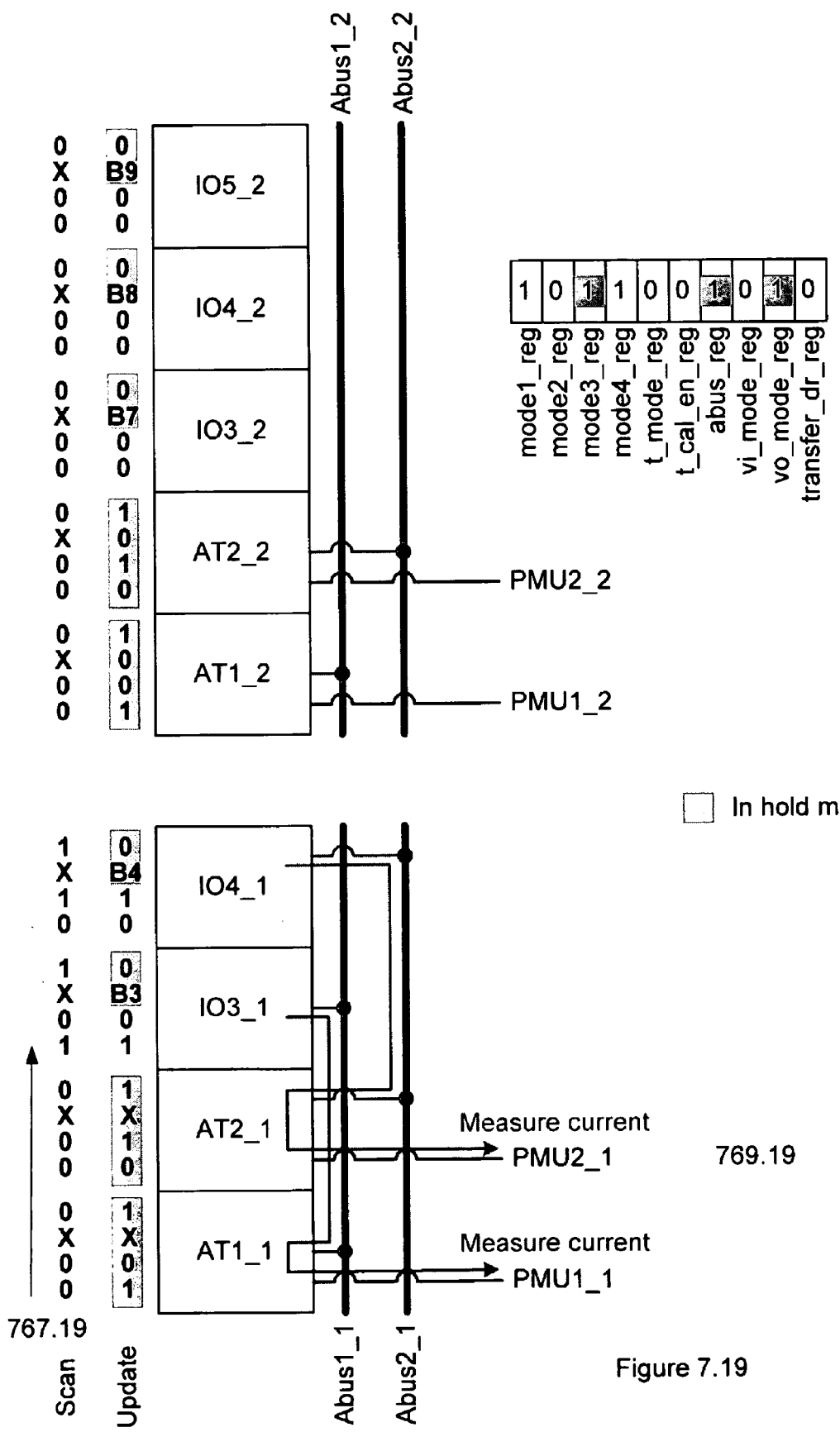
Figure 7.19

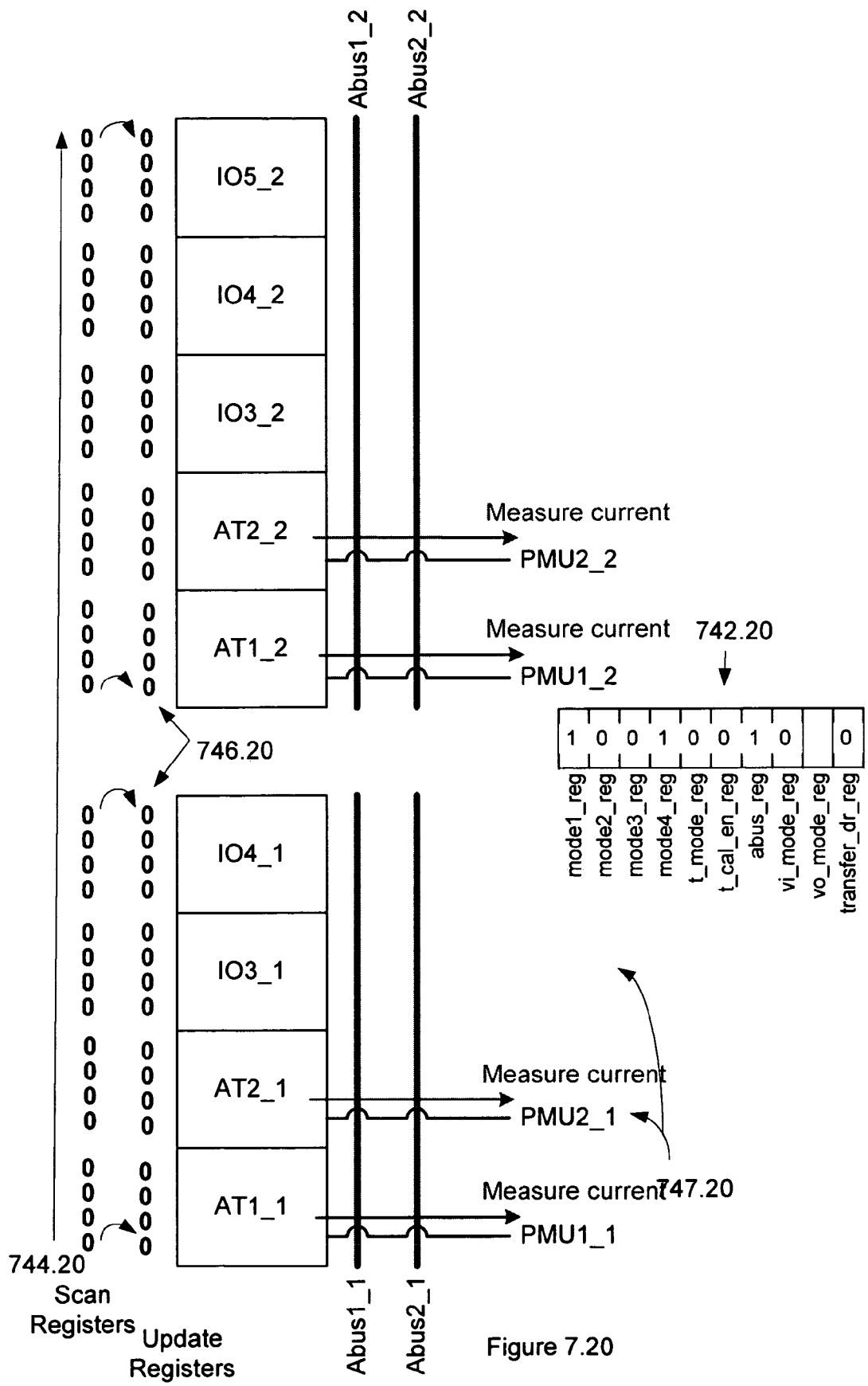
Figure 7.20

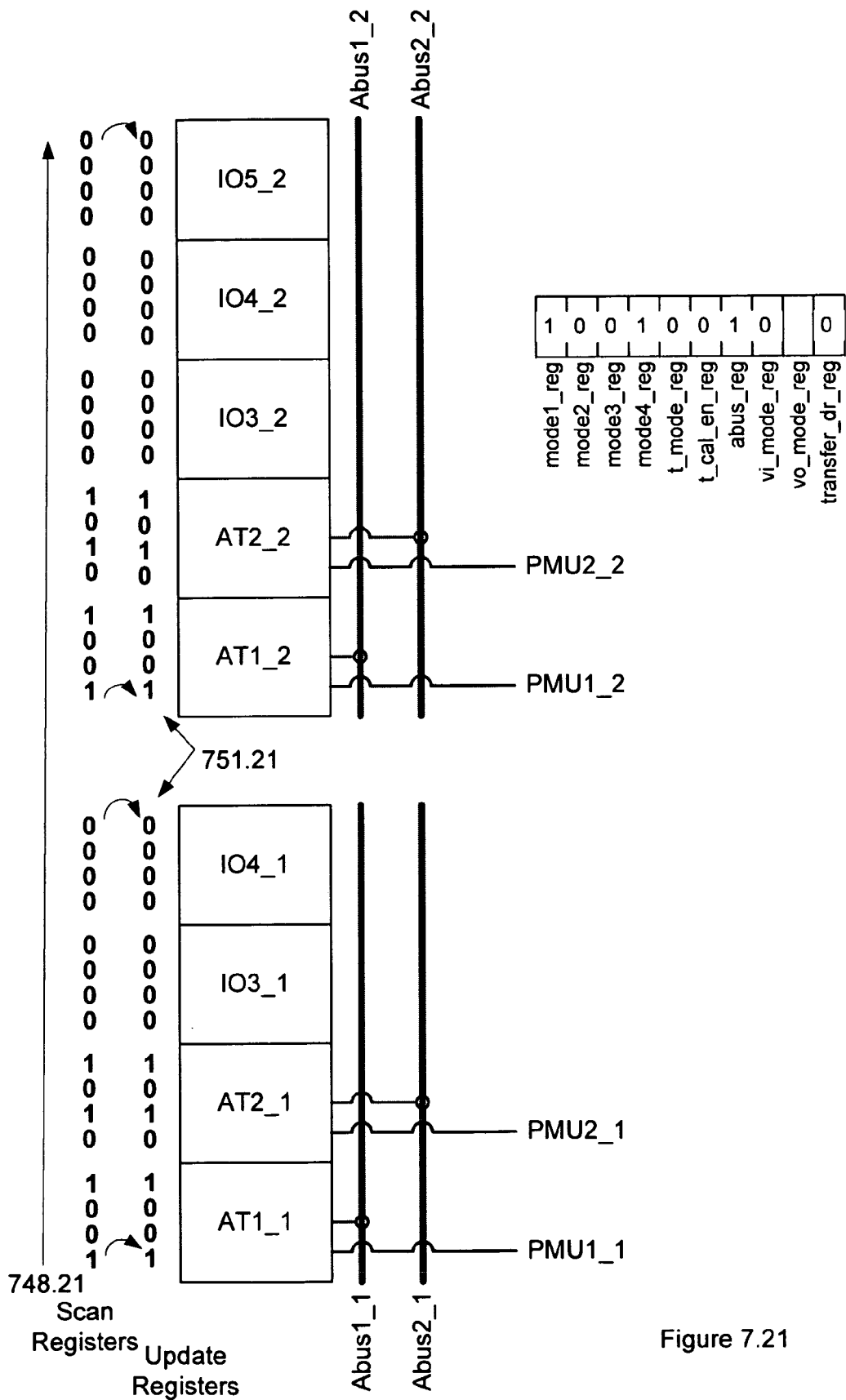
Figure 7.21

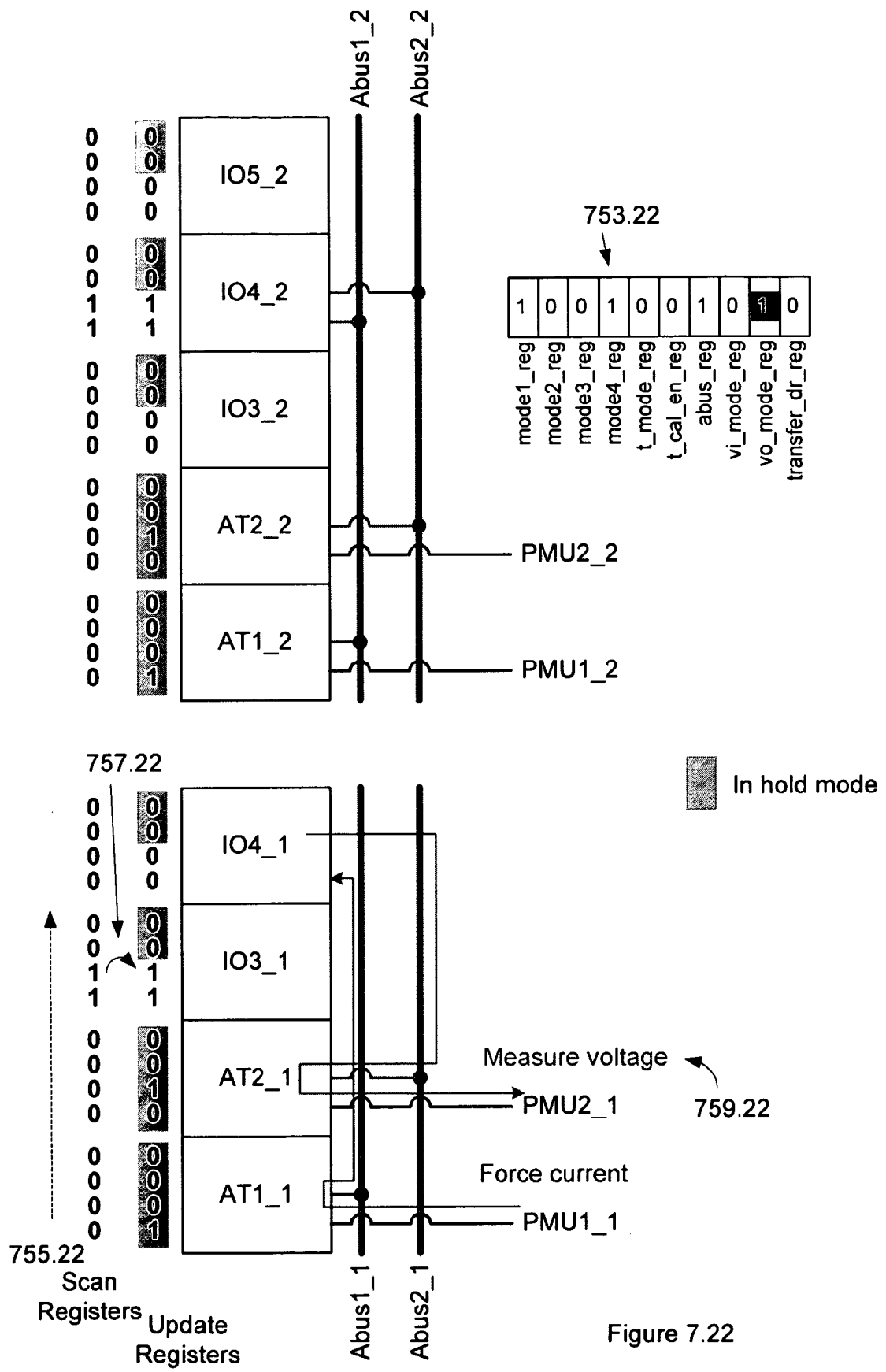
Figure 7.22

INPUT-OUTPUT DEVICE TESTING INCLUDING VOLTAGE TESTS

RELATED APPLICATIONS

This application claims priority to U.S. Provisional Patent Application No. 60/716,386, entitled VARIOUS METHODS AND APPARATUSES FOR INPUT-OUTPUT DESIGNS, filed on Sep. 12, 2005.

TECHNICAL FIELD

Aspects of embodiments of the invention described herein relate generally to electronic circuit testing. Some aspects more particularly relate to circuit design for self-test and repair of integrated circuits.

BACKGROUND

Before an integrated circuit (IC) may be used in an application, it is typically necessary to verify the proper functionality and timing of components within each input/output (I/O) circuit of the IC. Verifying the functionality of an IC is typically accomplished by placing the IC on an external tester, also known as an Automated Test Equipment (ATE), which may include multiple Parametric Test Units (PMUs). An external tester typically includes a tester channel for each I/O pin on the IC. Subsequently, each I/O buffer coupled to an I/O pin is tested for functionality, timing, performance, etc. However, there are often problems associated with testing an IC in this manner. One problem is that testing each I/O pin on an IC is often expensive due to test equipment costs. Another problem is that the speed of the test equipment is typically not fast enough to keep pace with the IC performance requirements. Moreover, many existing test equipment are not capable of testing high-speed source synchronous systems.

A second approach for testing ICs containing I/Os involves using characterization and performing limited testing with a tester. Some manufacturers of ICs characterize their I/Os and then later, when in production, test merely simple direct current (DC) parameters for selectively sampled I/Os. This approach has become increasingly insufficient due to large number of device pins and smaller geometries that lead to more defects in the I/Os.

A third approach for testing ICs containing I/Os involves using on-chip Design for Testing (DFT) and Built-In Self-Test (BIST). Some companies, typically Integrated Device Manufacturers (IDMs) and some larger fabless companies, use in-house approaches including DFT/BIST. Some approaches are comprehensive, but others are ad hoc and may be difficult to extend to new classes of I/Os and/or new process technologies. Further, using BIST for testing of digital chips provides superior yield and predictable performance. When timing tests, such as I/O timing tests, are to be performed on a device in embedded mode using mostly self-generated signals, it is particularly important that the circuitry provides good performance without large on-chip area demands such as may arise out of excessive circuit complexity.

IEEE 1149.1 (a standard from the Institute of Electrical and Electronic Engineers) is intended for testing of device interconnects, such as printed circuit board (PCB) testing. It is possible to use generic IEEE 1149.1 compliant digital boundary modules for communicating data with I/Os, but that can result in excessively extended test times, too large a tester vector memory requirement, and/or a need for significant on-chip memory such as to store intermediate test results. IEEE 1149.4 (a related IEEE standard) provides for automatic test of analog circuit subsystems but has several disadvantages and limitations. For example, it requires at least two external test point connections (pins) dedicated for testing, and continuous boundary buses. These requirements may be excessively burdensome.

SUMMARY

In one embodiment of the invention, an integrated circuit may contain an instruction test processor and a plurality of input-output circuits (I/O). The plurality of input-output circuits may mutually couple in a chain. Each I/O may include an output driver circuit coupled to an input-output port, an input receiver circuit coupled to the input-output port, and a wrapper circuit controlled by the instruction processor. The wrapper circuit may include an analog wrapper circuit (IW-A), an integrated wrapper for delay test circuit (IW-D), and a soft wrapper circuit operable to control the IW-A and the IW-D. The wrapper circuit may further include two or more scan registers, where the data value stored in each scan register can be shifted out for analysis, two or more update registers to transfer stored data values between itself and an associated scan register, and a set of combinatorial logic coupled to the scan registers, the update registers and the instruction test processor. The I/O soft wrappers have registers coupled with the combinational logic to enable hold and transfer states to re-use these registers as a temporary memory element when possible.

Other aspects of the invention will be apparent from the accompanying figures and from the detailed description, which follows.

BRIEF DESCRIPTION OF DRAWINGS

One or more embodiments of the invention are illustrated by way of example and not limitation in the figures of the accompanying drawings, in which like references indicate similar elements and in which:

FIG. 4b illustrates an embodiment of the I/O circuit similar to FIG. 4a but at a level of abstraction above the component level of detail in FIG. 4a;

FIG. 7.1 and FIG. 7.2 refer to a method of initializing groups of input-output circuit for a delay test of each input-output circuit in the groups of input-output circuits;

FIGS. 7.3, 7.4, 7.5 and FIG. 7.6 refer to a method of generating calibration data for a delay test of each input-output circuit on a chip;

FIGS. 7.7-7.11 illustrate a method to perform a delay testing procedure for a group of input-output circuits, one input-output circuit in the group at a time;

FIGS. 7.12-7.16 illustrate an input voltage test on an input-output circuit where the test results will be locally stored on an individual basis in the update registers until the test is completed and then the test results of all of the input-output circuits under test will be transferred to an associated scan register and full shifted out for analysis;

FIG. 7.17 thru 7.19 illustrate a method to measure input output circuit leakage current from each input output circuit in a group of two or more input output circuits through the on-chip analog test bus and to calibrate the measured leakage current of each input output circuit under test for the presence of leakage current from the analog test bus;

FIGS. 7.20-7.22 illustrate an output voltage test on input-output circuits grouped in multiple segments using the on-chip analog buses.

Figure 1:
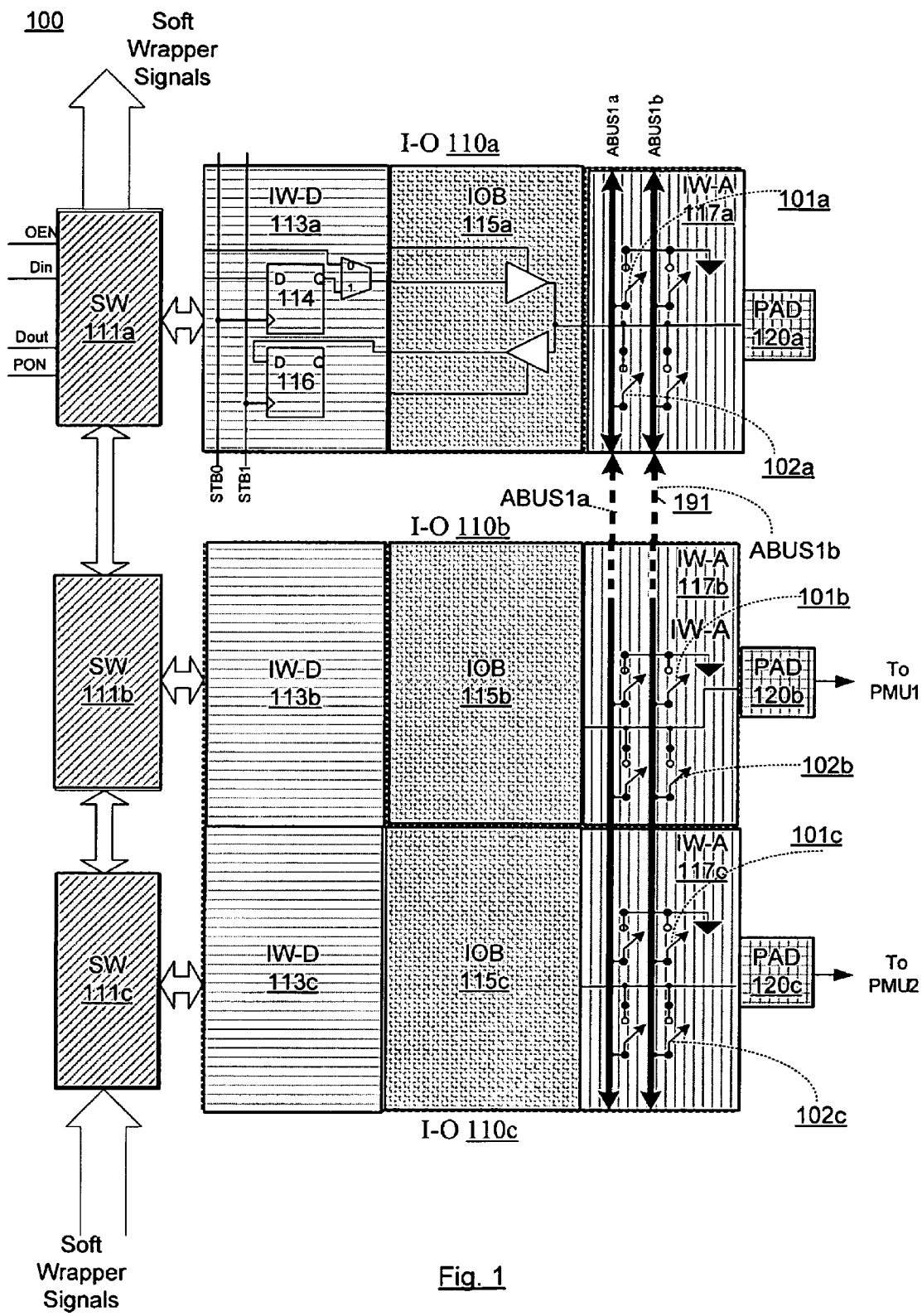
FIG. 1 illustrates a block diagram of an embodiment of one I/O chain segment including a series of wrappers.

While the design is subject to various modifications and alternative forms, specific embodiments thereof have been shown by way of example in the drawings and will herein be described in detail. The design should be understood to not be limited to the particular forms disclosed, but on the contrary, the intention is to cover all modifications, equivalents, and alternatives falling within the spirit and scope of the design.

DETAILED DESCRIPTION

In the following description, numerous specific details are set forth, such as examples of specific input output circuits, named components, connections, etc., in order to provide a thorough understanding of the present design. It will be apparent, however, to one skilled in the art that the present design may be practiced without these specific details. In other instances, well known components or methods have not been described in detail but rather in a block diagram in order to avoid unnecessarily obscuring the present design. Thus, the specific details set forth are merely exemplary. The specific details may be varied from and still be contemplated to be within the spirit and scope of the present design.

The design may provide testability and repair features for ICs containing I/Os. The design may provide a generalized test and repair solution for I/Os that may be packaged within manufactured devices. Using a Self-Test and Repair I/O System ("SIS"), a system-on-a-chip ("SOC") with hundreds or even thousands of I/Os may be tested by using a tester that supports only a few tens of pins. SIS is a generalized test and repair solution for I/Os, and may be packaged with the I/O.

The design enables sequential access to the I/Os for analog, timing and digital data access. This provides access to all I/Os without causing routing congestions in the chip. Accordingly, analog access to digital I/O buffers is provided without adding dedicated I/O to the chip, as could be required under IEEE 1149.4 standard. Further, an uninterrupted chain of testable I/Os is segmented together. Multiple on-chip analog buses are used to provide external access to the I/Os in a segmented I/O chain through at least two I/Os of the plurality of I/Os but less than all of the plurality of I/Os within the segment. These I/Os couple to an external tester that provides PMU functionality. The testable I/Os are bi-directional, in that they can send and receive data.

Strobes to the I/Os may be routed using buffers and two buses that form a ring around the chip, to avoid routing congestion. Additional calibration methods are provided that avoid loss of accuracy that can result from such routing strategy. Also, a central test processor controls all operations of SIS, generates test patterns and analyses the results.

In an embodiment, an integrated circuit may contain an instruction test processor and a plurality of input-output circuits (I/O). The plurality of input-output circuits may mutually couple in a chain. Each I/O may include an output driver circuit coupled to an input-output port, an input receiver circuit coupled to the input-output port, and a wrapper circuit controlled by the instruction processor The wrapper circuit may include an analog wrapper circuit (IW-A), an integrated wrapper for delay test circuit (IW-D), and a soft wrapper circuit operable to control the IW-A and the IW-D. The wrapper circuit may further include two or more scan registers, where the data value stored in each scan register can be shifted out for analysis and new data may be shifted into these scan registers, two or more update registers to transfer stored data values between itself and an associated scan register, and a set of combinatorial logic coupled to the scan registers, the update registers and the instruction test processor. The I/O soft wrappers have registers coupled with the combinational logic to enable hold and transfer states to re-use these registers as a temporary memory element when possible. This reduces the number of serial data shifts and additional on-chip memory drastically.

FIG. 1 illustrates a block diagram of an embodiment of one I/O chain segment including a series of wrappers. I/O segment 100 includes an example number of three I/Os 110a, 110b, and 110c. In many cases, an IC may contain groups of SIS-enabled I/Os and groups of I/Os that are not SIS-enabled, e.g., SERDES I/Os, I/Os without required SIS wrappers, and so on. In such cases, the I/Os may be segmented together. A segment is an uninterrupted chain of testable I/Os and/or a grouping of I/Os that possess similar input-output voltage characteristics. In a segmented I/O chain, multiple on-chip analog buses are used to provide external access to the I/Os through two I/Os or potentially more but less than all of the I/Os within the segment. In one embodiment, two I/Os from each segment may be connected to external PMUs to provide DC test access to all I/Os in that segment.

FIG. 1 shows how a series of I/Os are accessed sequentially for analog, timing test, and digital access. The analog access is provided by analog buses (ABUS1a and ABUS1b), the timing test access by strobe buses (STB0 and STB1), and digital access is made possible by soft wrappers (111a, 111b, and 111c) that are connected to their corresponding I/Os and the soft wrappers of the immediately adjacent I/Os. For instance, soft wrapper 111a is connected to its corresponding I/O 110a and to the soft wrapper 111b of the immediately adjacent I/Os 110b. The sequentially connected I/O wrappers perform all the logical and parametric tests. The design provides adequate access to I/Os for DC, timing, and logical test and measurements without causing routing congestion or requiring significant area overhead.

Each I/O is connected to a respective Pad 120. Typically, each Pad 120 may be formed by metallization (or otherwise)

and may connect to an off-die circuit (not shown in FIG. 1) by means of a bond-wire, flip-chip solder bead, or other means as is well-known in the art.

As depicted, each I/O subsystem 110 comprises a corresponding soft wrapper circuit 111, an integrated wrapper for delay digital test (IW-D) circuit 113, an I/O buffer (IOB) 115, and an integrated wrapper for analog test (IW-A) 117.

The soft wrapper circuit 111 is an I/O wrapper, and may be delivered as soft macro or synthesizable soft core. An I/O wrapper is the circuitry dedicated to each I/O for test and debug operations. Thus, the I/O wrapper may include the soft wrapper circuit 111, the integrated wrapper for delay digital test circuit 113, and the integrated wrapper for analog test (IW-A) 117. The soft wrappers 111 use a boundary scan mechanism for exchanging test data with their respective I/O using modularity and reduced routing congestion features. In one embodiment, the soft wrapper circuit 111 includes a circuit similar to the digital boundary scan module used in IEEE1149.1 or IEEE1149.4 standards. In an alternate embodiment, the soft wrapper circuit 111 is delivered as hard macros within the I/O frame. A chain of I/O soft wrappers may serve as boundary scan modules for SIS enabled I/O. In one embodiment of the invention, the soft wrapper circuit 111 can support both the IW-A and the IW-D simultaneously. An embodiment of a soft wrapper is discussed in greater detail with reference to FIGS. 4a-c.

The IW-D circuit 113 is the integrated wrapper that is included in each I/O for delay and timing tests. In one embodiment, the IW-D circuit 113 includes launch and capture D-flip flops (114 and 116 respectively) operable to launch and detect transitions for a delay test sequence for each I/O in the I/O segment 100. Accordingly, the action of the IW-Ds 113 may be in support of conducting various types of delay test, including launch and capture response tests. The IW-Ds 113 may act to synchronize and select appropriate timing signals (STB0 and STB1) from strobe conductors. In one embodiment, the IW-D circuit 113 is hardened and included in the I/O frame due to timing critical paths and matching requirements. An embodiment of an IW-D is described below in reference to FIG. 6.

The IW-A circuit 117 is included in each I/O for DC and analog test access. In one embodiment, the IW-A circuit 117 is designed as a hard macro and is dependent on the structure and test needs of each I/O. For most bi-directional I/Os, the IW-A circuit 117 includes analog bus (ABUS) routings, which are designed such that they can be connected from one I/O to the next through abutment. These buses form two I/O ring routings. The buses provide electrical access to the I/O Pads 120. For DC parameter test, current and voltage are forced on the Pad 120 using one bus line (e.g., ABUS1a) and Pad voltage measured through the second line (e.g. ABUS1b). In an embodiment, the buses ABUS1a and ABUS1b carry analog signals for one I/O segment. Multiple segments may be used for different I/O voltage domains such as 1.8V, 2.2V, 2.5V, etc., present in the I/O chain. The two buses carrying analog signals ABUS1a and ABUS1b in the first I/O segment 110a are not connected to the two buses ABUS2a and ABUS2b carrying analog signals in a second I/O segment.

The segmented architecture may also have analog bus to ground switches 101 in each IW-A. Accordingly, the IW-As 117 may comprise controlled switches 101a, 101b, 101c, 102a, 102b, and 102c, which may each operate under control of an associated soft wrapper 111. Such switches may be embodied as ordinary structures, such as FETs (field-effect transistors). The switches may connect the analog bus ABUS1a, ABUS1b to ground during normal operation that is when placed into application service as contrasted with when undergoing testing. The ground switches 102 are activated when not in analog test mode; accordingly the analog buses are connected to ground when not in use, e.g., during a timing test or when in functional mode. This reduces noise associated with floating buses. Grounding an analog bus when unused (such as in normal application operation) may enhance noise immunity. Grounding for this purpose may be for radio frequency signals or more generally for alternating current (AC) signals and need not necessarily involve DC grounding.

Thus, each IW-A 117 has a pair of switches to ground the two analog buses ABUS1a and ABUS1b. Accordingly, IW-A 117a has a first dual pole switch 102a to switch the two analog buses ABUS1a and ABUS1b to PAD in the first I/O 110a, IW-A 117b has a second dual pole switch 102b, which may switch the two analog buses ABUS1a and ABUS1b to the second I/O PAD, and so on.

The IW-A circuit 117 may also include PAD-to-ABUS switches to connect the I/O to the analog buses. These switches may have to be designed to maintain I/O Electrostatic discharge (ESD) protection level. The IW-A circuit 117 may also include ABUS-to-VSS voltage switches to connect the analog buses to the VSS to avoid floating buses when all other PAD-to-ABUS switches are open, e.g., in normal I/O function mode. As indicated by the solid lines in IW-A 117b and 117c, data signals may flow in either direction between Pad 120 and a respective IW-A 117. Analog signals may flow in either direction along analog bus, which links the IW-As 117 together (e.g., in a "bus" circuit topology).

The IW-As 117 may act to connect the primary data path (and hence the Pad 120) to the analog bus, or to isolate it from that bus responsive to control signals received from the soft wrapper 111.

The analog bus ABUS1a may provide external access for test purposes to the single pad 120a that provides PMU functionality to test the first I/O segment 110a through two or more I/O circuits within the I/O segment 100. Switches 102b and 102c in two of the I/Os in the segment, may each serve to connect one selected conductor of the analog bus ABUS1a, ABUS1b to two Pads 120b and 120c and thence to a corresponding off-die (off-chip) circuit, for example PMU1, PMU2. Circuits PMU1, PMU2 may typically be connected to an external instrument or test gear, for example a PMU. In this way external test circuit access to conductors of the analog bus may be provided, without having dedicated test pins. In this way, two PMUs may connect to each I/O segment that contains large amounts of individual I/Os via two general-purpose I/Os.

Thus, it is possible to use an external PMU to impress signals, via the analog bus, upon a circuit under test and/or to make measurements of test results such as for characterizing IOBs (and possibly other circuits).

In an embodiment, IOBs 115 comprises current drivers and receiver circuits. A corresponding soft wrapper 111 may control an I-OB 115. For example, a soft wrapper 111 may enable either a receiver or a driver at any particular moment.

The segmented analog bus architecture illustrated in FIG. 1 enables I/Os to be tested, even when there may be I/Os on a chip that are not SIS-enabled. This makes it possible to place I/Os with SIS on chips containing non-SIS I/Os. Further, while typically more analog buses would be needed in a single chain architecture to accommodate multiple I/O voltage domains, merely two analog bus lines and four switches in the SIS integrated wrapper are required, regardless of the number of I/O voltage domains. Segmented architecture allows limiting the analog bus length and loading by splitting long chains into smaller chains. This reduces the amount of space required on the chip for the analog buses, and further enables controlled trade-off between the number of tester pin connections and the test time and accuracy. Further, each I/O segment may be tested in parallel, which improves the speed of testing.

The embedded features of SIS may include modification to I/O soft wrapper subsystems that control test features. Further, special techniques may result in a reduced number of clock cycles being needed to communicate test data with I/Os. This may significantly accelerate tests, sometimes in the range of one or two orders of magnitude relative to using IEEE-1149.1-conforming digital boundary modules. Further, intelligent re-use of soft wrapper registers may reduce the need for on-chip memories such as for saving intermediate test results. Also, the SIS embedded test feature set may be a key enabler in facilitating retained use of low-cost and/or legacy tester(s) thereby reducing test and/or repair costs.

External control of SIS and similar testing features may sometimes require relatively large tester vector memories. Embodiments of the invention may thus provide a series of techniques and methods to resolve or at least mitigate test time and/or tester memory requirements. Several advantages to purchasers and users of devices embodying the invention may be provided. The methods and systems described herein reduce costs associated with testing, enable accurate tests, including timing tests, and provide repair opportunities to improve yields. Accordingly, the methods and circuits described herein may have a superior price and/or performance over previously developed solutions. Moreover, it may be possible to realize devices having superior performance using fewer circuit components and/or less critical component tolerances thus improving reliability, yield and/or providing still further advantages.

Embodiments of the invention enable reduced pin-count testing. Using SIS, a SOC with hundreds or thousands of I/Os may be tested by a tester that supports only a few tens of pins. This allows testing high pin count chips on older testers that support small number of pins. Further, the reduced pin count testing may allow testing more than one chip on a tester simultaneously. This may further reduce the test cost and/or time.

Further, according to an embodiment of the invention, cell libraries and compilers for self-test and repair of one or more I/Os are added.

Figure 2:
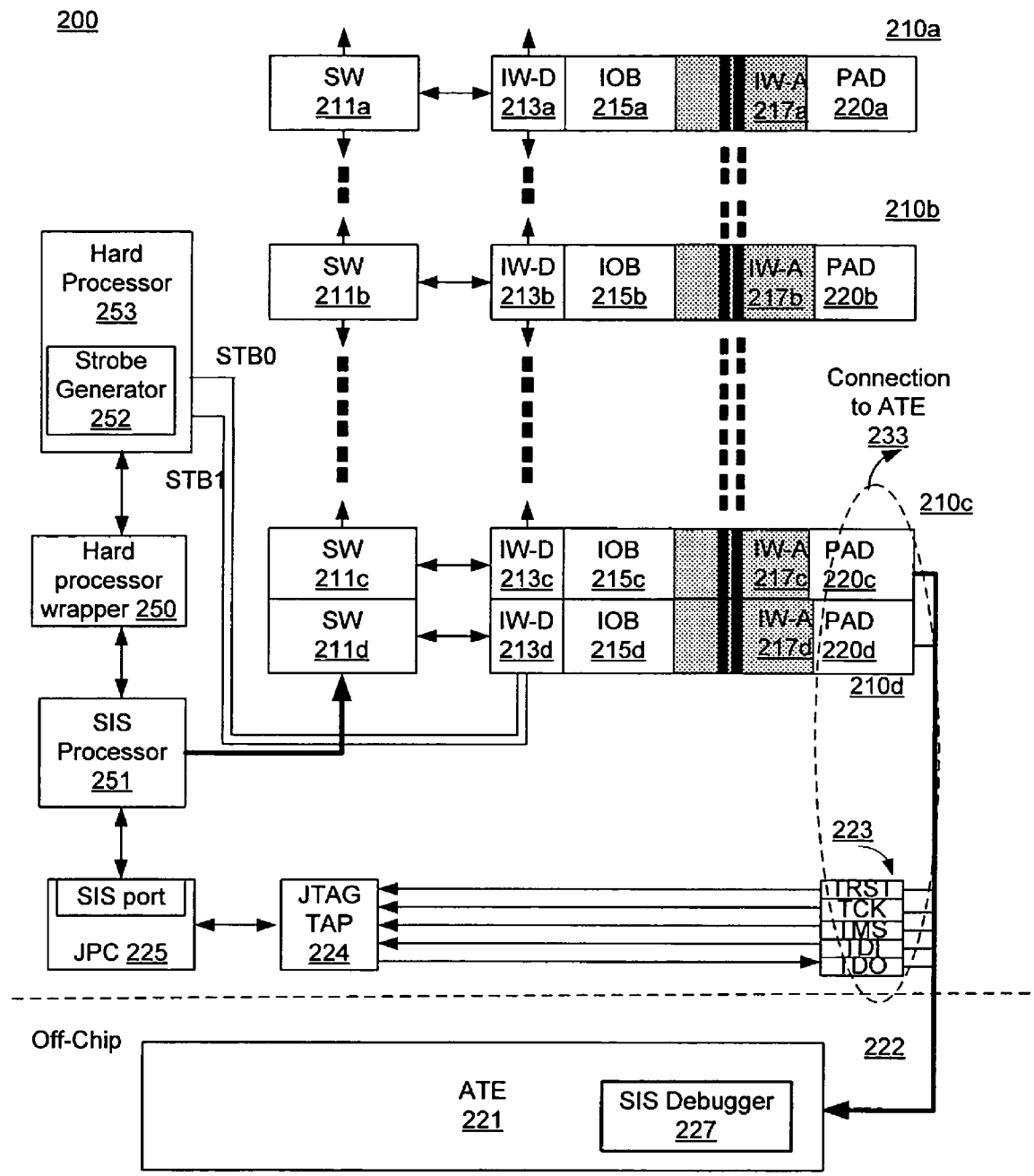
FIG. 2 illustrates a block diagram of an embodiment of a representation of a Self-Test and Repair I/O System ("SIS") architecture that is used to support I/O segments.

FIG. 2 illustrates an embodiment of SIS architecture 200 that is used to support I/O segments. FIG. 2 illustrates one I/O segment and other on-chip and off-chip components. The SIS 200 includes multiple on-chip and off-chip infrastructure IP components to perform different I/O related test and diagnostic components. The SIS on-chip components include multiple I/O segments (note only one segment is shown in FIG. 2), the I/O segment including multiple testable I/Os that are segmented together. For purposes of illustration, four testable I/Os 210a, 210b, 210c, and 210d are shown in FIG. 2. As discussed in reference to FIG. 1, each testable I/O 210 further includes a soft wrapper 211, an integrated wrapper for delay digital test (IW-D) circuit 213, an I/O buffer (IOB) 215, and an integrated wrapper for analog test (IW-A) 217. The SIS on-chip components also include a hard processor 253, a hard processor wrapper 250, and a soft processor 251.

In the embodiment shown in FIG. 2, the on-chip SIS circuitry is connected to an external automated test instrument 221 via a connection path 222 and connector 233. The connector 233 may provide two analog connections to Bonding Pads 220 and a JTAG (IEEE-1194.1 compatible) block 223 supporting circuits TRST, TCK, TMS, TDI and TDO as defined in IEEE-1194.1 standard. A JTAG Test Access Port (TAP) state machine 224 may also be provided. The JTAG TAP 224 may provide boundary scan capabilities compatible with IEEE 1194.1, as well as other features.

A soft processor 251 is the main instruction processor, and may be delivered as a soft macro. Thus, the ATE 221 has external communication access to the soft processor 251, such as for control, status and data exchange purposes. The soft processor 251 may also generate the control signal(s) for various SIS components, including the hard processor wrapper 250 and I/O chain of soft wrappers (e.g., the chain including soft wrappers 211a, 211b, 211c, and 211d). The SIS processor 251 may control each and any of the soft wrappers 211 by impressing control signals on a boundary-scan control bus. The soft processor 251 may also generate test patterns for BIST operations, and receive and analyze test results for generating on-chip test signatures. The soft processor 251 connects via a JPC (JTAG Protocol Converter) 225 to communicate with the JTAG TAP 224 in order to exchange data with an off-chip tester 221. Thus, the soft processor 251 may direct the soft wrapper circuits 211a-221d as well as be a central instruction processor that controls all operations during testing, generates vector test patterns and analyzes results from the each I/O segment after the testing is applied. In the embodiment depicted, the hard processor 253 resides separately from the I/O subsystems and serves at least to support the control of the strobe generator 252. The hard processor wrapper 253 includes several registers that are addressed by the soft processor 251. These registers receive and/or generate data for the control of the hard processor 253. An embodiment of the hard processor 253 is discussed in greater detail below with reference to FIGS. 5A and 5B.

The soft wrappers 211 are directed and controlled by the action of the soft processor 251 to impress control signals on the extended boundary scan circuits. In turn, each soft wrapper 211 may control a respective IW-D 213, IOB 215 and IW-A 217. In one embodiment, the Pads 220 are bonding Pads that are connectable to external test signals PMU1, PMU2 that may be dedicated to testing purposes. In other embodiments, ordinary (i.e. full featured) I/Os may be used to connect to the pads 220 and the external connector 223, as shown in FIG. 2.

A primary off-chip SIS component is the debugger 227. The debugger 227 is a software module that resides on the ATE 221 and functions to generate/receive the data vectors, and synchronize the PMU with the vectors for exercising different tests through JTAG TAP 224. Another off-chip SIS component is a builder (not shown). The builder is a software component that inserts SIS components on the chip.

Figure 3:
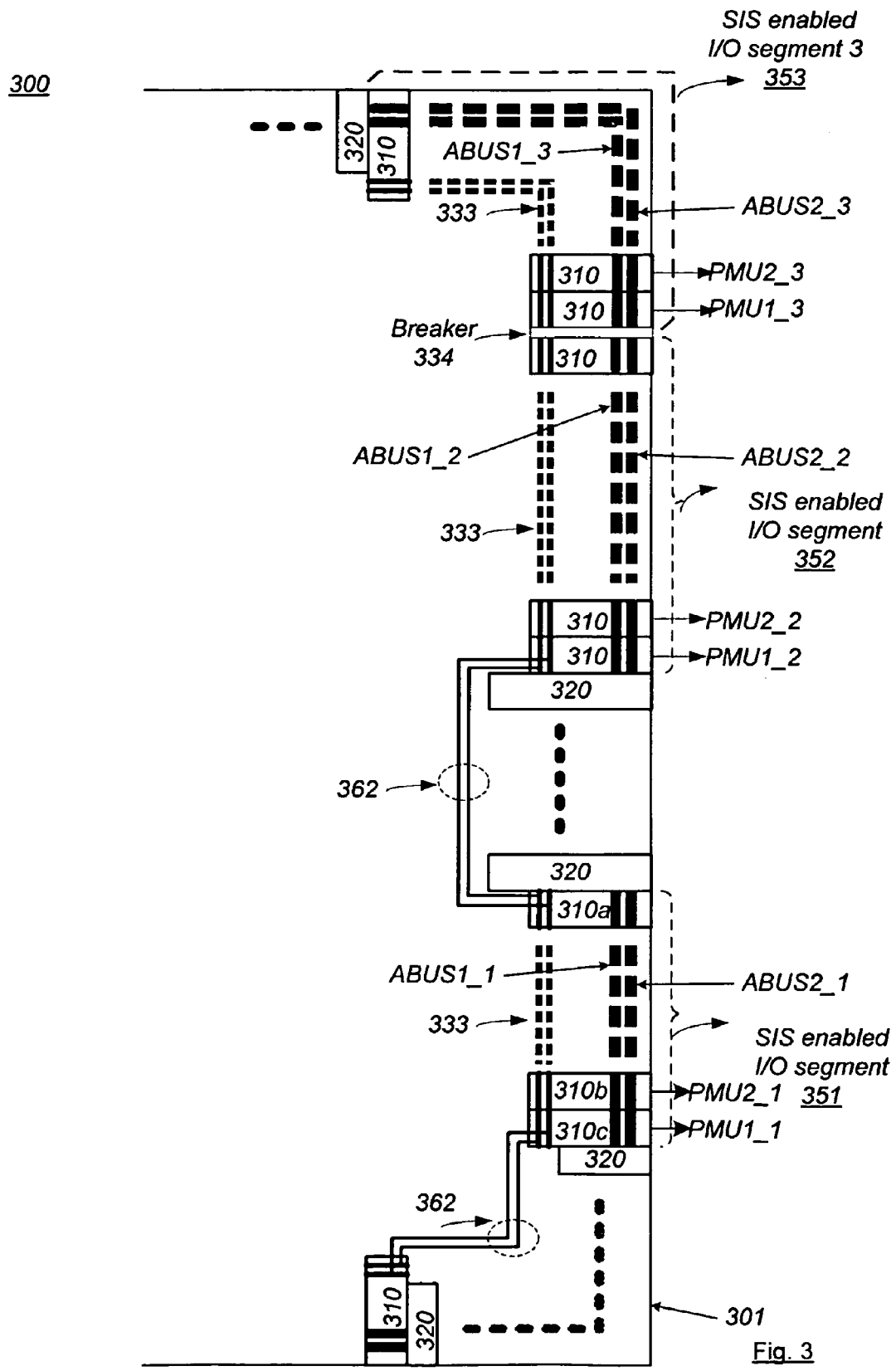
FIG. 3 illustrates a block diagram of an embodiment of a segmented I/O chain.

FIG. 3 illustrates the concept of I/O chain segmentation to allow test and repair features for SIS-enabled I/Os even if non SIS-enabled I/Os are present in between them. Accordingly, as shown in FIG. 3, I/Os are divided into segments of SIS-enabled I/Os that form a continuous chain. In each segment, any two I/Os may be connected to two external PMUs to provide analog access to all I/Os in that segment. The two I/Os used for test access are general purpose I/Os and need not be dedicated test pins for test purposes only.

In the embodiment depicted in FIG. 3, for purposes of illustration, three separate chain segments 351, 352, 353 are shown. Thus, the first I/O segment 351 is formed from a first continuous chain of I/Os. The second I/O segment 352 is formed from a second continuous chain of I/Os. The third I/O segment 353 is formed from a third continuous chain of I/Os. The SIS processor contains logic configured that may sequentially access the first I/O segment 351, then the second I/O segment 352, and then the third I/O segment 353 for analog testing, timing test and digital access. In an embodiment, the I/O chain may be non-continuous The SIS processor may also enable testing some I/O features in different segment in substantially parallel manner.

The I/O segment 351 includes SIS-conforming I/Os 310a, 310b, and 310c. The conforming I/Os 310a, 310b, 310c have digital interconnects and share analog buses ABUS1_1 and ABUS2_1. Multiple on-chip analog buses (ABUS 1, ABUS 2) are used to provide external access to the I/Os through two I/Os (e.g., 310b and 310c within segment 351) within the segment. The pecked lines 333 represent an indeterminate number of other (conforming) I/O subsystems with digital interconnects and analog buses ABUS1, ABUS2. The die 301 also includes non-conforming I/Os 320 that does not share the analog buses ABUS1, ABUS2, and may also not include other features that render them non-conforming. In SIS enabled I/O segment 351, the analog buses are ABUS 1_1 and ABUS 2_1, and the PMUs are PMU1_1 and PMU 2_1. In SIS enabled I/O segment 352, the analog buses are ABUS 1_2 and ABUS 2_2, and the PMUs are PMU1_2 and PMU 2_2. In SIS enabled I/O segment 353, the analog buses are ABUS 1_3 and ABUS 2_3, and the PMUs are PMU1_3 and PMU 2_3.

An analog bus provides electrical access to the I/O Pads. An IC may contain several I/O analog access buses, each corresponding to an I/O segment. As depicted in FIG. 3, for each I/O segment 351, 352, 353, it may be necessary to have a number of off-die connection pairs PMU1, PMU2. For instance, the analog buses ABUS1_1, ABUS2_1 are used to provide external access to the I/Os 310a, 310b, 310c of segment 351 through two I/Os (310b, 310c) within the segment 351. Accordingly, two PMUs (PMU1 and PMU2) access each bus through to selected I/O pins in each segment. In an embodiment, two or more I/Os but less than all of the I/Os in a segment may directly connect to the external tester to allow access to test all of the I/Os in that segment.

The I/O segments 351, 352, 353 may not be fully connected with one another. Although the analog bus conductors ABUS1_1/ABUS2_1 and ABUS1_2/ABUS2_2, and ABUS1_3/ABUS2_3 may, in some embodiments, usefully be routed to all the segments 351, 352, 353, in general they may be mutually isolated, for many (but not necessarily all) test signals. The ABUS1 and ABUS2 conductors may be connected in the I/O row or column through abutment within a segment. As discussed, between two segments, there is no connection between the ABUS1 and ABUS2 conductors.

Also, although segments may be divided by the placement of non-conforming I/O subsystems or other modules on the die periphery, it may also be desirable in some circumstances to introduce a segment breaker 314 between adjacent I/O subsystems 310 that do implement chaining for test purposes. Accordingly, some segments may be separated with a breaker cell to separate two I/O voltage domains. Other reasons for splitting one I/O segment into two or more segments, e.g., using a breaker, include avoiding long buses, reducing load, increasing test speed, and so on.

The strobe bus conductors 362 conduct strobe signals (e.g., for conducting a delay test) may, in some embodiment, be mutually isolated from one segment to others, in general they are routed to all segments. In one embodiment, the strobe signals are connected by abutment in one segment. Between two segments with a breaker I/O circuit (e.g., segments 352 and 353), the strobe bus conductors 362 may be connected using short routings between the two closets I/Os in the nearest domains. Between two segments with no breaker (e.g., segments 351 and 352), the strobe bus conductors 362 may be connected with abutment to the breaker cell that includes bus routings. The strobe bus conductors typically require less area to implement than clock tree architecture.

Figure 4A:
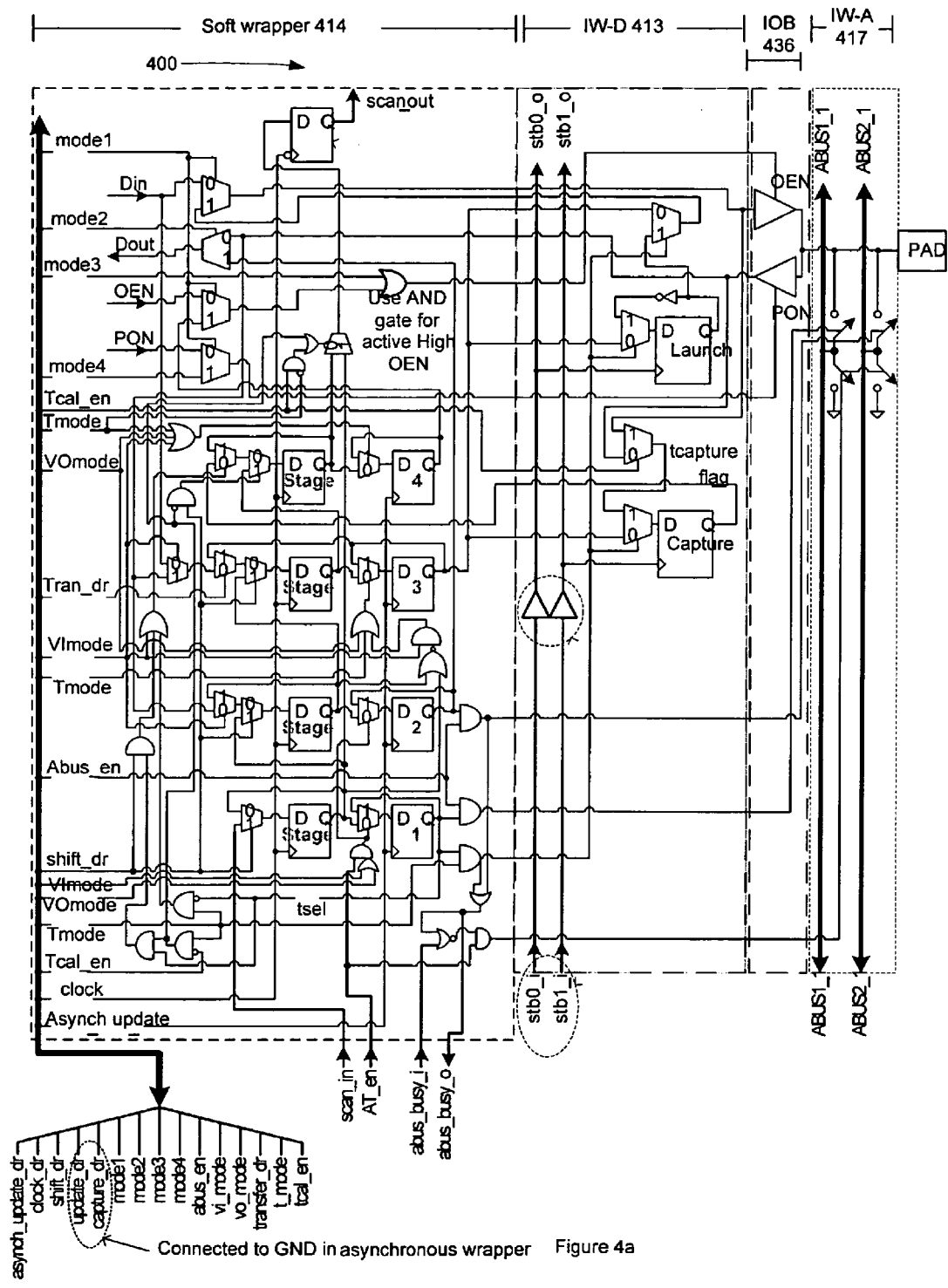
FIG. 4a illustrates a component level schematic diagram of an embodiment of an embedded logic enabled bi-directional I/O with wrappers for signal control and analog and delay test.

FIG. 4a illustrates a component level schematic diagram of an embodiment of an embedded logic enabled bi-directional I/O with wrappers for signal control and analog and delay test. The bi-directional wrappers in 400 include three major sub-modules: the soft wrapper circuit 411, an IW-D circuit 413, and an IW-A circuit 417. The soft wrapper 411 includes registers and combinational logic. The combinational logic may be made up of Boolean logic gates such as AND gates, OR gates, Inverters, Multiplexers, etc. The integrated wrapper for delay 413 includes buffers, registers, strobe busses, and combinational logic. The IW-A circuit 417 includes analog test busses and switches that receive signals from the combinational logic. The I/O circuit 400 also includes the I/O Buffer module 436 with an output driver amplifier and an input receiver buffer. The I/O output Driver may have a signal applied to its input terminal from three separate sources: the IP core associated with that I/O may send a signal to the I/O driver for that core; the soft wrapper 411 may apply known test vector values to the input of the I/O driver; or strobe signals from the wrapper for delay tests 413 may be applied to the input of the I/O driver. The soft wrapper 411, the integrated wrapper for delay 413, and the analog wrapper 417 are the circuitry dedicated to each I/O circuit 400 for test and debug operations. The wrappers are designed specifically for each I/O type and support different measurements. The IW-D wrapper 413 and IW-A wrapper 417 are separate, but co-exist and may be supported by the soft wrapper 411 simultaneously.

Figure 4B:
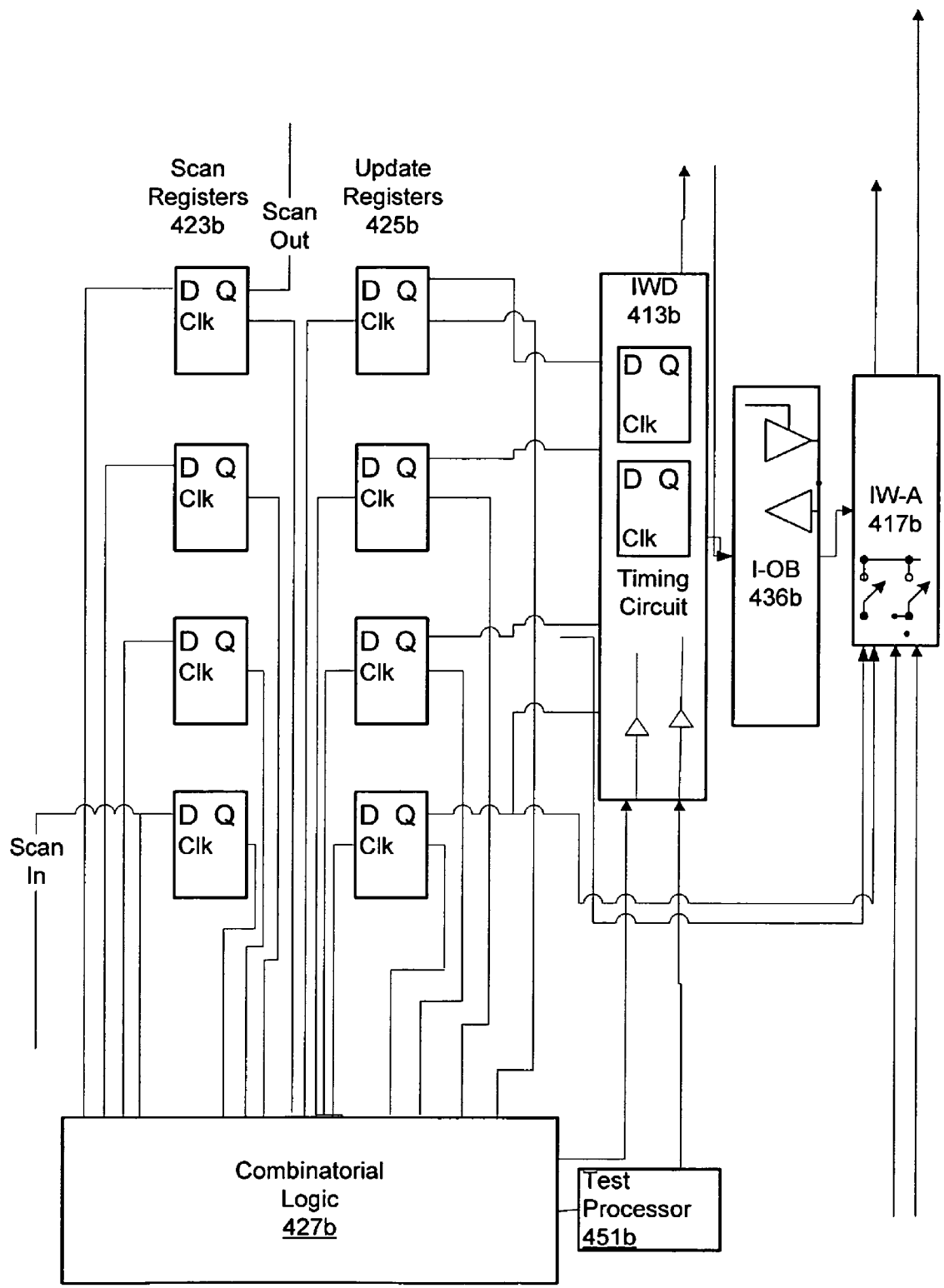

FIG. 4b illustrates an embodiment of the I/O circuit similar to FIG. 4a but at a level of abstraction above the component level of detail in FIG. 4a.

The I/O buffer 436b has both the output driver circuit coupled to an input-output port and the input receiver circuit coupled to an input-output port. The wrapper circuits may include the analog wrapper circuit (IW-A) 417b, the integrated wrapper for delay test circuit (IW-D) 413b, and the soft wrapper circuit 411b operable to control the IW-A 417b and the IW-D 413b. The instruction processor controls the wrapper circuits. The soft wrapper 411b has two or more scan registers 423b, where the data value stored in each scan register can be shifted out for analysis and/or shifted in testing or storage. The soft wrapper 411b has two or more update registers 425b to transfer stored data values between itself and an associated scan register. The soft wrapper 411b has a set of combinatorial logic 427b coupled to the scan registers 423b, the update registers 425b, and the instruction test processor 451b. The soft wrapper 411b has these scan and update registers 423b, 425b coupled with the combinational logic 427b to enable hold, scan, capture, and transfer states in order to re-use these registers as a temporary memory element when possible. The combinational logic 427b and the scan and update registers 423b, 425b in the stages in the boundary module in I/O soft wrappers are re-used in the various timing and functional tests to allocate memory in the soft wrappers and the test processor for different tasks. This leads to reduced test time and tester vector and capture memory.

Each scan register in each stage may be formed by the flip-flops. During shift operations, the content of each scan register can be shifted out to the test processor 451b or external tester for analysis, while simultaneously shifting in new content. Each scan register may use its associated combinational logic 427b to have capture capabilities, or hold capabilities, as required by different embedded instructions.

Each update register in each stage may also be formed by the flip-flops. Each update register may use its associated combinational logic 427b to have update capabilities to transfer stored logic values between itself and an associated scan register in that stage, or hold stored logic values independent of an input applied to the update register.

The instruction test processor 451b has a mode register to set various modes to control the operation of the scan registers 423b and update registers 425b to support maintaining the current stored data value until the hold mode operation is disabled, scan in and out data values stored in the two or more scan registers, and overwrite stored data values in a selected scan register associated with individual I/Os during a global capture operation by sending control signals to the combinational logic.

The set of combinatorial logic 427b further includes logic operable to connect each individual input-output circuit 400 to an analog bus via one or more switches in the IWA 417b in order to perform individual I/O leakage current tests as well as bus leakage current tests, and further operable to isolate each individual input-output port from the analog bus via the one or more switches. The current leakage tests help identify faults in the ESD circuits in an I/O under test.

The set of combinatorial logic 427b further individual logic operable to place update registers and scan registers in the soft wrapper circuit 411b in a hold mode to store data unchanged on a individual basis rather than on a all of the registers global basis. The hold mode on an individual basis is based on the sequence of the known test vector value applied to a stage of the soft wrapper circuit 411b or based on receiving a particular test mode enable signal such as a VO mode signal from the test processor 451b rather than in response to a global hold control signal, such as an update_dr signal.

Thus, the combinatorial logic 427b responds to control signals from the test processor 451b that include a hold mode signal to individually hold data in one or more pre-selected scan registers or one or more pre-selected update registers or both in each wrapper circuit tied to its corresponding I/O, where the data is held unchanged independent of an input applied to the one or more pre-selected update registers and scan registers. This allows the registers to act as temporary local storage independent of other test operations occurring. The combinatorial logic 427b also responds to control signals from the test processor 451b that include a transfer mode signal to transfer data between each scan register and its corresponding update register. The combinatorial logic 427b also responds to control signals from the test processor 451b that include a scan mode signal to transfer data between stages within the input-output circuits and between the input-output circuits themselves.

Referring to FIG. 4a, at the soft wrapper 411, control data comes via a pin and goes through multiple scan stages that capture and shift the control and test signals. For example, four stages exist in this example soft wrapper 111. As discussed, the soft wrapper 411 can supply signals to either the IW-A circuit 417, or the IW-D circuit 413, or to both the IW-A circuit 417 and IW-D circuit 413. Accordingly, the IW-A or IW-D may be eliminated in a design that does not need analog or delay test features, respectively. This may reduce area overhead.

The soft wrapper 411 uses the flip-flop based scan and update registers as well as some MUXes from the combinational logic for temporary test data storage. Accordingly, test data at each stage does not need to be shifted out of the soft wrapper immediately. Rather, test data at each stage may be stored in the temporary data storage in the soft wrapper 411 itself, and be sequentially accessed at a later time.

As discussed, the soft wrapper 411 supports hold operations on its example number of four scan registers and four update registers. Selective activation of hold state of the registers in different modes of operation provides ability to implement multiple "partial update", "partial capture", and "partial shift" operations. These additional operations can be used by different SIS instructions to reduce test time.

Also, the combinational logic enable/disables at least one or more scan registers 423b in the soft wrapper 411b of that I/O to hold its stored logic value in response to a global capture operation and merely change its stored logic value in response to scan operations. Thus, the selected scan register retains its logic data value to act as a temporary local storage location in response to a hold control signal generated from the embedded test processor 451b.

In an embodiment, the structure of the soft wrapper 411 is similar to the IEEE1149.1 wrapper, except some of the registers have associated combinational logic to support hold and transfer mode as well as capture and scan operations. Specifically, all scan and update registers except the update registers in stage1 and stage2 support hold mode. The hold modes allow saving the test data in the soft wrapper 411 and shifting it to the next soft wrapper chain without risking being overwritten by captured data. Also, note some multiplexers are used to store data. Thus, in an embodiment, the combinational logic further includes a multiplexer in the fourth stage to store captured flag values (i.e. timing results) from the output of the capture flip flop register associated with that I/O and in hold mode to prevent its stored logic value from being overwritten in a global capture operation. The stage3 scan and update registers support an update-to-scan transfer operation. Also, the registers with the combinational logic support partial update on an individual I/O basis rather than a global update of all of the I/Os in a segment of I/Os. The registers with the combinational logic support partial capture on an individual I/O basis rather than all of the I/Os in a segment of I/Os. The registers with the combinational logic support partial shift of known test vectors serially shifting in a number of test vectors that number less than the total number of test vectors to globally shift test vectors to all the I/Os in a segment of I/O are supported to allow update, capture, or shift of desired signals/bits while holding other important data.

In a partial shift of known test vectors, a multiplexer in the fourth stage allows a scanned out vector value from that I/O to come from either the vector value stored in the scan chain register of the fourth stage (normal ops) or the vector value stored in the scan chain register of the first stage (delay testing mode to allow a partial shift of vector values from one group of I/Os under test to the next set of I/O that is going to be tested). Therefore, in the delay testing mode, two clock cycles can move the known test vector from the initial scan register in a first group of I/Os to the initial scan register in a second group of I/Os to reduce the number clock cycles such as 4 in this case, needed to advance that known vector sequentially all the way through the tested I/O group to the initial scan register in the second group of I/Os to be tested.

The soft wrapper 411 exchanges data with the test processor (451b) for functional tests, delay tests, DC parametric measurements, and IEEE11494.1 standard compliance. The soft wrapper 411 provides a boundary scan mechanism for exchanging test data with each I/O because of its modularity and reduced routing congestion features. The soft wrapper 411 is designed to comply with IEEE 1149.1 standard for enabling users to perform board level tests. The soft wrapper 411 supports all mandatory and optional instructions of IEEE1149.1 standard.

For functional tests, the soft wrapper 411 applies 0 or 1 to the I/O and captures the I/O input receiver logic to check whether I/O can transfer the logic correctly. The combinational logic enables hold mode with update registers to temporarily store whether voltage logic was sensed or not during a voltage test. Plus, the embedded instruction for input voltage test call for a transfer back of the stored data to the scan stage registers after all of the I/Os in all of the I/O subsets are tested for a full shift scan of the scan registers to read the test results by the tester.

For delay tests, the soft wrapper 411 transfers initialization data to and captures the timing test flag from the timing test circuit in the IW-D 413. Examining the tcapture_flag indicates whether the I/O delay is more or less than a programmed delay specified by the strobe generator circuit. The combinational logic enables hold mode in scan stage registers to temporarily store the threshold timing flag value of pass or fail until all of the I/Os in all of the I/O subsets are tested during a threshold timing test. Also, the combinational logic enables hold mode in scan stage registers not under test to temporarily store sweep timing data results from a first I/Os under timing testing that compares a difference between a launch signal and a capture signal for that I/O undergoing the timing test, where the data is shifted into the scan stage registers not under test by scan stage registers under test for that I/O. For DC parametric measurements, which involve the use of analog buses in IW-A for low frequency voltage and current test, the soft wrapper 411 controls the output buffer data, enable control input, and the analog switches in the IW-A to perform different measurements. The soft wrapper also captures the I/O receiver output. For IEEE11494.1 standard compliance, three scan/update stages support all ten mandatory and optional public instructions of IEEE1149.1 standard for bi-directional I/O. These instructions are: BYPASS, SAMPLE, PRELOAD, EXTEST, INTEST, RUN-BIST, CLAMP, IDCODE, USERCODE, and HIGHZ.

Figure 4C:
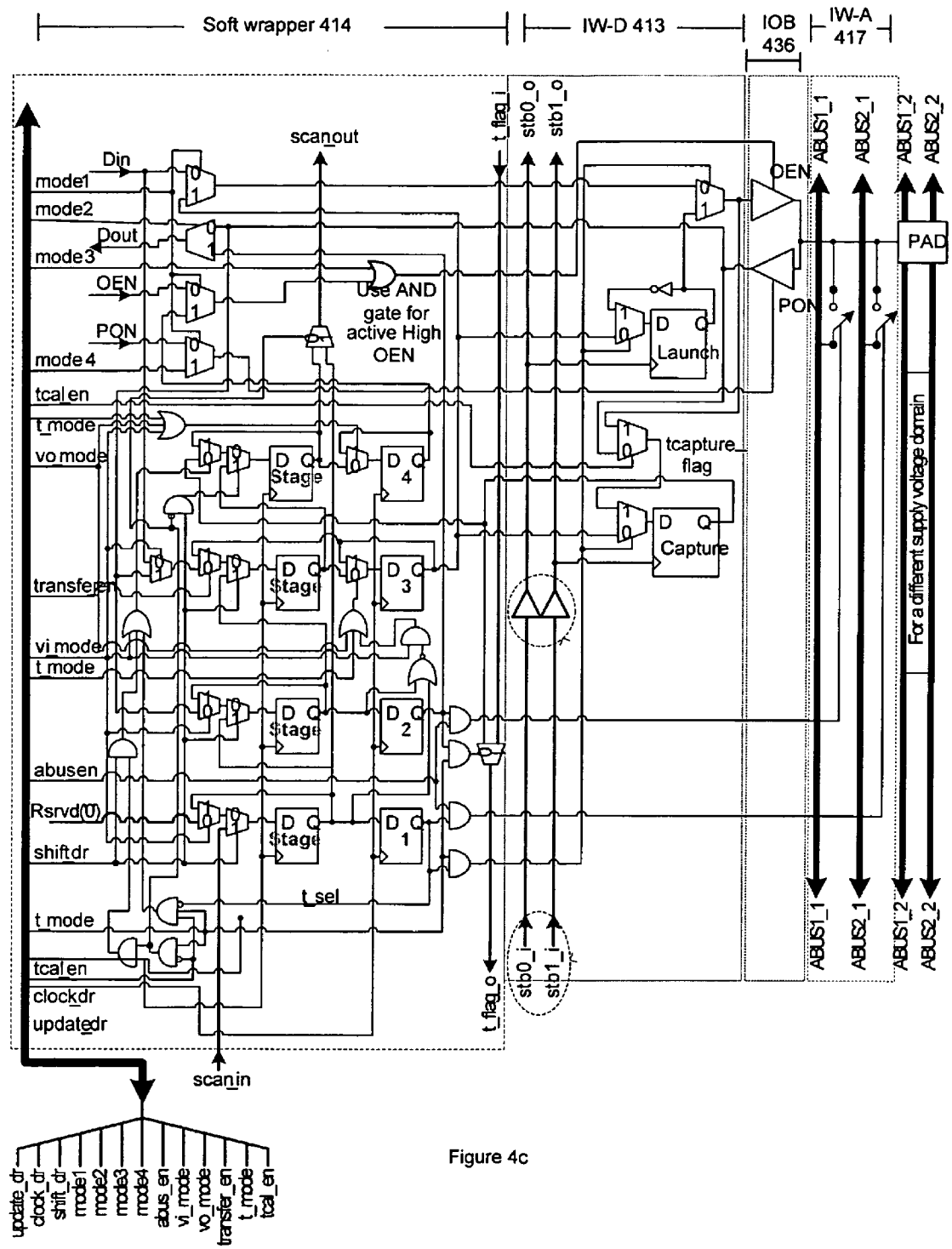
FIG. 4c illustrates a component level schematic diagram of another embodiment of an embedded logic enabled bi-directional I/O with wrappers for signal control and analog and delay test.

FIG. 4c illustrates a component level schematic diagram of another embodiment of an embedded logic enabled bi-directional I/O with wrappers for signal control and analog and delay test.

The combinational logic and registers shown in FIGS. 4a-c are provided for demonstration of special features that enable unique test and repair features and are not meant to restrict the designer to design the circuit schematically. The actual design and associated optimizations may be varied from.

Figure 5A:
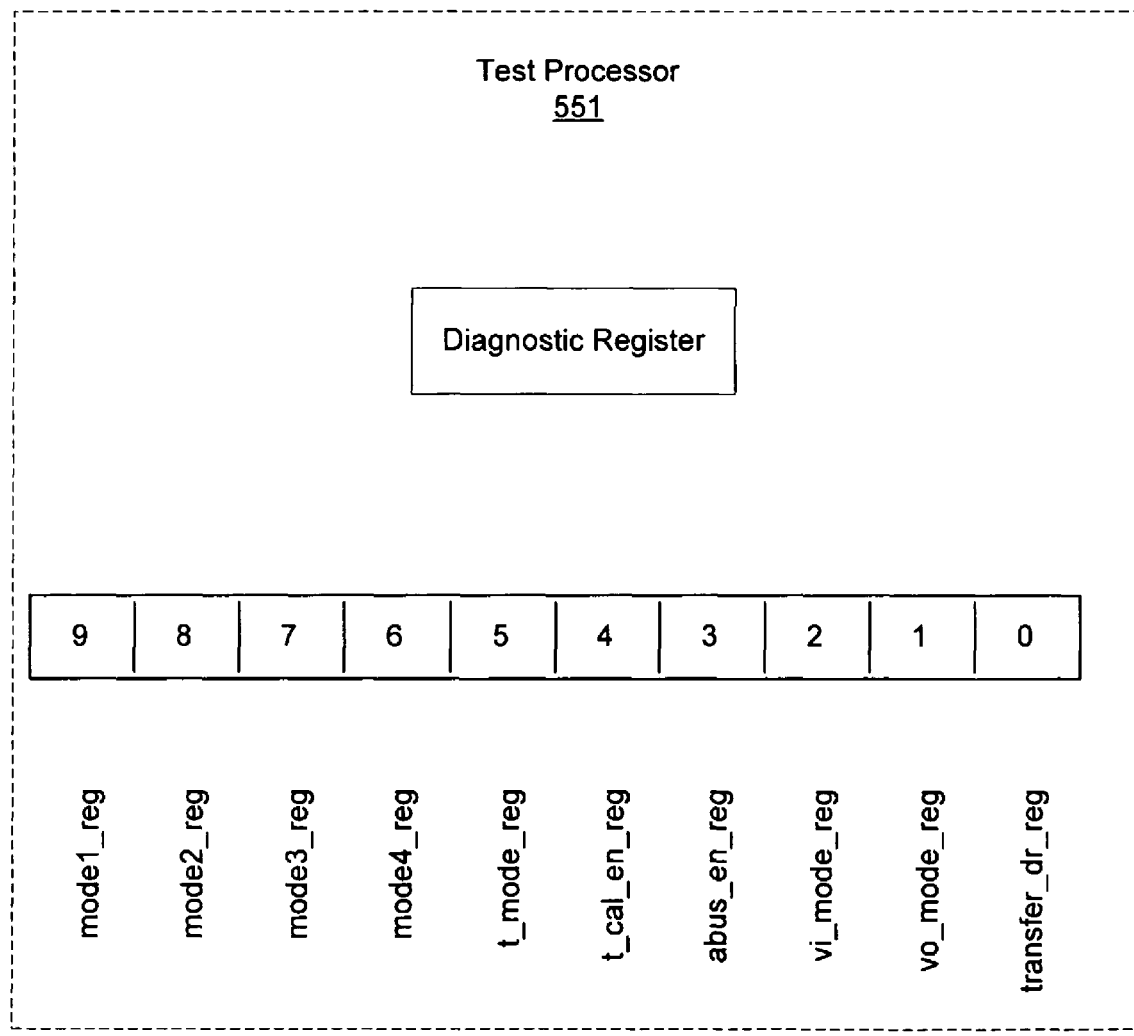
FIG. 5A illustrates a block diagram of an embodiment of a test processor having a mode register to set various modes to control the operation of the scan registers and the update registers in the soft wrapper circuit by sending control signal to the combinational logic, as well as the operation of the integrated wrapper for delay test and the wrapper for analog tests.

FIG. 5A illustrates a block diagram of an embodiment of a test processor having a mode register to set various modes to control the operation of the scan registers and update registers in the soft wrapper, as well as the operation of the integrated wrapper for delay test and the wrapper for analog tests.

The test processor 551 includes a mode register, for example, a 10-bit MODE register, which controls different functions and modes of the chain of soft wrappers. A brief definition for each example bit that enable the executable instructions are as follows.

The mode1_reg bit controls the soft wrapper mode1 signal to the combinational logic coupled to the registers and the I/O driver amplifier during test operations. When active, the value on the I/O driver output PAD is supplied from the soft wrapper or the IW-D rather than the from the associated core pin. When de-asserted, the logic value on the output PAD comes from the associated core pin (Din). The output enable is controlled from the core (if mode3 is 0). When asserted, the value on the output PAD comes supplied from the soft wrapper or the IW-D controlled by the IOSW stage1 signal. This signal controls EXTEST mode in IEEE1149.1 mode of operation.

The mode2_reg bit controls the soft wrapper mode2 signal to the combinational logic coupled to the registers and the I/O receiver amplifier during test operations. When active, the input to the core is supplied by the known test vector value from the soft wrapper in stage 3 or IW-D rather than the receiver buffer of the I/O. When de-asserted, the input to the core Dout2 comes from the PAD. This signal controls INTEST mode in IEEE1149.1 mode of operation.

The mode3_reg bit controls a global I/O output disable signal to the combinational logic coupled to the registers and the I/O driver buffer for all of the I/Os in a given segment of I/Os under test. If activated, when mode1=1, the signal disables all I/O output drivers in that segment of I/Os under test. The I/Os under test will have high output impedance or pull-up or pull-down as applicable. The global I/O output disable signal when low (mode 3=0) allows each individual I/O's output driver to be enabled or disabled depending on the value of the test vector supplied to stage4 of the soft wrapper.

The mode4_reg bit controls a global PON signal to the combinational logic coupled to the registers and the I/O receiver amplifier during test operations. When mode1=1, this signal controls the receiver mode. Note: Where applicable in some cell libraries, PON=1 puts any receiver in its default native mode, while PON=0 places them in CMOS or TTL mode. The PON mode control signal when active, puts all I/O input receivers to operate in their native mode. When deactivated, all I/Os will operate in CMOS compatible mode.

The t_mode_reg bit enables the delay test mode to send control signals to the combinational logic coupled to the registers to place various scan registers and update registers in hold mode. This instruction selects the I/O buffers in the timing measurement path for the selected I/O in a group and compares the I/O path delay against the computed calibrated threshold values for a pass-fail test.

The t_cal_en_reg bit enables the delay test calibration mode to send control signals to the combinational logic coupled to the registers as well as the launch and capture flip flops to establish the delay test path from the launch and capture strobe buses through the launch flip flop to the capture flip flop but exclude the I/O buffers themselves. Thus, bypass the I/O buffers in the timing measurement path for the selected I/Os and measure the delay offset for each selected I/O.

The abus_en_reg bit enables the analog bus global enable mode to send control signals to the combinational logic coupled to the analog bus switches used for at least the DC tests. The analog bus enable signal, when inactive, disconnects the analog buses from the I/O circuit. The analog bus enable bit, when active, allows each individual I/O's output driver to couple to the analog test bus depending on the value of the test vector supplied to stage1 or stage2 of the soft wrapper.

The vi_mode_reg bit activates the embedded input voltage threshold test (VIL/VIH tests) mode by sending control signals to the combinational logic coupled to the registers. When active, the soft wrapper is configured for embedded input voltage test operation to cause selected scan and update registers to enter into hold mode.

The vo_mode_reg bit activates the embedded output voltage test (VOL/VOH tests) mode by sending control signals to the combinational logic coupled to the registers. When active, the registers and combinational logic in the soft wrapper are configured for embedded output voltage test operation to cause selected scan and update registers to enter into hold mode.

The transfer_dr_reg bit activates the transfer mode by sending control signals to the combinational logic coupled to the registers. When active, this signal enables transfer of some update register data values to the scan registers in the soft wrapper when performing a capture operation.

The t_cal signal selects individual I/Os to be part of a group of I/O to undergo initialization or delay path calibration value determination on a group basis. Test each I/O delay pass/fail on an individual basis but initialize and determine calibration delay values on a group I/O basis.

Thus, the test processor 551 controls all test and repair embedded functions also includes features for generation and analysis of test patterns, as well as, a mechanism to improve accuracy through calibrations. These embedded features are key enablers of test and repair. As discussed above, the test processor 551 executes different embedded instruction to control the mode of operation of soft wrapper for each of the different embedded instructions.

The diagnostic register bank may temporarily store/hold the logic diagnosis related information. This allows storing significant amount of diagnosis information on the chip without adding additional large registers in the test processor or in the external tester. When diagnosis is enabled, this diagnostic register bank can be selected by the test processor and shifted out to the external tester for further processing. This diagnostic register bank is used in most cases to save pass/fail information for each I/O. However, it could also be used to store other types of diagnosis information. If necessary, more registers and thus more bits can be used to store test results until requested in a shift operation by the test processor. In an embodiment, the diagnostic register bank in the test processor on the chip stores delay test results from incremental delay sweeps sized to store results for a group of I/Os of at least two but less than all of a number of testable I/O on the chip tested in parallel.

In an embodiment, the mode register may have the following settings to cause the wrapper circuits to adhere to the modes below in response to the logic values supplied to the mode registers.

Soft Wrapper Mode Settings Table

| OEN | Output enable |
| OUT | Output date (to the I/O driver) |
| IN | Input data (to the chip core) |
| NA | Not used |
| IN capture | The I/O receiver data captured |
| Initial date | The value that initialized the IWD flip-flops |
| ABUS1 control | Controls the connection of I/O pad to the ABUS1 |
| ABUS2 control | Controls the connection of I/O pad to the ABUS2 |
| Ttest Select | Controls whether this I/O is part of a group of a I/O tested in parallel during timing calibration |

| Operation | Mode register | Stage4 | Stage3 | Stage2 | Stage1 |
|---|---|---|---|---|---|
| JTAG EXTEST | 1001 0000 00 | OEN | OUT | IN | NA |
| JTAG INTEST | 01XX 0000 00 | OEN | OUT | IN | NA |
| VO Test | 1001 0010 10 | OEN | OUT | ABUS2 control | ABUS1 control |
| VI Test | 1011 0011 00 | OEN | IN capture | ABUS2 control | ABUS1 control |
| VI Test - Transfer | 1011 0011 01 | OEN | IN capture | ANUS2 control | ABUS1 control |
| Ileak Test | 1011 0010 10 | OEN | OUT | ABUS2 control | ABUS1 control |
| Timing Test - IWD initialization | 1000 0000 00 | OEN | Initial data | NA | Ttest Select |
| Timing Test - Calibration | 1000 11 0000 | OEN | Initial data | NA | Ttest Select |
| Timing Test - Test | 1001 1000 00 | OEN | Initial data | NA | Ttest Select |

Figure 5B:
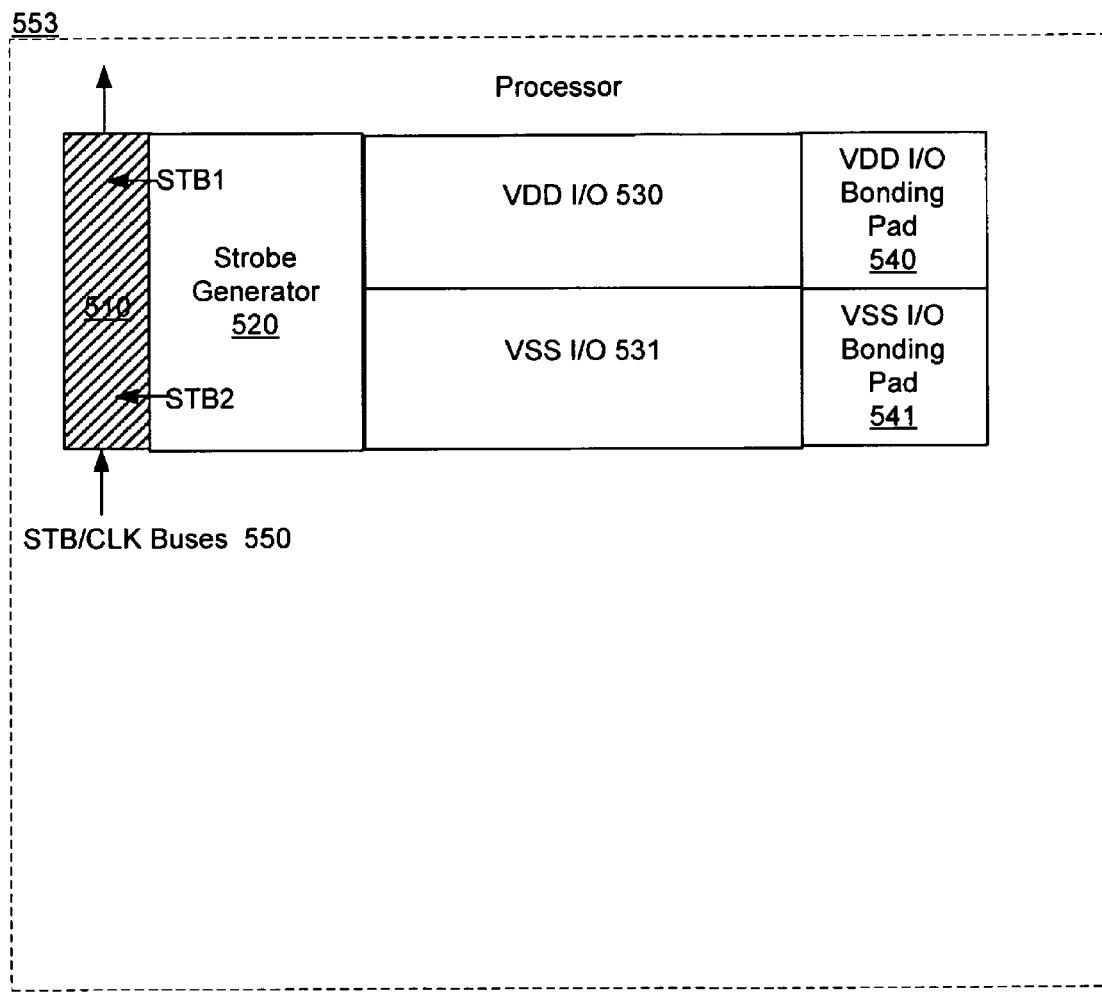
FIG. 5B illustrates a block diagram of an embodiment of a hard processor having a strobe generation circuit.

FIG. 5B illustrates a block diagram of an embodiment of a hard processor having a strobe generation circuit.

The hard processor 553 includes a strobe generation circuit 520. The strobe generation circuit 520 includes circuitry to generate strobe signals with precisely controlled delay between their transitions.

In one embodiment, the strobe generation circuit 520 includes two or more delay-locked loops (DLLs) supplied with the same clock, but having the number of taps that are prime relative to each other, e.g., N and (N+1). This circuit 520 can also generate clock with programmable phase delay between them, which may be used for jitter measurement, if needed. The strobe signals are used for I/O buffer delay tests and measurement. The hard processor 553 may further include strobe distribution buses 550. Thus, the strobe generation circuit is operable to provide a set of timing signals to each IW-D of each I/O. The instruction processor directs the strobe generation circuit. The timing signals control the delay test sequence.

In one embodiment, the hard processor 553 includes two analog I/Os—VDD I/O 530 and VSS I/O 531. These I/Os are used to supply clean power supply to the strobe generation circuit 520. This helps to reduce noise in the strobe delays. These I/Os may have the same footprint as other I/Os in the library. These I/Os are added to each I/O library and have the same size as the rest of the I/Os in the library. Bonding Pads 540 and 541 are connected to the I/Os for access to a PMU, if needed. Other circuits may be added to the hard processor as other test needs arise from the additional I/O type added to the library.

In one embodiment, instead of using the analog I/Os—VDD I/O 530 and VSS I/O 531 to power up the rest of circuitry of the hard processor 553, the circuitry of the hard processor 553 may be connected directly to available on-chip power supplies.

Figure 5C:
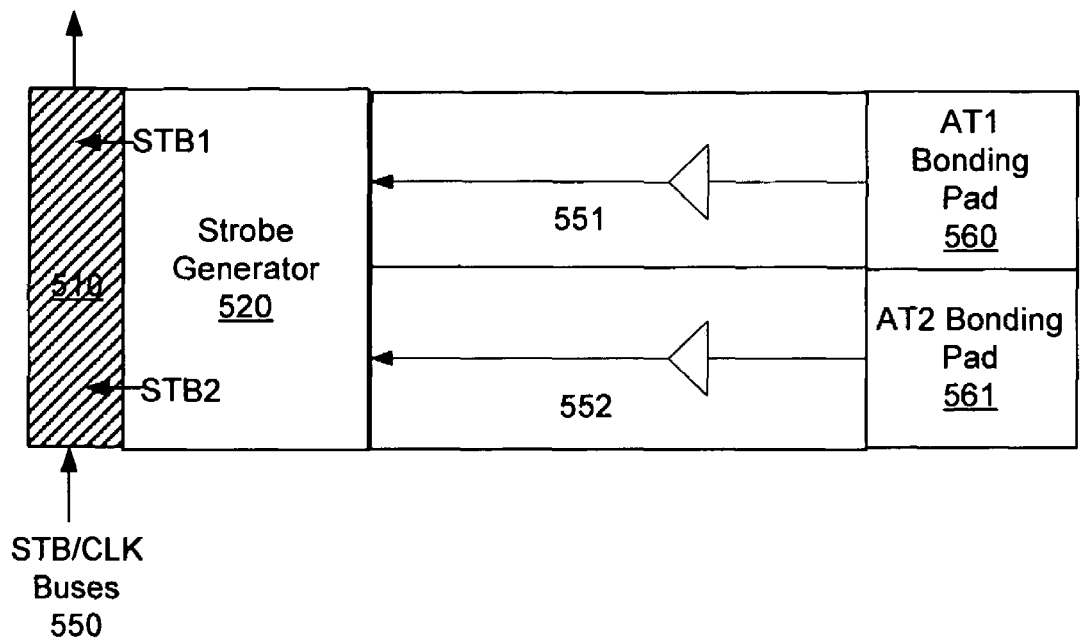
FIG. 5c illustrates an embodiment of hard processor that includes two receiver I/O buffers.

FIG. 5c illustrates an embodiment of hard processor 590 that includes two receiver I/O buffers 551 and 552. The buffers 551 and 552 are used for receiving reference clock, or external strobe/clock signals.

Figure 6:
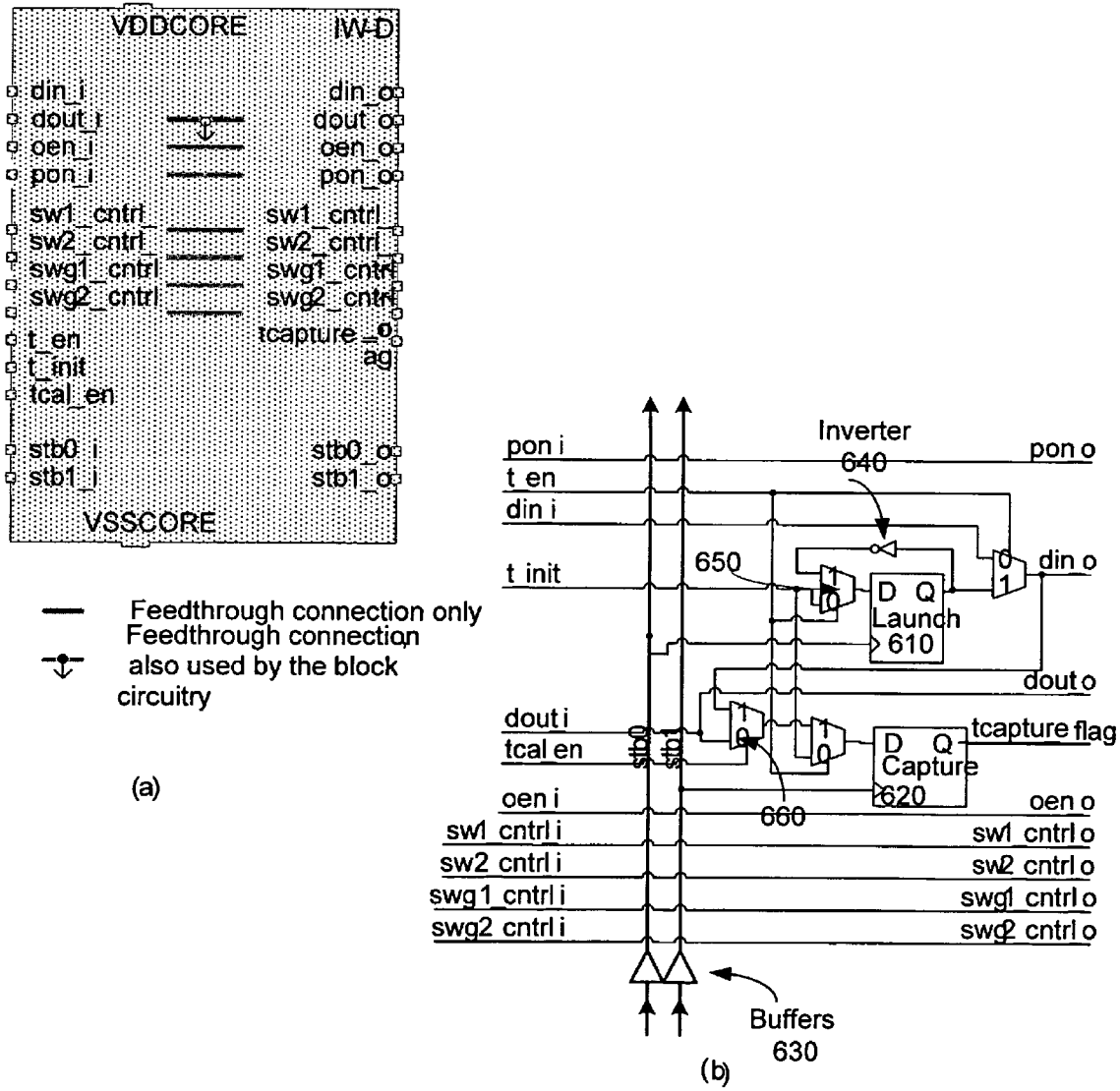
FIG. 6 illustrates a schematic diagram of an embodiment of an integrated wrapper for delay test.

FIG. 6 illustrates an embodiment of an IW-D 600. Every I/O may be augmented with an IW-D 600. The IW-D 600 performs delay and timing test using sequential delay test technique. Typically, a clock signal is generated using a clock tree, but this usually takes a lot of space to implement and is somewhat difficult to generate reliably. Instead, as shown in FIG. 6, strobes are routed as buses.

The IW-D uses a toggle mode under soft wrapper control to generate launch signals in response to a first strobe. The IW-D is also operable to launch and detect transitions for a delay test sequence for each I/O in an I/O segment. In order to create a transition at the output of the Launch DFF 610, the IW-D 600 uses an inverter 640 and MUX 650 feeding back the Launch register output to its input. The Launch register 610 is initialized by transferring a 0 or 1 to its input through the I/O soft wrapper and activating one or more rising edges on the stb0. Subsequently, select the input 1 of a feedback MUX 650 to turn the DFF 610 into a toggle flip-flop. Another rising edge is activated on the stb0 to generate a transition of the Launch register 610 output. This method provides the flexibility to launch a programmable transition pattern on the different I/Os, while requiring merely one I/O soft wrapper shift. Further, because the initialization data is written merely once, test time is saved. Also, it is easier and faster to initialize the IW-D registers and perform testing of rising and falling edges.

For calibration, the output of the Launch DFF 610 is sampled by the Capture DFF 620 through three MUXes. This allows estimation of delays through the MUXes and registers and also residual delay error between the two strobe signals. This estimate later is used to eliminate these errors and calibrate the measurements. After the generation of the launch signal, the IW-D then captures a voltage response after a time interval selected by an instruction processor from a plurality of selectable time intervals.

Further, to solve problems associated with buffer mismatch and accumulated delays, especially over a long chain of I/Os that need to be tested, according to an embodiment of the invention, the IW-D includes a calibration loop that uses a launch flip flop and a capture flip flop to test an I/O wrap path delay. Accordingly, a Launch register 610 in the IW-D 600 launches a transition at the rising edge of the strobe stb0. This transition travels through the I/O wrap path, which includes output buffer and input receiver. The Capture register 620 captures the launch signal after going through the wrap path on the rising edge of the strobe stb1. The strobe stb1 is delayed relative to the strobe stb0 by a known amount referred to as "strobe delay". The stb0_i and stb1_i signals are generated by the strobe generation circuitry (e.g. 520) in the hard processor (e.g. 400). The capture result indicates whether the wrap path delay is more or less than strobe delay. This method can be used to test the wrap path delay against a known threshold for production applications, or estimate the wrap path delay by repeating the test for different values of strobe delay, which typically swept with high resolution within a given range. For instance, an I/O delay time may be determined using the calibration loop that includes the launch flip-flop 610 and the capture flip-flop 620. The I/O wrap path also includes a first multiplexer and a second multiplexer to switch transition travels through a first path through a first I/O and through a second path that bypasses the first I/O. The I/O delay time can be determined for a first I/O is determined by subtracting out the time for the second path from the time for the first path.

The strobe buffers 630 should be very well matched because the difference of delays between these elements results in measurement error. In one embodiment, a small RC power supply filters for these buffers is used to prevent accumulation of power-supply induced jitter. Doing so may improve measurement accuracy without repeating measurements, which would otherwise be needed to reduce the jitter/noise effects.

FIGS. 7.1-7.22 illustrate an embodiment of a method to test an IC containing I/Os.

Delay Test Initialization

FIG. 7.1 and FIG. 7.2 refer to a method of initializing groups of input-output circuit for a delay test of each input-output circuit in the groups of input-output circuits.

This delay test initialization instruction initializes the "Launch" and "Capture" registers in the IW_D block of a selected group of two or more input-output circuits and establishes the groups of input-output circuits themselves.

The delay test initialization instruction initializes the "Launch" and "Capture" registers in the IW_D block of a selected group of input-output circuits rather than all of the input-output circuits on the chip at the same time.

Referring to FIG. 7.1, in step 740.1, the delay test initialization instruction also establishes the groups of input-output circuits themselves. The input-output circuit groups on the chip that have logic to support repair and testing may be formed as follows. Divide the number of input-output circuits on the chip that have logic to support repair and testing into a number of groups, where each group of input-output circuits contains the number of input-output circuits equal to size of a memory in the test processor on the chip to store delay test results from a first increment of delay sweep values for that group of input-output circuits. Note, the last group of input-output circuits established may have less input-output circuits than the rest of the formed groups if the number of total input-output circuits on the chip is not an integer multiple. For example, if the memory in the test processor supports storing the incremental delay sweep value results of 64 input-output circuits at a time and a total of a 1000 input-output circuits are to be tested, then the number of input-output circuit groups is N/M=(N=1000 input-output circuits/M=64)=16 rounding up to a whole integer. Thus, groups of I/O numbered 1-15 have 64 input-output circuits in each group, but the last one, group #16, has merely 40 input-output circuit members. Accordingly, this methodology allows initialization of input-output circuits to test individual input-output circuits or groups of input-output circuits rather than all of the input-output circuits on the chip at the same time. The launch and capture registers used with this methodology may be smaller in area and less complex because they do not require built in global reset and set signal logic capability.

In step 742.1, the mode register in the test processor is loaded for the delay test initialization by shifting in the proper initial value. For example, set the mode register to 0001 0000 00. The t_mode and tcal_en signals should be inactive during initialization to allow the scan and update registers to function normally without being placed in a hold mode. This delay test initialization instruction initializes the "Launch" and "Capture" registers in the IW-D block of a group of input-output circuits prior to the performing calibration procedure and the input-output circuit delay test.

In step 744.1, a full shift-in operation of the initialization pattern with known logic values into the input-output circuit soft wrapper scan registers is performed to supply the desired initialization values stored in the launch register and the capture register. The logic value stored at the output of the launch register and the capture register in the IWD of the group of selected input-output circuits is initialized by writing a known logic value to the input of these launch flip-flops and a capture flip-flops. Next, the launch register and the capture register in each input-output circuit of the group of two or more input-output circuits is clocked with the actual strobe signals to write those known logic values into the launch register and the capture register of each input-output circuit rather than sending a global reset signal to the registers followed by a global set signal.

Note, the full shift-in of the initialization pattern with known logic values also supplies a data value of a logical 1 to the stage 1 scan registers of the group of input-output circuits under test, e.g., group #1. In step 746.1, an update operation is then performed to shift the test vectors in the scan registers of stage 1 to the update registers in stage 1 to form the group of input-output circuits under test. The t_sel signal in the soft wrapper may select individual input-output circuits to be part of a group of input-output circuits that undergo initialization or delay path calibration value determination on a group basis.

In step 748.1, the mode register in the test processor is loaded by shifting in the proper value to assert the mode1_reg bit. Set the mode register to 1001 0000 00. The mode1_reg bit controls the soft wrapper mode1 signal to the combinational logic coupled to the registers and the input-output circuit driver during test operations. When asserted, the value on the input-output circuit driver output PAD is supplied from the soft wrapper circuit or the IW-D rather than the from the associated core signal. The global input-output circuit output disable signal when low (the mode3_reg bit=0) allows each individual input-output circuit's output driver to be enabled or disabled depending on the value of the test vector supplied to stage 4 of the soft wrapper. Thus, the mode register is set to route signals from the soft wrapper to input-output circuit output and each individual input-output circuit's output driver to be enabled or disabled depending on the value of the test vector applied to stage 4 of the soft wrapper. Next, the strobe register in the hard processor is set with the proper value. The lock flags from strobe generator are monitored to check that strobe generator is ready to fire the "Launch" and "Capture" strobes.

Referring to FIG. 7.2, when ready, in step 750.2, the strobe signals are activated on the strobe buses. This launches two rising edges on the stb0 and stb1 buses that feed the Launch and Capture flip-flops in IW-D block. This causes the initial known logic values from the initialization pattern to be written to the "Launch" and "Capture" registers in IW-D. Next, wait a few clock cycle for the strobe signals to travel through the stb0 and stb1 buses for the group of input-output circuits that were initialized.

Overall, a group of input-output circuits from all of the input-output circuits on the chip has been formed by setting the update register of stage1 to 1 for all of the input-output circuits in that group of input-output circuits, which have also been initialized to place known values into the Launch and Capture registers for later comparison.

Delay Calibration

FIGS. 7.3, 7.4, 7.5 and FIG. 7.6 refer to a method of generating calibration data for a delay test of each input-output circuit on a chip. Overall, a method for implementing embedded timing calibration may be to divide all of the input-output circuits on the chip into to several groups to determine delay calibration data for a group of two or more input-output circuits at the same time, and also perform merely partial shifts of test vectors after testing with one increment of strobe delay sweep value.

The input-output circuits are divided into several groups, and calibrated one group at a time to reduce on-chip memory requirements as well as maintain a shorter duration test time of all of the input-output circuits. The amount of on-chip memory requirement to store calibration data may be reduced by transferring some of the on-chip memory responsibility to some temporary storage in the soft wrapper of the chip. For example, a chip with 1000 input-output circuits that needs to store 4 data bits of strobe sweep delay calibration data for each input-output circuit on each increment of strobe sweep delay needs 4000 memory bits of on-chip memory to store calibration data for all input-output circuits. This amount of memory may have significant area overhead impact on the available area on that chip. Testing in groups of input-output circuits reduces the memory requirement by a factor of the number of groups formed. Thus, if the total number of input-output circuits to be tested is formed into ten groups, then the on-chip memory storage in the test processor becomes a storage requirement of 400 bits rather than 4000 bits. Note, using some temporary storage in the soft wrapper of the chip also reduces the amount of external tester vector memory required.

A partial shift of strobe sweep delay calibration data equal to the number of input-output circuits in the group may be implemented to decrease the overall time to conduct the calibration procedure for all of the input-output circuits on the chip. Thus, if a full shift of test vectors is used for each increment of delay sweep value tested, then the time to conduct the test for every input-output circuit on the chip can be significantly greater than the duration for a partial shift technique. For example in a full shift of known test vectors, assume that 16 different increments of strobe sweep delay values have to be used for the calibration procedure, and the 1000 input-output circuits are divided into 10 groups of 100 input-output circuits each. The time required is (10 groups) times (16 different increments of sweep delay values) times (4000 bits shifted in +20)=643,200 bit shifts, which will take 64.32 ms using a 10 MHz test clock. Note, the partial shift, however, uses special controls and modifications to the soft wrapper block to ensure valid initialization of IW-D and later to avoid over-writing the captured timing test flags. Yet, this method maintains the low memory requirements in the SP (400 bits) while reducing the number of test clock cycles for calibration. For example in a partial shift of test vectors equal to the group size of input-output circuits being tested, the number of test clock cycles from the example above is (10 groups) times (16 different sweep delay values) times (400 bits shifted in +20)=67,200, which will take 6.72 ms with 10 MHz Test clock.

Referring to FIG. 7.3, overall, the delay calibration instruction determines an amount of delay present in a delay testing path excluding the input-output circuit buffers themselves in each input-output circuit in a group of input-output circuits at the same time and stores that amount of delay present into a memory on the chip. The amount of delay present in each delay testing path may be accounted for when delay testing an input-output circuit associated with particular delay testing path.

The delay calibration instruction may follow the delay test initialization sequence, which has formed a particular group of input-output circuits from all of the input-output circuits on the chip and has placed known values into the Launch and Capture flip-flops for later comparison for all of the input-output circuits in that group of input-output circuits. The delay calibration instruction enables control signals to the combinational logic coupled to the registers as well as the launch and capture registers to establish the delay test path from the launch and capture strobe buses through the launch register to the capture register but exclude the input-output circuit buffers themselves. Thus, the measured path bypasses the input-output circuit buffers in the timing measurement path for the selected input-output circuits and measures the actual delay offset for each selected input-output circuit. In step 742.3, the mode register in the test processor is loaded for the delay calibration by shifting in the proper initial value. For example, set the mode register to 1001 0000 00. All update registers are in hold mode to stop any update from happening. Note, the soft wrapper holds the known logic values from the preceding initialization process. The methodology initializes and determines calibration delay values on a group input-output circuit basis but subsequently will test each input-output circuit delay on an individual pass-fail basis.

Next, in step 743.3, the calibration register bank is loaded with an initial known sweep delay value between the launch signal and the capture signal. The initial known sweep delay value is the first increment of a set of known sweep delay value that will be applied to the input-output circuits in the selected group. Thus, the calibration registers may be set to the calibration range for the input-output circuits in the selected group. An initial value in the strobe register in the hard processor is loaded to program a known delay amount between the edge of the STB0 strobe and STB1 strobe. (Mcal+1 delay.)

In step 745.3, the mode register in the test processor is loaded to initialize the values on the outputs of the launch and captures registers in the IW-Ds. Thus, write the initialization values from the update registers in hold mode to the Launch and Capture flip-flops in the IW-D block. The strobe signals are activated. This launches two rising edges on stb0 and stb1 buses that feed Launch and Capture registers in the IW-D block. It may take several cycles before all IW-Ds are initialized; therefore, a sufficient wait time is programmed into the test processor to ensure all IW-Ds receive the strobes and are initialized.

Referring to FIG. 7.4, in step 748.4, the mode register is loaded for performing delay test through the established calibration path. The mode register is set to 1001 1100 00, which activates the t_mode and T_cal_en register bits. The t_cal_en_ reg bit enables the delay test calibration mode to send control signals to the combinational logic coupled to the registers as well as the launch and capture flip flops to establish the delay test path from the launch and capture strobe buses through the launch flip flop to the capture flip flop but exclude the input-output circuit buffers themselves. Next, in step 749.4, the strobes are activated to generate calibration data for the delay path from the Launch to Capture registers in the IW-D block. The activated strobe launch two rising edges on stb0 and stb1 buses that feed Launch and Capture flip-flops in IW-D block.

Referring to FIG. 7.5, in step 752.5, a capture operation is performed on the scan registers in the soft wrapper to sample the t_capture flag for that formed group of input-output circuits. This capture operation will cause the tcapture_flag from the capture register in the IW-D block to be captured in the scan registers in the soft wrapper in the formed group of input-output circuits. No capture event will occur for the non-selected input-output circuits because t_mode signal is active, which sends a control signal to the combinational logic coupled to the scan registers in the non-selected input-output circuits to accept scanned in data values but disable over writing stored data values with capture results in these scan registers. Thus, disabling the capture capabilities of scan registers in the input-output circuits of the formed groups of input-output circuits not currently being tested in response to a global capture operation. In an embodiment, four flag are captured:

F1D1: 1st input-output circuit timing flag for delay setting #1
F2D1: 2nd input-output circuit timing flag for delay setting #1
F3D1: 3rd input-output circuit timing flag for delay setting #1
F4D1: 4th input-output circuit timing flag for delay setting #1

In step 754.5, a partial shift of test vectors equal to a number of input-output circuits in the group is performed, i.e., shift captured results from all the scan registers in the group being tested, from the scan registers in the first group of input-output circuits to the scan registers in the next group of input-output circuits. Simultaneously, shift in an arbitrary test vector stream into the scan registers in the initial group of input-output circuits being tested. Also, increment the group shift counter.

The test processor analyzes any captured flag received. The test processor receives the shifted out bits that were shifted out with the partial shift operation.

The test processor determines whether the received bits correspond to actual test data. Some methods to identify that the shifted out bits are actual test data may be as follows. For example, the recognition of portions of the generated test vector pattern itself by matching selected bits of the incoming shifted bits, such as those bits from the 4th stage, to the generated test pattern. For example, the knowing the number of groups to be tested and thus the number of shifts that will occur before actual test data is being shifted into the test processor for analysis. Overall, the test processor examines the status of a capture flag for each particular input-output circuit in the group of input-output circuits to the sweep pattern of known delay values to equate the delay value of the timing path in that particular input-output circuit exclusive of the delay time through that input-output circuit itself.

The captured flag results may be stored into a memory on the chip. When the captured flag differs from the initialized value, the strobe delay indicates the amount of delay present in each delay-testing path excluding the input-output circuit itself. The amount of delay present in the delay testing path may be accounted for when delay testing each input-output circuit through its delay testing path. A delay sweep memory in the test processor on the chip stores the delay test calibration results from the incremental delay sweeps. The memory is sized to store test results for a group of input-output circuits of at least two but less than all of a number of testable input-output circuit on the chip tested in parallel.

Referring to FIG. 7.6, repeat the sweep determination for the next set of sweep values for that group of input-output circuits until the entire set of sweep values has been generated, the results are captured, and analyzed as outlined below. Thus, performing delay path testing to determine an amount of delay present in each delay testing path excluding the input-output circuit buffers themselves for a first group of two or more input-output circuits but less than all of a number of testable input-output circuit on the chip in parallel and sequentially then testing the first group of input-output circuit. After a group is calibrated, that group should be tested with calibrated thresholds before moving on to the calibration and test of the second group. This is to ensure calibration values are used and the calibration memory can be overwritten for the next group. However, each group of input-output circuits needs to obtain it calibration data from the full set of incremental strobe delays before moving on to test the next group of input-output circuits.

Accordingly, for the current group of input-output circuits under test, in step 756.6, increment the delay value in the strobe register in the hard processor by one step amount to program a next known delay amount between the edge of STB0 and STB1. (N number of delay steps.) The mode register in the test processor is loaded to initialize the values on the outputs of the launch and captures registers in the IW-Ds. De-assert both the t_mode and T_cal_en register bits. This causes the initialization values from the update registers in hold mode to be written to the Launch and Capture flip-flops in the IW-D block when the strobes are activated. Activate the strobe signals. This launches two rising edges on stb0 and stb1 buses that feed Launch and Capture flip-flops in IW-D block. Wait until all IW-Ds receive the strobes and are initialized. In step 758.6, the mode register is loaded for performing delay test through the established calibration path. The mode register is set to 1001 1100 00, which activates the t_mode and T_cal_en register bits. In step 760.6, a capture operation on the scan registers in the soft wrapper of merely the input-output circuits under test is performed to sample the t_capture flag for that formed group of input-output circuits on this next increment of delay sweep data. Note, the control signals from the combinational logic prevent a capture operation from occurring in the scan registers in the soft wrapper of the input-output circuits not current under test. The control signals from the combinational logic allows those scan registers of the groups of input-output circuits not currently under test to be used as temporary storage for delay sweep test results for the group of input-output circuits currently under test.

In step 762.6, a partial shift of the strobe sweep delay calibration data equal to the group size, i.e., shift all the scan registers in the group being tested, is performed from the scan registers in the first group of input-output circuits to the scan registers in the next group. Analyze any captured flag received by the test processor, if any. Detect when a change in the status flag occurs for each input-output circuit in the group by looking at the shifted in captured flag results for each increment of applied sweep delay value. Record the determined sweep delay amount for each input-output circuit. Thus, determine the amount of delay present in each delay-testing path excluding the input-output circuit itself and then store that amount of delay present into the memory on the chip.

In another embodiment, the on-chip memory locations corresponding to each IO are initialized with a number that corresponds to the initial strobe delay used for calibration. Subsequently, the IOs in the group of IOs under test undergo calibration, in which the IO path delays excluding the IO receiver and driver are compared against a strobe delay. The strobe delay is swept from a minimum value to a maximum value sequentially and for each strobe delay selection the number in the memory location is incremented by one if the captured flag matches the IW-D initialized value. This method requires less circuitry in the test processor and also provides a higher degree of immunity to the launch strobe to capture delay noise (jitter).

A threshold value circuit is included in the test processor for computing the calibrated delay test threshold values. This threshold value circuit uses an on-chip lookup table to identify the type for each input-output circuit for supplying threshold values for that type of input-output circuit under test. This block of logic may be unique for a chip and is hard-coded in RTL or may be soft coded in as a memory. To test the selected group of input-output circuits, the upper and/or lower delay test thresholds for each input-output circuit type are provided to the test processor for programming the strobe generator circuit in the hard processor. A register bank can be used to hold threshold data for each input-output circuit type. This register bank is fairly small because the type of input-output circuits used on a chip typically is limited to 20 to 30 rather than storing the threshold for each individual input-output circuit on the chip. The external tester loads this register bank at the beginning of the delay test. The delay sweep memory holds the input-output circuit delay offset determined during this calibration procedure for each input-output circuit in the group of input-output circuits. These offset values are due to the delay measurement wrappers and strobe buses and should be cancelled out when testing for input-output circuit delay to improve accuracy. The test processor uses: these thresholds for each input-output circuit type from the table of input-output circuit types hard-coded in the test processor; the identity of the input-output circuit being tested and the measured calibration estimates for each input-output circuit to generate the calibrated threshold for each input-output circuit. The hard processor then generates the desired strobe delay for a pass/fail delay test on each individual input-output circuit in the formed group of input-output circuits, one at a time, based on the generated calibrated threshold value.

Delay Test

FIGS. 7.7-7.10 illustrate a method to perform a delay testing procedure for a group of input-output circuits, one input-output circuit in the group at a time.

Referring to FIG. 7.7, the delay test instruction enables control signals to the combinational logic coupled to the registers as well as the launch and capture registers to establish the delay test path from the launch and capture strobe buses through the launch register to the capture register inclusive of the input-output circuit buffers. Thus, the measured path includes the input-output circuit buffers in the timing measurement path for the selected input-output circuits. The delay test instruction performs a delay testing procedure for a group of input-output circuits, one input-output circuit in the group at a time. In step 742.7, the mode register in the test processor is loaded for delay calibration by shifting in the proper initial value. For example, set the mode register to 1001 1000 00. The t_mode_reg bit is activated. The t_mode_reg bit enables the delay test mode to send control signals to the combinational logic coupled to the registers to place various scan registers and update registers on an individual basis in hold mode during the delay test mode. The t_mode_reg bit selects the input-output buffers in a delay test timing measurement path for a selected group of two or more input-output circuits undergoing the delay test. The delay test instruction later compares the measured delay value for the path against the computed calibrated threshold values for a pass-fail test. Note, the initial input-output circuit in the group of input-output circuits that was calibrated previously is selected as the initial input-output circuit for the delay test as well.

Referring to FIG. 7.8, the value in the strobe register in the hard processor 753 is set to the calibrated delay test threshold. The threshold delay period associated with a category of input output circuits associated with that first input output circuit is determined by initially matching the input-output circuit under test to a table establishing the acceptable delay values for an input-output circuit type that the input-output circuit under test falls into. Next, the calibrated threshold delay period for the input output circuit under test is generated based upon both the measured accumulated error in the delay path determined during calibration and the threshold delay period associated with that category of input output circuits.

Referring to FIG. 7.7, in step 745.7, the initialization values from the update registers in hold mode are written to the Launch and Capture registers in the IW-D block. The strobe signals are activated to launch two rising edges on the stb0 and stb1 buses that feed Launch and Capture registers in IW-D block. The input-output circuit path under test, the first in this case, will be chosen for the delay test of the selected input-output circuit. Simultaneously, the received strobes at non-selected input-output circuit IW-Ds cause the initial values loaded and held in the stage3 update registers to be written to IW-D registers, i.e., IW-D will be reinitialized. It may take several RefClk cycles before all IW-Ds are initialized; therefore, a sufficient wait time is programmed into the test processor to ensure all IW-Ds receive the strobes and are initialized.

Referring to FIG. 7.9, the generated launch strobe and capture strobe are spaced by the calibrated threshold delay period through the first input output circuit of the group of input output circuit. In step 752.9, a captured flag indicative of the delay from the capture register is stored in the scan register of the soft wrapper. Thus, capture the "t_capture" flag timing test results for the selected input-output circuit in the first group of input-output circuits in the fourth stage scan register of the I/O under test. Note, that no capture will occur for the stage1 scan register (it will hold its content). The tcapture_flag will be captured in stage4 scan register for the selected input-output circuit, but not for non-selected ones.

Referring to FIG. 7.10, in step 753.10, a partial shift operation is performed to shift the stage1 scan register data value by one bit to shift the selection bit to the next input-output circuit. The stage1 scan register data value was selecting that input-output circuit to be the individual input-output circuit in that group of input-output circuits to be delay tested for that cycle. In this mode of operation, the stage1 scan register output is MUXed to the scan_out output for the input-output circuit, which practically bypasses stage2, stage3, and stage4 in the shift path. This has two benefits: stores the tcapture_flag bit in the stage4 scan register for later retrieval; and provides a faster test time by shifting only the input-output circuit select bit (not four shifts to shift all four bits in the soft wrapper). Note that the stage4 scan register is in hold mode when shift is in operation. Also note: '0' is shifted into stage1 scan register just tested during the partial shift. Thus, a partial shift is performed of test vectors directly from a first stage of a first input-output circuit that has just completed its delay test to a first stage of a second input-output circuit in order to select the second input-output circuit as the next input-output circuit to be delay tested.

In step 755.10, an update operation is performed to transfer data of scan register to an update register not in hold, which causes two things. The logical 1 test vector shifted from stage1 scan register of the current input-output circuit to the next input-output circuit causes that next input-output circuit to now be selected for an individual pass/fail delay test. The logical 0 test vector shifted into the stage1 scan register to the update register of the current input-output circuit causes the current input-output circuit to be de-selected for a delay test. Thus, the captured flag delay test results in the stage4 scan register for an un-selected input-output circuit has its capture ability disabled in order for that stage4 scan register to store its captured flag delay test results until all of the input-output circuits in the group have been individually tested.

Referring to FIG. 7.11, in step 757.11, repeat the pass-fail delay strobe test for each input-output circuit in the group of input-output circuits by 1) activating the strobes and waiting until strobe propagates to all input-output circuits, capturing the t_capture flags for the selected input-output circuit under test, then performing a partial shift operation to shift the stage1 scan register data value directly by one bit to shift the selection bit to the next input-output circuit, and then perform an update operation to transfer data of scan register to an update register not in hold.

After the last input-output circuit in the group of input-output circuits is tested deactivate the t_mode signal. Perform a full shift operation to shift all tcapture_flag bits in the stage4 scan registers of all the input-output circuits to the test processor. Analyze stage4 scan register flag bits received in the test processor to evaluate whether an input-output circuit fails or passes the delay test. Thus, comparing the stored flag corresponding to an amount of delay period of time from the launch signal to the capture signal through the first input-output circuit to the generated threshold delay period to evaluate the timing results for the first input-output circuit in the group of input-output circuits.

Next, shift in the initialization pattern to prepare to generate calibration data for the next group of input-output circuits on the chip.

In an embodiment, this embedded delay test instruction may achieve the following feature simultaneously:
1. Reasonable test time (less than 20 ms)
2. Avoid excessive on-chip memory (512 bits maximum)
3. Minimize external tester vector memory requirement (less than 1 kb)

The timing test thresholds results for all input-output circuits are presented to the hard processor.

VI Test

FIGS. 7.12-7.16 illustrate an input voltage test on an input-output circuit where the test results will be locally stored on an individual basis in the update registers until the test is completed and then the test results of all of the input-output circuits under test will be transferred to an associated scan register and fully shifted out for analysis.

The input voltage test instruction uses the combinational logic to set the registers in the soft wrapper and mode signals to allow input voltage measurements through the external tester's PMU. This input voltage test instruction also includes wait cycles to allow time for PMU measurements.

The temporary stored test results will be locally stored on an individual basis in the update registers until the test is completed and then the test results of all of the input-output circuits under test will be transferred to an associated scan register and fully shifted out for analysis. The individual input-output circuits may be connected to the test processor to be tested by doing a partial shift of the data test vectors to advance the test vectors to the next input-output circuit to be tested rather than a full shift of all test vectors each time an input-output circuit is to be tested.

Referring to FIG. 7.12, the AT1 and AT2 input-output circuits that directly connect to the PMUs in each segment should be connected to the analog buses of that segment. Load the mode register in the test processor by shifting in the proper value. For example, set the mode register to 1011 0001 00. The mode1_reg bit sends control signals to the combinational logic coupled to the registers and the input-output circuit driver amplifier during test operations to cause the value on the input-output circuit driver output PAD to be supplied from the soft wrapper. The mode3_reg bit sends control signals to the combinational logic coupled to the registers and the input-output circuit driver amplifier for all of the input-output circuits in a given segment of input-output circuits under test to enable or disable the input-output circuit driver amplifier of each input-output circuit in that group depending on the value of the test vector supplied to stage 4 of the soft wrapper of that input-output circuit. The analog bus enable bit, when active, allows each individual input-output circuit's output driver to couple to the analog test bus depending on the value of the test vector supplied to stage1 or stage2 of the soft wrapper.

Next, a full shift operation writes the known test vector pattern to the scan registers and later an update operation is performed to transfer the test data pattern to the update registers. For example, load the test vector pattern into the scan registers as follows. The test vector pattern to be shifted into the scan registers in the first input-output circuit directly connected to the external tester (AT1) for all of the input-output circuit segments is stage1=1, stage2=0. These test vector values connect the Abus1 analog bus to AT1 and provide external access to the bus. The test vector pattern to be shifted into the scan registers in stage3=0. The test vector pattern to be shifted into is stage4=1 to disable the outputs of AT1. These bits will also be used to program the input-output circuit in high-impedance mode (no pull-down, pull-up, or bus-hold). The test data to be shifted into the scan registers in the second input-output circuit directly connected to the external tester (AT2) for all of the input-output circuit segments is stage1=0, stage2=1. These test vector values connect the abus2 analog bus to AT2 and provide external access to the bus. The test data to be shifted into the scan registers in stage3=0 and stage4=1 to disable the outputs of AT2. These bits will also be used to program the input-output circuit in high-impedance mode (no pull-down, pull-up, or bus-hold).

The test data to be shifted into the scan registers of the other input-output circuits is stage1=0, stage2=0. This is to disconnect the analog buses from all input-output circuits, and stage3=0 and stage4=1 to disable all outputs.

Next, an update operation is performed to transfer data stored in a scan register to an associated update register not in hold in order to connect the AT1 and AT2 input-output circuits to ABUS1 and ABUS2, respectively, in each segment.

Referring to FIG. 7.13, the mode register in the test processor is loaded to the proper value to activate the VI test mode. For example, set the mode register to 1011 0011 00 (vi_mode=1). This enables VI test mode, which causes the following states:

a. stage1 and stage2 scan registers will support only shift and hold states (no capture) for all of the soft wrapper chain segments.

b. stage1, stage2 update registers stay in hold state for the two input-output circuits used to connect to the external tester in a given input-output circuit segment (AT1 and AT2 pins). Thus, the test vectors that cause AT1 and AT2 to connect to the analog buses are temporally stored in the update registers for the duration of this VI test because the stage1 and stage2 update registers stay in hold mode.

c. stage3 scan register supports shift and capture only (no hold sate).

d. stage3 update register is in hold state if stage1 and stage2 are both '0', i.e., the input-output circuit is not selected for VI test.

e. stage3 update register is in update state if stage1 or stage2 is '1', i.e., the input-output circuit is selected for VI test.

f. stage4 scan register is in hold state for all segments of the soft wrapper circuits.

g. stage4 update register is in hold state for all Segments of the soft wrapper circuits.

The activated VI test mode configures the combinational logic to allow selected input-output circuits to capture test results on an individual input-output circuit basis and to temporarily store that captured test result in the register of the soft wrapper until the VI test on all of the input-output circuits is completed.

Perform a full shift operation of the first full test vector pattern for the VI test. The test vector pattern selects the first input-output circuit in the input-output circuit chain regardless of whether it is AT1/AT2 or not to be input voltage tested because the test vectors for stage1 and stage2 scan registers are 1. This test data connects the selected input-output circuit to the analog bus via the switches and thus selects this input-output circuit for a VI test. The test vector pattern unselects the other input-output circuits because the test vectors for stage1 and stage2 scan registers are 0.

Update the scan chain in update register chain to perform the following: if the selected input-output circuit is an AT1 or AT2 I/O, no update will occur because the update registers are in hold, but the input-output circuit will be selected; and if the selected input-output circuit is not an AT1 or AT2 I/O, the update operation closes the analog switches for that input-output circuit. The setting of scan registers in stage1 and stage2 selects the input-output circuit.

The act of selecting an input-output circuit allows stage3 of the soft wrapper for the selected I/O to be used as storage for VI test logic results.

The tester performs a partial shift of test vectors to the soft wrapper by 4 bits. The tester does a partial shift of known test vector values from one input-output circuit soft wrapper to an adjacent input-output circuit soft wrapper rather than doing a full shift of known test vector values to every input-output circuit under test at the same time. The external tester VI tests the initial input-output circuit number (AT1 in the first segment) by the PMU1_1 forcing an input voltage and measures the voltage. The input voltage thresholds may be both applied to the I/O and measured using the on-chip analog buses. The stage3 scan register of the selected input-output circuit samples the input-output circuit's receiver logic. The test processor goes into wait state to ensure PMU has sufficient time for performing voltage force and measurement operation. A capture operation is performed to capture the input voltage test results from the selected input-output circuit's received logic in scan register of stage3. An update operation is performed to transfer the captured test results to the update register of stage3. Note that update register in the stage3 only updates if the input-output circuit is selected, i.e., stage1 and stage2 scan registers outputs for the associated soft wrapper are set to 1. The stage3 update register holds its value for the input-output circuits for which stage1 and stage2 scan registers are 0. The stage3 update register is used as a storage element for saving the capture results while testing VIL for other input-output circuits.

Referring to FIG. 7.14, the external tester VI tests the second input-output circuit number in that segment of I/Os (AT2 in the first segment). The tester does a partial shift of known test vector values from the soft wrapper of the input-output circuit just tested to a soft wrapper of an adjacent input-output circuit that is going to be test rather than doing a full shift of known test vector values to every input-output circuit under test at the same time. Thus, a partial shift operation is performed to shift in enough bits, such as 4 bits, to test the next input-output circuit in the input-output circuit segment but shift in less than the number of bits in a full shift. Shift the scan register by 4 bits and shift in the binary value 1000 to the scan registers in the first input-output circuit. This partial shift moves the test pattern of 1×11 to next input-output circuit in the chain to select that input-output circuit to be tested. An update operation is performed to transfer the test vectors in stage1 and stage2 to the associated update register, if those update registers are not in hold mode. The external tester VI tests the second input-output circuit number (AT2 in the first segment) by the PMU1_1 forcing an input voltage and measures the voltage. The stage3 scan register of the selected input-output circuit samples the input-output circuit's receiver logic. An update operation is performed to transfer the captured test results to the update register of stage3.

Referring to FIG. 7.15, for the remaining input-output circuits in that segment of input-output circuit perform the following. Repeat the partial shifting of the test data to select the next I/O for testing and then the updating operation to shift the 11 test vectors for the input-output circuit under test. The update registers now connect to the analog bus via its analog test switches. The PMU tests the selected input-output circuit through the two input-output circuits directly connected to the PMU. The PMU1_1 connected to AT1 forces a voltage and PMU2_1 connected to AT2 measures the voltage. After the VI test on that input-output circuit, perform an update operation to temporary store the captured test results an individual basis in the third stage update register of that input-output circuit until the entire VI test is completed.

Referring to FIG. 7.16, after all input-output circuits in a segment are tested, then shift enough test vector bits to disconnect the last input-output circuit from the analog buses ABUS1/ABUS2. Perform an update operation to transfer the new bits to the update registers to disconnect the last input-output circuit from the ABUS1/ABUS2. Next, transfer the captured bits that are stored in stage3 update registers to the stage3 scan register of the corresponding soft wrapper chain segment for a subsequent shift to the test processor. Thus, on a global basis activate the transfer_dr signal in the mode register and perform capture operation. This causes the update registers in stage3, which are holding the received logics, to be transferred to stage3 scan register. The temporary stored test results that are locally stored on an individual basis in the update registers until the test is completed are transferred to an associated scan register. Perform a full shift operation of test vectors equal to the number of input-output circuit tested during the entire VI test of all the input-output circuits on the chip. The stored logic values are shifted to the test processor for analysis. The shifted stored logic values indicative of the VI test results on each I/O are compared to expected values to detect an error.

I_Leakage Test

FIG. 7.17 thru 7.19 illustrate a method to measure input output circuit leakage current from each input output circuit in a group of two or more input output circuits through the on-chip analog test bus and to calibrate the measured leakage current of each input output circuit under test for the presence of leakage current from the analog test bus.

This I_leakage test instruction sets the registers in the soft wrapper and mode signals to allow output leakage current through tester PMU. This I_leakage test instruction also includes wait cycles to allow time for PMU measurements.

Referring to FIG. 7.17, the mode register in the test processor is loaded by shifting in the proper value. For example, initially to set up operations, set the mode register to 1001 0000 00. The mode1_reg bit sends control signals to the combinational logic coupled to the registers and the input-output circuit driver amplifier during test operations to cause the value on the input-output circuit driver output PAD to be supplied from the soft wrapper. The tester performs a full shift operation to scan in the initial known test vector pattern into the scan registers of all of the input-output circuits on the chip. For example, the known test vector pattern is loaded into the scan registers as follows. Scan in the test data pattern into the scan registers of the first input-output circuit (AT1) in each of the input-output circuit segments stage1=1, stage2=0. The test vectors connect the analog bus line1 to AT1 and provide external access to the bus line1. Scan in the test data pattern into the scan registers of stage3=0 or 1 (High/Low leakage) and stage4=0 to enable the output of AT1.

The test vector pattern is scanned into the scan registers of the second input-output circuit (AT2) in each of the input-output circuit segments stage1=0, stage2=1. The test vectors connect the analog bus line2 to AT2 and provide external access to the bus line2. Scan in the test data pattern into the scan registers of stage3=0 or 1 (High/Low leakage) and stage4=0 to enable the output of AT2. Scan in the test data pattern into the scan registers of the remaining input-output circuits in each of the input-output circuit segments stage1=0, stage2=0. This is to disconnect the analog buses from all input-output circuits. Scan in the test data pattern into the scan registers of stage4=1 to disable all outputs. A global update operation is performed to transfer the data values in the scan registers into the update registers. Note, all of the update registers are not in hold mode at this time. The input-output circuits are now set up to measure input-output circuit leakage current from the two input-output circuits used to directly connect to the external tester in a given input-output circuit segment (AT1 and AT2 pins).

Next, the output drivers of the AT1 and AT2 input-output circuits are disabled and leakage current for the AT1 and AT2 input-output circuit output pins is measured in each segment. Note, AT1/AT2 do not need to be connected to the on-chip analog buses because they directly connect to the external tester. The mode register is set to 1011 0000 00 to disable all of the input-output circuit's output driver circuits. The mode3_reg bit controls a global output disable signal for the input-output circuits to the combinational logic coupled to the registers and the input-output circuit driver amplifier for all of the input-output circuits in a given segment of input-output circuits under test.

The leakage current is then measured from the two or more input-output circuits in that input-output circuit segment directly connected to a PMU of an external tester, i.e. AT1 and AT2 pins in each segment, by forcing a voltage and disabling the output driver of that input-output circuit. The leakage current of the first input-output circuit AT1 itself is measured with PMU 1 and the leakage current of the second input-output circuit itself is measured with PMU 2 of the external tester. The amount of leakage current present in the two input-output circuit directly connected to the PMU in each segment of input-output circuits (AT1 and AT2) input-output circuits is recorded. Note, two input-outputs is just the example number of input-outputs used in this description and could be different number of I/Os.

Referring to FIG. 7.18, a full shift of all test vector operation is performed in the scan registers of the soft wrapper chains to shift in an initial test vector pattern for a current leakage test of an input-output circuit other than the two input-output circuit directly connected to the PMU in each segment of input-output circuits. The control signals place all input-output circuit outputs in Hi impedance mode (i.e. disabled) while shifting the pattern in. This can be done, for example, by enabling the mode3 reg bit for at least one TCK cycle. This causes all input-output circuits other than AT1/AT2 to be initialized. A global update operation is performed to transfer the data values in the scan registers into the update registers not in hold mode. Note, all of the update registers are not in hold mode at this time.

Next, prepare to test the leakage current of all of the input-output circuits using the analog test buses. The mode register in the test processor is loaded by shifting in the proper value. For example, the mode register is set to set the mode to 1011 0010 10. The analog bus enable bit, when active, allows each individual input-output circuit's output driver to couple to the analog test bus depending on the value of the test vector supplied to stage1 or stage2 of the soft wrapper. The vo_mode_reg bit causes the combinational logic to enable hold states for various update registers. The AT1 and AT2 input-output circuits in each segment are now connected to the analog buses of that segment of input-output circuits.

Next, the following leakage test vector pattern is loaded into the scan registers for each input-output circuit to provide analog access to all other input-output circuits. Scan in the test data pattern into the scan registers of the first input-output circuit (AT1) for each of the input-output circuit segments stage1=1, stage2=0. This is to connect the analog bus line1 to AT1 and provide external access to the bus line1. Scan in the test data pattern into the scan registers of stage4=1 to disable the output of AT1. Scan in the test data pattern into the scan registers of the second input-output circuit (AT2) for each of the input-output circuit segments stage1=0, stage2=1. This is to connect the analog bus line2 to AT2 and provide external access to the bus line2. Scan in the test data pattern into the scan registers of stage4=1 to disable the output of AT2. Scan in the test data pattern into the scan registers of the other input-output circuits in the segment of input-output circuits stage1=0, stage2=0. This is to disconnect the analog buses from all input-output circuits. Scan in the test data pattern into the scan registers of the other input-output circuits in stage4=0 to enable all outputs. An update operation is performed to transfer the initial logic to the input-output circuit output driver PAD.

Accordingly, the leakage current with the PMU connected to AT1 and AT2 I/O thru the analog buses can be measured to determine the leakage current for first and second selected input-output circuit, respectively. Thus, connect the two or more input-output circuits directly connected to a PMU to the analog bus and measure the leakage current. The measured input-output circuit leakage current includes the leakage current from the on-chip analog test bus and record the measured input-output circuit leakage current. The input-output circuit leakage current from each analog test bus may be also potentially determined by subtracting out the earlier recorded leakage current from each input-output circuit in the two or more input-output circuits directly connected to the PMU.

Referring to FIG. 7.19, a partial shift of test vectors operation is performed to shift in enough bits, such as 8 bits, to test the next two input-output circuits in the input-output circuit segment that are not directly connected to the PMU. Simultaneously, shift in the bits that will open the analog switches for the input-output circuits that were tested previously. This causes the next two input-output circuit outputs to connect to the analog bus for leakage current measurement. Also, individually enable the output driver of each input-output circuit being tested based on the test vector applied to the fourth scan register of that input-output circuit. Thus, connect the two new input-output circuits to the analog bus as well as to the PMU via the first or second input-output circuit (AT1 or AT2). Next, measuring leakage current from each new input-output circuit thru the bus and its associated input-output circuit directly connected to the external tester. The input-output circuit leakage current from the new input-output circuits may be determined by subtracting out the recorded input-output circuit leakage current for that analog test bus and the recorded input-output circuit leakage current for its associated input-output circuit directly connected to the external tester.

Repeat the above operations in FIG. 7.19 to test all of the remaining input-output circuits in the input-output circuit segments.

VO Test

FIGS. 7.20-7.22 illustrate an output voltage test on input-output circuits grouped in multiple segments using the on-chip analog buses.

This VO test instruction uses the combinational logic to set the registers in the soft wrapper and mode signals to allow high and low output voltage measurements through the external tester's PMU. This VO test instruction also includes wait cycles to allow time for PMU operations.

Referring to FIG. 7.20, the mode register in the test processor is loaded by shifting in the proper value. For example, the mode register is set to 1001 0010 00. The mode1_reg bit, when active, the value on the input-output circuit driver output PAD is supplied from the soft wrapper. The analog bus enable bit, when active, allows each individual input-output circuit's output driver to couple to the analog test bus depending on the value of the test vector supplied to stage1 or stage2 of the soft wrapper.

The test processor scans in a test data pattern to the scan registers of the first two input-output circuits (AT1/AT2) test in the first segment of input-output circuits. For example, load test data into the scan registers as follows: stage1=0 and stage2=0, this is to disconnect the analog buses from the AT1 and AT2 input-output circuits; stage3=0 for VOLow test or stage3=1 for VOHigh test; stage4=0 to enable the output. The analog buses, Abus1 and Abus2, in the input-output circuit segment will be grounded. An update operation is performed to transfer the test data pattern to the update registers.

The test processor goes into wait state to ensure all the input-output circuits used to directly connect to the external tester in a given input-output circuit segment (i.e. AT1 and AT2 pins) are tested. The wait time depends on multiple factors including the maximum segment bus lengths, PMU measurement speed, and whether the external tester includes PMU per pin or has a multiplexed PMU architecture. The input-output circuits are grouped in multiple segments. Each input-output circuit segment includes a chain of continuous input-output circuits. This architecture results in a separate analog test bus for each segment, i.e., there is no electrical connection between analog buses in different segments. Each bus consists of two bus lines. The wait time is programmed into the test processor as a parameter attached to the VO_test instruction. While the test processor is in wait mode, the PMUs will force current to each AT1/AT2 input-output circuit and measure voltage. Thus, all of the input-output circuits used to directly connect to the external tester in a given input-output circuit segment for each input-output circuit segment on the chip are tested and measured at this time. Thus, an output voltage test is performed on one or more input-output circuits directly connected to an external tester in a group of two or more input-output circuits, in which less than all of the input-output circuits in the group directly connect to the external tester and the output voltage test on the one or more input-output circuits directly connect to an external tester in the group of two or more input-output circuits is performed prior to performing the output voltage test on any input-output circuits in the group not directly connected to the external tester.

Referring to FIG. 7.21, a test vector pattern is supplied during the output voltage test to connect each input-output circuit in the group to the on-chip analog test bus based upon a value of one or more test vectors in the pattern that are applied to that particular input-output circuit. The test vector pattern is shifted in to connect the analog buses to AT1 and AT2 I/Os, and also to force AT1 and AT2 pads to high impedance. An update operation is performed to transfer the test data pattern to the update registers.

The AT1 and AT2 I/Os in each segment should be connected to the analog buses of that segment to enable the test of other input-output circuits in each input-output circuit segment. The following pattern is loaded into the soft wrapper for each input-output circuit to provide analog access to all other input-output circuits. The test data is shifted into the scan registers in first input-output circuit (AT1) of each segment is stage1=1, stage2=0. This is to connect the Abus1 analog bus to the AT1 I/O and provide external access to the bus. The test data for the scan registers in stage3=0 and stage4=1 to disable the outputs of the AT1 I/O. These bits will also be used to program the input-output circuit in high-impedance mode (no pull-down, pull-up, or bus-hold).

The test data shifted into the scan registers in the second input-output circuit (AT2) of each segment is stage1=0, stage2=1. This is to connect the abus2 analog bus to AT2 and provide external access to the bus. The test data for the scan registers in stage3=0 and stage4=1 to disable the outputs of the AT2 I/O. These bits will also be used to program the input-output circuit in high-impedance mode (no pull-down, pull-up, or bus-hold). Output voltage is measured using the on-chip analog buses. The input-output circuit load current corresponding to the low/high output voltage from that input-output circuit is supplied through the analog bus, and the output voltage measured and compared against the low/high voltage test threshold.

The test data shifted into the scan registers in of the other input-output circuits not directly connected to the external tester in the input-output circuit segment may be stage1=0, stage2=0. This is to disconnect the analog buses from all input-output circuits. The test data for the scan registers in stage3=0 for VOL test or stage3=1 for VOH test and stage4=0 to enable all outputs. A global update operation is performed to transfer the data values in the scan registers into the update registers not in hold mode.

Referring to FIG. 7.22, the VO_mode_reg bit is activated by setting the mode register to 1011 0010 10. The control signals from the test processor through the combinational logic cause the stage1 and stage2 update register to stay in hold state for the two input-output circuits used to connect to the external tester in a given input-output circuit segment (AT1 and AT2 pins). The control signals from the test processor through the combinational logic cause stage3 and stage4 update registers to stay in hold state for all input-output circuits in the input-output circuit segment. Thus, stage1 and stage2 in the other input-output circuits will not be in hold mode for non-AT1/AT2 input-output circuits.

A partial shift operation is performed to shift in enough bits to test the initial input-output circuit in the input-output circuit segment that is not directly connected to the PMU but shift in less than the number of bits in a full shift. The test data pattern for the initial input-output circuit in the input-output circuit segment that is not directly connected to the PMU is shifted in. The test data is stage4 is set to 0, stage3 set to X (does not matter), stage1 and stage2 are set to 1. This test data pattern (stage1 and stage2 are set 1) allows individual input-output circuits not directly connected to the PMU to have their output voltage measured by the PMU through the input-output circuits in that segment directly connected to the PMU. This will close the analog switches for the input-output circuit under test when the test pattern is updated from its scan registers to the update registers of that input-output circuit. (The input-output circuits that can be individually tested are the non-AT1/AT2 input-output circuits). Thus, this pattern selects the input-output circuit for VO test.

The external tester does a partial shift of known test vector values from a soft wrapper of one input-output circuit to a soft wrapper an adjacent input-output circuit rather than doing a full shift of known test vector values to every input-output circuit under test at the same time. Thus, individual input-output circuits may be connected to the tester to be tested by doing a partial shift of the data test vectors to advance the test vectors (stage1 and stage2=1) to the next input-output circuit to be tested rather than a full shift of all test vectors each time an input-output circuit is to be tested. The physical arrangement of the input-output circuits arranged in a chain allows the partial shift operation to transfer data along the input-output chain.

The input-output circuit load current corresponding to the low/high output voltage from that input-output circuit is supplied through the analog bus, and the output voltage measured and compared against the low/high voltage test threshold. The output voltage is measured by supplying load current to test the selected input-output circuit through the AT1 I/O of the segment that the selected input-output circuit belongs to and measuring voltage on the AT2 I/O of that segment. Note, the update operation does not affect the values in the stage3 and stage4 update registers under test because they are in hold mode. The update operation also does not affect the AT1 and AT2 update registers because their stages are also in hold mode.

For the remaining input-output circuits in that segment of input-output circuit perform the following. Repeat the partial shifting of the test data and then the updating operation to shift the (stage1 and stage2=1) test vectors for the input-output circuit under test. Repeat the update operation of the (stage1 and stage2=1) test vector data in the scan registers to the update registers to connect to the analog bus via its analog test switches. The PMU then tests the selected input-output circuit through the two input-output circuits directly connected to the PMU.

Figure 8:
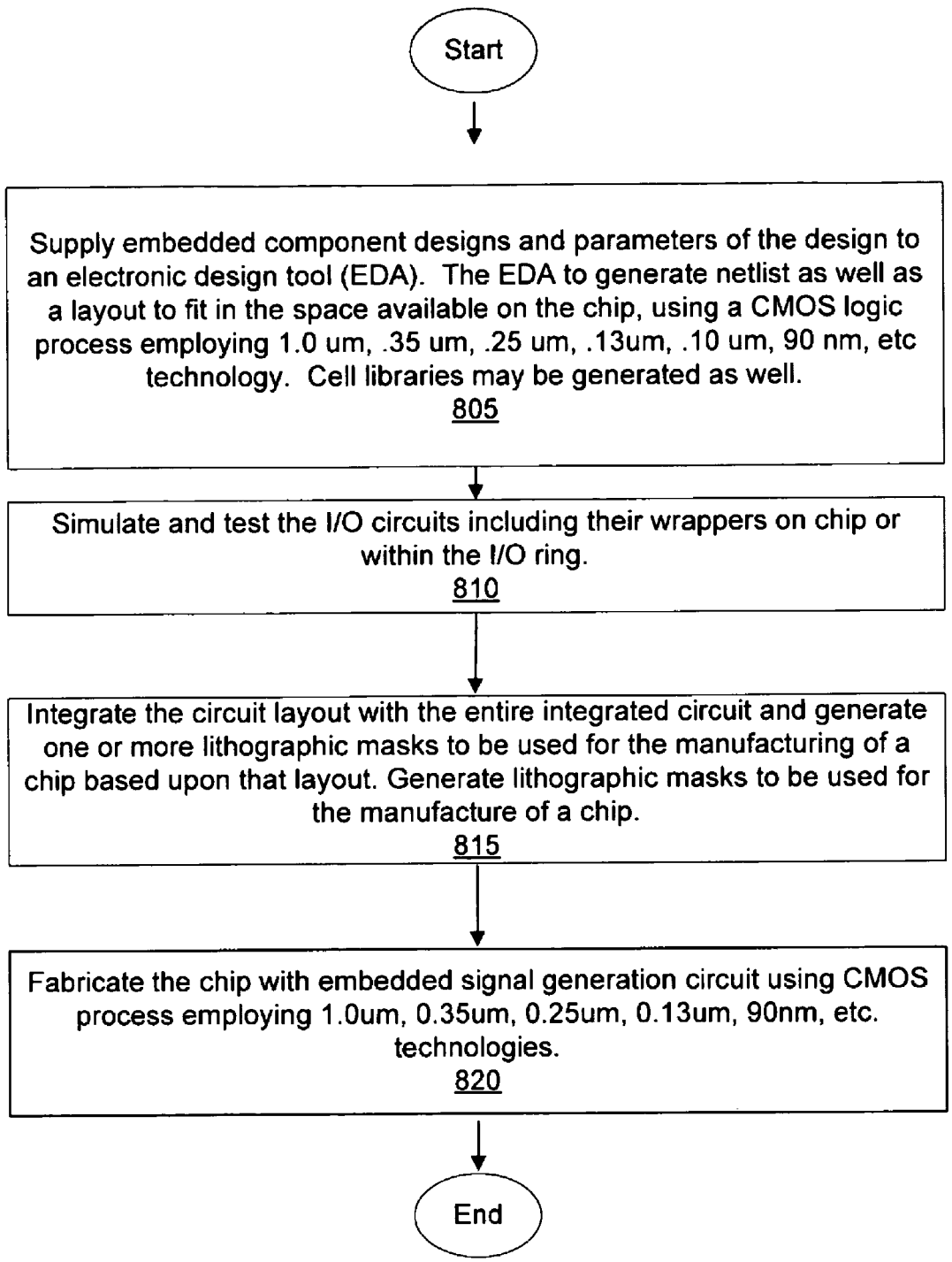
FIG. 8 illustrates a flow diagram of an embodiment of an example of a process for generating a device with a test circuit from designs of the wrapper components.

FIG. 8 illustrates a flow diagram of an embodiment of an example of a process for generating a device with a test circuit from designs of the wrapper components. The example process for generating a device with a test circuit from designs of the wrapper components may utilize an electronic circuit design generator, such as a memory compiler, to form part of an Electronic Design Automation (EDA) toolset. The information representing the apparatuses and/or methods for the I/Os and wrappers may be contained in an Instance such as a cell library, soft instructions in an electronic circuit design generator such as a complier, or similar machine-readable storage medium storing this information. The information representing the apparatuses and/or methods stored on the machine-readable storage medium may be used in the process of creating the apparatuses and/or methods described herein.

Aspects of the above design may be part of a software library containing a set of I/O cells. The I/O Libraries provide a very broad set of basic I/O functions and are designed to accommodate more advanced I/O capabilities. The library cells are developed in accordance with industry standards and support a wide range of I/O frequencies. I/O Library is the basis for interfacing to memory, networking, storage, graphics and mixed signal applications. The I/O cells can be designed for either wire or flip-chip I/O bonding strategies, and the libraries contain all of the cells necessary to create a complete pad ring with a strong power rail structure, robust ESD, and latch-up resistance. The I/O Libraries may be ideally suited for 0.13 µm, 90 nm, and even smaller designs where ESD is an increasingly difficult problem. I/O Library cells are well-suited to many different IC designs because they: can be adapted to accommodate multi-gigabit frequencies; generate more robust and reliable I/O rings; support both bond wire and flip-chip implementations (Flip-chip assembly allows more connections to be present on a smaller die); are capable of supplying high current due to power and ground cell design attributes; support different voltage thresholds; and support different current drive strengths thresholds.

The electronic circuit design generator may be used for making a highly configurable, scalable System On a Chip (SOC) input output system that integrally manages data, control, debug and test flows, as well as other applications. In an embodiment, an example electronic circuit design generator may comprise the following: a graphic user interface; a common set of processing elements; and a library of files containing design elements such as circuits, control logic, and cell arrays that define the electronic circuit design generator. The electronic circuit design generator may be used in designing a System on a Chip (SOC).

Traditionally, there exist two major stages of SOC design: front-end processing and back-end programming. Front-end processing comprises the design and architecture stages, which includes design of the SOC schematic. The front-end processing may include connecting models, configuration of the design, simulating and tuning during the architectural exploration. The design is typically simulated and tested. Front-end processing traditionally includes simulation of the circuits within the SOC and verification that they should work correctly. The integration of the electronic circuit design may include packing the cores, verifying the cores, simulation and debugging. The tested and verified components then may be stored as part of a library.

Back-end programming traditionally includes programming of the physical layout of the SOC such as placing and routing, or floor planning, of the circuit elements on the chip layout, as well as the routing of all interconnects between components. Thus, the floor plan may be generated imported and edited. After this, the design may be outputted into a Netlist of one or more hardware design languages (HDL) such as Verilog, VHDL (Very-High-Speed Integrated Circuit Hardware Description Language) or SPICE (Simulation Program for Integrated Circuit Emphasis). A Netlist describes the connectivity of an electronic design such as the components included in the design, the attributes of each component and the interconnectivity amongst the components. After the Netlist is generated, synthesizing of the design with Register Transfer Level (RTL) may occur. Accordingly, back-end programming further includes the physical verification of the layout to verify that it is physically manufacturable and the resulting SOC will not have any function-preventing physical defects. The front-end views support documentation, simulation, debugging, and testing. The back-end files, such as a layout, physical Library Exchange Format (LEF), etc are for layout and fabrication.

At block 805, the designs for the soft wrapper and other circuits to test the I/Os are supplied to the electronic circuit design generator, as well as other device design parameters such as number of delay elements and MUX sizes. Thus, the designs for cell representations making up the I/O circuits and soft wrappers, etc. stored in a cell library may be supplied to the electronic circuit design generator. As discussed, the electronic circuit design generator may be a software program comprised of multiple algorithms and designs for the purpose of generating a circuit design and a layout in a space available on a target chip. The set of application-specific algorithms and interfaces of the electronic circuit design generator may be used by system integrated circuit (IC) integrators to rapidly create a signal generation circuit suitable for the specific application. In an embodiment, this may involve supplying the circuit netlist and layout fitting in a space on the chip, for example in the space equivalent to two I/Os.

An example electronic circuit design generator may comprise the following: a graphic user interface, a common set of processing elements, and a library of files containing design elements such as circuits, and control logic. The library of files containing design elements may be a stand-alone program by itself as well. In addition, the electronic circuit design generator may include object code in a set of executable software programs. The electronic circuit generator provides timing diagrams, power and area aspects of each component, models coded to represent the components in order to run actual operation and configuration simulations. The electronic circuit design generator may generate a netlist and a layout targeted to fit in the space available on a target chip. Typically, the electronic circuit design generator will store the data representing the core, I/O and test circuit on a machine-readable storage medium. The electronic circuit design generator then may provide the device layout (including the test circuit) to be used to generate one or more lithographic masks utilized in the fabrication of the device including the test circuit. The electronic circuit design generator may also provide a netlist for verification of the device and test circuit.

At block 810, the electronic circuit design generator may provide designs to simulate and test the I/O circuits including their wrappers on chip or within the I/O ring. The machine may generate simulations of representations of the circuits described above that can be functionally tested, timing tested, debugged and validated. Instructions for a tester, the I-O circuits, and a soft wrapper, to run test sequences recited in the various test above may be stored and supplied through a machine readable medium as well.

In block 815, the generated device layout may be integrated with the rest of the layout for the chip. The machine may generate one or more lithographic masks for transferring the circuit design onto the chip during manufacture. The lithographic masks that contain the information necessary for the fabrication of a functional device. In an embodiment, this involves integrating the signal generation circuit on an available space on the chip or within the I/O ring. Overall, the machine may generate representations of the circuits described above for simulations, one or more lithographic masks for transferring the circuit design onto the chip during manufacture, or other similar useful derivations of the circuits described above.

In block 820, a fabrication facility may fabricate one or more chips with the signal generation circuit utilizing the lithographic masks generated from the electronic circuit design generator's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 65 nm or less, to fabricate the chips. The size of the CMOS logic process employed typically defines the smallest minimum lithographic dimension that can be fabricated on the chip using the lithographic masks, which in turn, determines minimum component size. According to one embodiment, light may pass through these lithographic masks onto the chip to transfer the circuit design and layout for the test circuit onto the chip itself. In one embodiment, the electronic circuit design generator is designed for embedded applications in a standard CMOS logic process.

In one embodiment, an electronic circuit design generator may be implemented in software as a set of data and instructions, such as a software cell library callable to other programs or an electronic circuit design generator consisting of an executable program with the software cell library in one program, stored on a machine-readable medium. A machine-readable storage medium may include any mechanism that provides (e.g., stores and/or transmits) information in a form readable by a machine (e.g., a computer). For example, a machine-readable medium may include, but not be limited to: read only memory (ROM); random access memory (RAM); magnetic disk storage media; optical storage media; flash memory devices; DVD's; electrical, optical, acoustical or other forms of propagated signals (e.g., carrier waves, infrared signals, digital signals); EPROMs; EEPROMs; FLASH, magnetic or optical cards; or any other type of media suitable for storing electronic instructions. Instruction on a slower medium could be cached to a faster, more practical, medium.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is generally conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

Thus, it can be seen from the foregoing description that embodiments of the invention may provide an SIS architecture that includes a series of sequentially connected I/Os. Embodiments of the invention may provide off-die access to many I/Os for DC, timing, and logical test and measurements without causing on-die routing congestion or requiring significant area overhead. Furthermore, embodiments of the invention may provide access to the I/Os using merely limited number of device Pads (or pins), thereby enabling more efficient, more complete and more effective tests.

Embodiments of the invention may further reduce area overhead, improve accuracy, and minimize tester intervention significantly while exploiting (where appropriate) previously developed capabilities such as the solutions, defined by IEEE-1149.1 and IEEE-1149.4 standards. More specifically, the soft wrapper chain architecture supersets and it thus compatible with the IEEE-1149.1 boundary scan mechanism. IEEE 1149.1 boundary scan mechanism may be used for exchanging test data with each I/O by reason of its modularity and reduced routing congestion features. Thus, the boundary scan compatible feature may be designed to comply with the IEEE-1149.1 standard for enabling users to perform board level tests using the SIS soft wrapper. The specification and drawings are, accordingly, to be regarded in an illustrative rather than in a restrictive sense.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. The invention is to be understood as not limited by the specific embodiments described herein, but only by scope of the appended claims.

What is claimed is:

1. A method for performing an input-voltage test on one or more input-output circuits, comprising:
    performing the input-voltage test on an input-output circuit that is part of a group of two or more input-output circuits;
    storing test results from the input-voltage test in one or more update registers in a wrapper circuit of the tested input-output circuit;
    responsive to performing the input-voltage test, shifting the stored test results from the one or more update registers into one or more scan registers; and
    performing a full shift operation to analyze the stored test results in an embedded test processor.

2. The method of claim 1, further comprising:
    shifting in a test vector pattern to perform the input-voltage test on a first input-output circuit directly connected to an external tester from the group of two or more input-output circuits.

3. The method of claim 1, further comprising:
    performing a partial shift of data test vectors to advance the data test vectors to test a next input-output circuit in order to connect the next input-output circuit to an external tester.

4. The method of claim 3, wherein an on-chip test processor performs the partial shift.

5. The method of claim 1, wherein the stored test results are locally stored on in a first update register of each input-output circuit in the group of input-output circuits until the input-voltage test is completed, further comprising transferring the stored test results of all of the tested input-output circuits to an associated scan register and fully shifted out for analysis by the embedded test processor responsive to completing input-voltage test for every input-output circuit.

6. A machine-readable medium that stores instructions, which when executed by a machine causes the machine to perform the method of claim 1.

7. A machine-readable medium that stores instructions, which when executed by a machine causes the machine to:
    perform an input-voltage test on an input-output circuit that is part of a group of two or more input-output circuits;
    store test results from the input-voltage test in one or more update registers in a wrapper circuit of the tested input-output circuit;
    responsive to performing the input-voltage test, shift the stored test results from the one or more update registers into one or more scan registers; and
    perform a full shift operation to analyze the stored test results in an embedded test processor.

8. An apparatus, comprising:
    a plurality of input-output circuits on a chip formed into one or more groups of input-output circuits and less than all of the plurality of input-output circuits on the chip coupled to an external tester;
    a wrapper circuit that includes one or more registers and combinational logic, the wrapper circuit associated with a first input-output circuit from a first group of the one or more groups; and
    an on-chip processor to send signals to the combinational logic in the wrapper circuit associated with the first input-output circuit from the group of input-output circuits to control an operational mode of the one or more registers in the wrapper circuit to reuse at least a first register as a test result storage element when another input-output circuit is being tested.

9. The apparatus of claim 8, wherein the combinational logic is coupled to a first update register from the one or more registers to allow the first update register to hold a stored logic value independent of both an input applied to the first update register and receipt of a global update signal applied to the first update register.

10. The apparatus of claim 8, wherein the one or more registers includes one or more scan registers and one or more update registers, the control signal to the combinational logic controls the operation of the scan registers and the update registers to maintain a currently stored data value until a hold mode operation is disabled, scan in and out data values stored in the scan registers, transfer stored data values between a first update register and its associated first scan register, and disable a first scan register's ability to overwrite stored data values in a second scan register during a global capture operation.

11. The apparatus of claim 8, further comprising:
    an on-chip analog test bus to connect, via one or more switches, to a second input-output circuit that does not connect to the external tester, and the second input-output circuit and the on-chip analog bus connect to the external tester via the first input-output circuit that connects to the external tester.

12. The apparatus of claim 8, wherein the on-chip processor coupled to a first update register of the one or more registers and a first switch on an analog test bus, to allow each output driver circuit of each individual input-output circuit to couple to the analog test bus depending on a value of a first test vector supplied to the wrapper circuit.

13. A machine-readable medium that stores instructions, which when executed by a machine, to cause the machine to use the stored instructions to create via an Electronic Design Automation process an apparatus comprising:

a plurality of input-output circuits on a chip formed into one or more groups of input-output circuits and less than all of the plurality of input-output circuits on the chip coupled to an external tester;

a wrapper circuit that includes one or more registers and combinational logic, the wrapper circuit associated with a first input-output circuit from a first group of the one or more groups; and an on-chip processor to send signals to the combinational logic in the wrapper circuit associated with the first input-output circuit from the group of input-output circuits to control an operational mode of the one or more registers in the wrapper circuit to reuse at least a first register as a test result storage element when another input-output circuit is being tested.

14. A method for testing an output voltage of one or more input-output circuits, comprising:

performing an output voltage test on one or more input-output circuits connected to an external tester in a group of two or more input-output circuits, in which less than all of the input-output circuits in the group connect to the external tester;

supplying a test vector pattern during the output voltage test to connect each input-output circuit in the group to an on-chip analog test bus based upon a value of one or more test vectors in the pattern that are applied to that particular input-output circuit; and using the on-chip analog test bus during the output voltage test of any input-output circuit not connected to an external tester.

15. The method of claim 14, further comprising:
performing the output voltage test on the one or more input-output circuits connected to the external tester in the group of two or more input-output circuits prior to performing the output voltage test on any input-output circuits in the group not connected to the external tester.

16. The method of claim 14, further comprising:
performing a partial shift operation to shift test vectors to test a next input-output circuit, a number of test vectors shifted less than a number of input-output circuits on the chip.

17. The method of claim 16, wherein an on-chip test processor performs the partial shift operation.

18. The method of claim 14, further comprising:
performing a shift of known test vector values from a first wrapper circuit of a first input-output circuit in the group to a second wrapper of an adjacent input-output circuit.

19. A machine-readable medium that stores instructions, which when executed by a machine causes the machine to perform the method of claim 14.

20. A machine-readable medium that stores instructions, which when executed by a machine causes the machine to:

perform an output voltage test on one or more input-output circuits connected to an external tester in a group of two or more input-output circuits, in which less than all of the input-output circuits in the group connect to the external tester;

supply a test vector pattern during the output voltage test to connect each input-output circuit in the group to an on-chip analog test bus based upon a value of one or more test vectors in the pattern that are applied to that particular input-output circuit; and use the on-chip analog test bus during the output voltage test of any input-output circuit not connected to an external tester.

* * * * *